United States Patent

Masuda et al.

[11] Patent Number: 5,968,688
[45] Date of Patent: Oct. 19, 1999

[54] COLOR FILTER GRADE PHOTOSENSITIVE RESIN COLORING COMPOSITION AND COLOR FILTER USING THE SAME

[75] Inventors: Kiyoshi Masuda; Minoru Aoki; Osamu Kaieda, all of Ibaraki, Japan

[73] Assignee: Nippon Shokubai Co., Ltd., Japan

[21] Appl. No.: 08/834,441

[22] Filed: Apr. 16, 1997

[30] Foreign Application Priority Data

| Sep. 30, 1996 | [JP] | Japan | 8-258960 |
| Oct. 14, 1996 | [JP] | Japan | 8-271006 |
| Dec. 3, 1996 | [JP] | Japan | 8-323092 |
| Dec. 6, 1996 | [JP] | Japan | 8-327088 |

[51] Int. Cl.$^6$ .......................... G02B 5/20; G02F 1/1335; G03F 7/004
[52] U.S. Cl. ............................................. 430/7; 430/270.1
[58] Field of Search ........................... 430/7, 270.1, 293; 540/137; 552/237, 262

[56] References Cited

U.S. PATENT DOCUMENTS 4,793,692 12/1988 Kamio et al. .
5,359,056 10/1994 Kaieda et al. .......................... 540/137
5,380,842 1/1995 Itoh et al. .

FOREIGN PATENT DOCUMENTS

| 0 183 975 | 6/1986 | European Pat. Off. . |
| 0 373 643 | 6/1990 | European Pat. Off. . |
| 0 661 350 | 7/1995 | European Pat. Off. . |
| 1-233401 | 9/1989 | Japan . |
| 7-118194 | 5/1995 | Japan . |

*Primary Examiner*—John A. McPherson
*Attorney, Agent, or Firm*—Fish & Richardson P.C.

[57] ABSTRACT

A photosensitive resin coloring composition for use in a color filter containing a resin and a dye. The dye is manufactured with one member selected from the class consisting of a combination of (A)+(B) groups, a combination of (A)+(C) groups, a combination of (B)+(C) groups, and a combination of (A)+(B)+(C) groups, wherein (A) represents a group of quinizarine compounds, (B) represents a group of anthraquinone compounds, and (C) represents a group of phthalocyanine compounds.

29 Claims, 6 Drawing Sheets

COLOR FILTER GRADE PHOTOSENSITIVE RESIN COLORING COMPOSITION AND COLOR FILTER USING THE SAME

BACKGROUND OF THE INVENTION

1. Field of the Invention

This invention relates to a color filter grade photosensitive resin coloring composition comprising a resin and a dye and serving as a material for forming a colored layer in a color filter and a color filter using the composition. More particularly, it relates to a color filter grade photosensitive resin coloring composition obtained by using as a dye any member selected from the class consisting of a (C) group alone, a combination of (A)+(B) groups, a combination of (A)+(C) groups, a combination of (B)+(C) groups, and a combination of (A)+(B)+(C) groups, providing (A) is a group of quinizarine compounds having absorption in a visible radiation range of 480–700 nm, (B) is a group of anthraquinone compounds having absorption in a visible radiation range of 400–650 nm, and (C) is a group of phthalocyanine compounds having absorption in a visible radiation range of 600–700 nm and a color filter using the composition.

Further, since the color filter grade photosensitive resin coloring compositions of this invention have absorptions in a visible radiation range of 400–700 nm and excel in solubility in resins and these dye compositions also exhibit excellent lightfastness and thermal resistance, they manifest an excellent effect as display materials possessing absorptions in a visible radiation range in the field of photoelectronics information when they are used in color separation filters for camera tubes, color filters for liquid crystal displays, optical color filters, and color filters for plasma displays, for example. This invention manifests an exceptionally outstanding effect when it is used in color filters for liquid crystal displays of the three primary color type.

This invention also relates to a method for the production of a color filter, resorting to a simple procedure comprising the steps of forming colored layers for the formation of color patterns by the use of the color filter grade photosensitive resin coloring compositions mentioned above and patterning the colored layers by the photolithographic technique thereby forming a plurality of color patterns successively on one surface of a substrate without requiring a treatment for preventing mixture of colors and thereby accomplishing the production by a simplified process.

This invention further relates to a particularly novel anthraquinone compound among other anthraquinone compounds of the category (B) mentioned above, a method for the production thereof, and an electrophotographic color toner composition, a thermosensitive sublimation transferring sheet, an ink jet grade ink composition, and a color filter which severally contain the anthraquinone compound.

The novel anthraquinone compounds of this invention possess absorptions in the yellow-red-blue region of 400–650 nm, excels in solubility in solvents and resins, and also excels in lightfastness and thermal resistance and, therefore, manifests an excellent effect as displaying material or recording materials possessing absorptions in a visible radiation range in the field of photoelectronics information when they are used in sublimation transfer grade dyes, ink jet grade inks, color separation filters for camera tubes, liquid crystal display grade color filters, optical color filters, color toners, bar code grade inks for preventing attempts to raise or counterfeit prints, guest-host type liquid crystal display grade dichromatic dyes, deflecting plate grade dichromatic dyes, optical recording materials adapted for compact discs, and the like. They manifest the excellent effect particularly when they are used as yellow type coloring agents.

Further, the novel anthraquinone compounds of this invention manifests an excellent effect as quality coloring agents excelling in solubility, exhibiting high fastness, and absorbing visible radiations in the yellow-red-blue region when they are used in dyes for fibers, coating materials for automobiles, coating materials for buildings, coloring agents for printing plates, inks for writing utensils, coloring agents for glass flakes, coloring agents for eyeglasses, and the like.

2. Description of the Prior Art

In recent years, the liquid crystal display devices (LCD) have been finding rapidly growing utility in display devices for personal computers, word processors, car navigators, and portable telephones and have been enlarging markets for these products as levered by the advantages of successful adaptation thereof for all-color operations and reduction of prices thereof. The color filters are indispensable to the adaptation of such displays for all-color operations. The adaptation of the LCD's using the color filters for all-color displays is attained by the method for displaying mixed colors by utilizing the integrating effect of human eyes due to addition color mixture (direct vision type color LCS), the method for displaying lights of three primary colors as actually overlapped (projection), etc. As respects the array of picture elements in the color filters, the stripe array which is adopted for OA devices required to display sharply such still images as graphics and characters or the mosaic array or the triangle array which is adopted for time-varying images requiring clear high-resolution displays has been selected.

Generally, these color filters are basically constructed by superposing, on a substrate such as of glass or plastic image pickup element or a thin-film transistor, a black matrix and a color pattern having minute colored picture elements laid out in a pattern with colored layers of red, green, and blue (RGB), superposing a transparent overcoat layer on the colored pattern, and further superposing thereon a transparent conductive film. The methods for the production of color filters provided with a color pattern having RGB colored picture elements laid out in a pattern are broadly classified under dyeing methods using dyes as the components for the colored layers and pigment methods using pigments as the components.

At present, the color filters based on colored layers using pigments are predominant because they excel in thermal resistance, chemical resistance, and lightfastness. As one of the typical methods for the production of color filters based on colored layers using pigments, the photosensitive resin based dye dispersion method which comprises applying to a substrate a photosensitive resin coloring composition having a pigment dispersed therein (pigment resist) thereby forming a colored layer and patterning the colored layer by the photolithographic technique thereby forming the color pattern has been known. The pigment dispersion method is known in two types, i.e. the polymerization type using acrylic resin as the base material for the colored layer and the cross-linking type using a polyvinyl alcohol compound. Specifically, the pigment dispersion method comprises dispersing a pigment in the base material and manufacturing the resultant dispersion into a resist by using such a sensitive material as azide or bisazide in the cross-linking type or by adding a photocurable monomer and such a photopolymerization initiator as benzophenone, Irgacure, or triazine in the polymer type.

FIG. 1 is a schematic diagram illustrating the production process of the photosensitive resin based pigment dispersion method. As illustrated in FIG. 1, a black matrix 3 is first formed on a glass substrate 1 [Step (1) shown in FIG. 1A]. A pigment resist formed by dispersing a pigment (photosensitive resin coloring composition) is then spread on the glass substrate 1 to form a colored layer 5 [Step (2) shown in FIG. 1B]. Subsequently, an oxygen-repelling film 7, for example, is formed on the colored layer 5 in the polymer type [Step (3) shown in FIG. 1C]. As a result, the layers so far produced can be exposed to light in an inert condition at the next step (4). The layers are then exposed to light through the medium of a photomask 9 of a negative pattern [Step (4) shown in FIG. 1D]. The exposed colored layer is developed with an alkali to obtain a color pattern 11 [Step (5) shown in FIG. 1E]. The steps (2)–(5) are repeated three times to form color patterns 11, 13 and 15 having colored picture elements of RGB laid out in a pattern [Step (6) shown in FIG. 1F]. Thereafter, a transparent overcoat layer 17 is formed to protect the color patterns 11, 13 and 15 and smooth the surface (by further formation of a transparent conductive film) and complete a color filter [Step (7) shown in FIG. 1G].

Since the photosensitive resin based pigment dispersion method allows no sufficient dispersion of the pigment in the resin as compared with the method using a dye, the color filter obtained thereby has such problems as offering no sufficient transmittance, manifesting a prominent action of disturbing polarized light, and impairing the contrast of the panel. The polymerization type necessitates superposition of an oxygen-repelling film for the purpose of preventing the degradation of sensitivity due to the influence of oxygen during the course of exposure and, therefore, has the problem of complicating the process.

The etching type pigment dispersion method which has been recently developed is admitted to enjoy a generous improvement in quality in terms of resistance because it uses in the base resin thereof polyimide which possesses high thermal resistance as a resin coloring composition. Since this base resin has no photosensitivity, it necessitates a resist. In addition to the problems mentioned above, this method incurs the problem of increasing the number of steps of process.

The printing method which uses an ink obtained by dispersing a pigment in an epoxy resin, the electrodeposition method which forms a colored layer with an electrodeposition grade electrode by the use of a resin coloring composition having a pigment dispersed in an acrylic resin or an epoxy resin, the transfer method which comprises the steps of forming films of three colors of RGB by the application of a resist resin (photosensitive resin coloring composition) having a pigment dispersed in a resin, pasting the films severally to a glass substrate, and peeling the films thereby completing a color filter, and the method which selectively colors a polysilane film by the sol-gel technique using having a pigment dispersed in silica have been also know. The pigment methods of all the types, however, invariably have the same problems as the photosensitive resin based pigment dispersion method mentioned above. The electrodeposition method, though allowed to use an electrodeposition grade electrode (pattern electrode) as a display grade electrode, requires to form a transparent electrode of low resistance after the formation of a protective film layer and entails the problem of lowering the transmittance because the use of the electrodeposition grade electrode results in degrading the effect of display. The printing method, notwithstanding the printing itself is easy, is further at a disadvantage in being conspicuously inferior to the photolithography method in surface accuracy, dimensional accuracy, and surface smoothness of the produced color pattern.

As a means to produce the color filter with a colored layer using a dye (dyeing method), the relief dye method which comprises a patterning step by the photolithographic technique using a dyeable resin and a dyeing step has been well known. This dyeing method does not use a resin coloring composition but effects dyeing a transparent resin pattern in the course of the process of production.

FIG. 2 is a schematic diagram illustrating a process of production of the dyeing method. First, a black matrix 203 is formed on a glass substrate 201 as shown in FIG. 2 [Step (1) shown in FIG. 2A]. Then, a transparent resist to be dyed (a water-soluble polymeric compound such as dyeable gelatin or casein endowed with photosensitivity by addition of a bichromate) is applied to the glass substrate 201 and the applied layer of the transparent resist 205 is dried [Step (2) shown in FIG. 2B]. The resist is exposed to an ultraviolet light passed through a photomask 207 of a negative pattern 208 [Step (3) shown in FIG. 2C]. The exposed resist is developed with water to obtain a relief pattern 208 [Step (4) shown in FIG. 2D]. Then, the relief pattern 208 is adjusted by heating to a proper hardness and dyed with an acid dye or a reactive dye [Step (5) shown in FIG. 2E]. Further, for the purpose of preventing mixture of colors, the dyed pattern is given a dye-resisting (fixing) treatment as with tannic acid or a treatment for the insertion of an intermediate layer 212 with thermosetting urethane resin or acrylic resin to produce color patterns 211, 213 and 215 [Step (6) shown in FIG. 2F]. The steps (2)–(6) are repeated three times to form color patterns 211, 213 and 215 having colored picture elements of RGB laid out in a pattern [Step (7) shown in FIG. 2G]. Thereafter, a transparent overcoat layer is formed to protect the color patterns 211, 213 and 215 and smooth the surface (by further formation of a transparent conductive film) and complete a color filter [Step (8) shown in FIG. 2H].

As another form of the dyeing method, the dye dispersion method which forms a color pattern by applying a colored polyimide having a dye dispersed in polyimide (resin coloring composition) to a substrate thereby forming a cored layer, superposing a layer of resist on the colored layer, and patterning the layer of resist by the photolithographic technique has been known.

FIG. 3 is a schematic diagram illustrating a process of production of the dye dispersion method. First, a black matrix 303 is formed on a glass substrate 301 as shown in FIG. 3 [Step (1) shown in FIG. 3A]. Then, a colored polyimide having a dye dispersed therein (resin coloring composition) is applied to a glass substrate 301 and the applied layer of polyimide is dried to form a colored layer 305 (colored polyimide layer) [Step (2) shown in FIG. 3B]. A positive resist is superposed on the colored layer 305 [Step (3) shown in FIG. 3C]. Then, the positive resist is exposed to light through a photomask 309 [Step (4) shown in FIG. 3D]. The exposed positive resist 306 is subsequently developed with an aqueous alkali solution [Step (5) shown in FIG. 3E]. The colored layer 305 is etched and the positive resist 306 is peeled [Step (6) shown in FIG. 3E]. Further, for the purpose of preventing mixture of colors, the dyed pattern is given a treatment for the insertion of an intermediate layer 312 with thermosetting urethane resin or acrylic resin to produce a color pattern [Step (7) shown in FIG. 3G]. The steps (2)14 (7) are repeated three times to form color patterns 311, 313 and 315 having colored picture elements of RGB laid out in a pattern [Step (8) shown in FIG. 3H].

Thereafter, a transparent overcoat layer 317 is formed to protect the color patterns 311, 313 ad 315 and smooth the surface (by further formation of a transparent conductive film) and complete a color filter [Step (9) shown in FIG. 3I].

The color filter produced by the dyeing method mentioned above enjoys superiority to the pigment method mentioned above in terms of coloration, suffers inferiority to the pigment method in terms of thermal resistance, durability, and chemical resistance of the dye used in the coloring material, and requires essentially the antifouling treatment for prevention of mixture of colors and the formation of an intermediate layer because the dyes induce color smear (color migration) in the course of spin coating. Further, the dye dispersion method has the patterned polyimide in an at least semi-cured state and, therefore, incurs difficulty in having the dye diffused in the polyimide. Since it uses the polyimide as the base resin, it enjoys a marked improvement in the quality of resistance. Since it is devoid of photosensitivity, it necessitates formation of a resist layer and consequently entails the problem of increasing the number of steps of process. Further, the dyeing method essentially needs to incorporate in the process thereof a step of dyeing which demands a complicated control and, therefore, inevitably adds to the number of steps of process and poses the problem of rendering the process complicated. It is for the purpose of preventing mixture of colors due to infliction of an injury that the dyeing method utilizes the antifouling treatment intended to preclude color mixture and the formation of an intermediate layer. When the pattern of the n+1'th color is formed without coating the pattern of the n'th color (n=1, 2) with an intermediate protective layer, for example, the pattern of the n'th color, after the coating liquid (resin coloring composition) of the n+1'th color has been applied thereto, sustains a crack therein or gathers wrinkles thereon, releases the dye therefrom, or dissolves and flows out itself and, because of the ensuing injuries, induces mixture of colors. The antifouling treatment or the treatment for the formation of an intermediate layer is carried out for the purpose of precluding the mixture of colors due to such injuries as mentioned above.

Particularly, for the solution of the various problems mentioned above, improvements brought about in various physical properties of the photosensitive resin coloring compositions for use in the color filters owing to the development of novel dyes and improvements achieved in manufacturing methods owing to the simplification of process steps have been proposed.

From the viewpoint of improving various physical properties of photosensitive resin coloring compositions for use in color filters owing to the development of novel dyes thereby obtaining dye materials retaining the color inherent in the conventional dye type and manifesting high durability and producing color filters using the dye materials, phthalocyanine compounds containing a substituent have been developed as dye materials possessing high durability and manifesting solubility in a solvent. Examples of using such soluble phthalocyanine compounds in color filters have been proposed in JP-A-01-233,401 and JP-A-05-295,283.

The phthalocyanine compounds containing a substituent at the β position which are disclosed in JP-A-01-233,401 are excellent in durability and nevertheless are dificient in properties of transmittance.

The phthalocyanine compounds containing a substituent having a hetero atom at the α position are proposed in JP-A-05-295,283 as compounds capable of overcoming such drawbacks as mentioned above to a fair extent. Notwithstanding these compounds have been proposed as dyes for use in green color filters, they require to contain therein a yellow-dye in such a large amount as the neighborhood of 50% of the total amount of dyes for the purpose of acquiring properties of transmittance fit for a dye for a green color filter. Thus, they are deficient in properties of transmittance. These phthalocyanine compounds are not necessarily fully satisfactory in all the properties and, therefore, are preferred to possess still better properties.

As examples of using anthraquinone compounds and quinizarine compounds as dyes for color filters, JP-A-62-197459, JP-A-63-135,454, JP-A-63-139,948, JP-A-63-223,064, JP-A-63-221,170, JP-A-63-235,371, JP-A-63-235,371, JP-A-05-25,599, etc. disclose blue dyes for filters, JP-A-62-235,366, JP-63-268,768, etc. disclose green dyes for filters, and JP-05-5,067, etc. disclose red dyes for filters.

The anthraquinone compounds and quinizarine compounds cited above do not fulfill solubility, durability, thermal resistance, and properties of transmittance wholly.

The present inventors have proposed in JP-A-07-267,559, JP-A-08-50,260, and JP-A-08-70,627 dyes manifesting excellent solubility in resins and color filters manufactured therefrom.

The inventions proposed in these patent publications are capable of solving the problems mentioned above. Today, the color filter grade photosensitive resin coloring compositions and the color filters manufactured therefrom are demanded to offer higher qualities. To satisfy these requirements and particularly color tone, it is preferred to create three primary color RGB pigments and dyes which occupy the largest permissible triangle in the triangle of the existent colors on the chromaticity diagram and a color filter manufactured therewith. In this respect, the inventions proposed as described above are not perfectly satisfactory.

From the viewpoint of overcoming the drawbacks mentioned above by improving the process of manufacture of a color filter as by simplifying the steps of production and consequently producing a color filter retaining the color inherent in the conventional dye and manifesting high durability, JP-B-07-82,124, for example, proposes a dye dispersion method which forms a color pattern by applying a polyimide precursor solution containing a dye to a substrate thereby forming a colored layer, superposing a resist on the colored layer, and patterning the superposed resist layer by the photolithographic technique.

The dye dispersion method which is disclosed in the patent publication requires to perform the same steps (1)–(6) as in the dye dispersion method described above with reference to FIG. 3. Then, the color layers, without preparatorily forming thereon an intermediate layer for the prevention of mixture of colors, are hardened at an elevated temperature to obtain a firm color pattern [Step (7)]. The steps (2)–(7) are repeated three times to form a color pattern having colored picture elements of RGB laid out in a pattern [Step (8)]. Thereafter, a transparent overcoat layer is formed to protect the color pattern and smooth the surface (by further formation of a transparent conductive film) and complete a color filter [Step (9)].

The dye dispersion method which is disclosed in the patent publication mentioned above has the advantage of obviating the necessity for forming an intermediate layer intended to preclude mixture of colors. Since it uses the polyimide precursor solution, it necessitates formation of a resist layer on account of the absence of photosensitivity and confronts an unsolved technical problem of inevitable addition to the number of steps of process.

SUMMARY OF THE INVENTION

The first object of this invention is to eliminate such drawbacks as mentioned above and provide a photosensitive resin coloring composition for use in a color filter comprising a resin and a dye excelling in solubility in the resin and a color filter manufactured thereof.

A further aspect of the first object of this invention is to provide a photosensitive resin coloring composition for use in a color filter comprising a resin and a dye having an absorption in a visible radiation range of 400–700 nm, manifesting excellent solubility in the resin, excelling in lightfastness and thermal resistance, lacking turbidity and possessing transparency, and excelling also in color tone and a color filter manufactured thereof.

Another aspect of the first object of this invention is to provide a photosensitive resin coloring composition for use in a color filter obviating the necessity for providing an intermediate protective layer and avoiding induction of color smear (color migration) due to infliction of an injury in the course of spin coating and a color filter manufactured therewith.

Still another aspect of the first object of this invention is to provide a photosensitive resin coloring composition for use in a color filter capable of improving sensitivity during the course of photocuring (patterning) and a color filter manufactured therewith.

Yet another aspect of the first object of this invention is to provide a photosensitive resin coloring composition for use in a color filter, which composition is capable of imparting the excellent color obtainable by the dye method and the excellent thermal resistance, durability, and resistance to chemicals obtainable by the pigment method simultaneously to the ultimately produced color filter, and a color filter manufactured therewith.

The second object of this invention is to provide a method for the production of a color filter by the photolithographic technique, which resorts to a simplified process exalting the sensitivity with which a photosensitive base resin material to be used is photocured (patterned), obviating the necessity for a treatment for precluding mixture of colors, and proving easy.

A further aspect of the second object of this invention is to provide a method for the production of a color filter capable of imparting the excellent color obtainable with a dye and the excellent thermal resistance, lightfastness, durability, and chemical resistance favorably comparable with those of a pigment to the ultimately produced color filter.

The third object of this invention is to provide a novel anthraquinone compound, a method for the production thereof, a use found therefor, i.e. and electrophotographic color toner composition containing the compound, a thermosensitive sublimation transfer recording sheet, and ink jet grade ion composition, and a color filter.

The first object of this invention (1) is accomplished by a photosensitive resin coloring composition for use in a color filter containing a resin and a dye which is a material for the formation of a colored layer of the color filter, characterized in that the dye is manufactured with one member selected from the class consisting of a (C) group alone (which includes only phthalocyanine compounds represented by the formula (1) below and having one to eight unsubstituted or substituted alkoxy group(s) and/or unsubstituted or substituted phenoxy group(s) substituted at the 2, 3, 6, 7, 10, 11, 14 and 15 positions thereof), a combination of (A)+(B) groups, a combination of (A)+(C) groups, a combination of (B)+(C) groups, and a combination of (A)+(B)+(C) groups, wherein (A) represents a group of quinizarine compounds having a quinizarine skeleton in which one to three of the 5, 6, 7, and 8 positions and at least either of the 6 and 7 positions are each occupied by a secondary amino group and the remainders of the 5, 6, 7, and 8 positions are occupied each by at least one group selected from the class consisting of hydrogen atom, halogen atom, an unsubstituted or substituted alkoxy group, an unsubstituted or substituted phenoxy group, an unsubstituted or substituted alkylthio group, and an unsubstituted or substituted phenylthio group, (B) represents a group anthraquinone compounds having an anthraquinone skeleton in which one to three of the 1, 2, 3, and 4 positions are occupied each by at least one group selected from the class consisting of secondary amino group, an unsubstituted or substituted alkoxy group, an unsubstituted or substituted phenoxy group, an unsubstituted or substituted alkylthio group, and an unsubstituted or substituted phenylthio group and the remainders of the 1, 2, 3, and 4 positions are occupied each by a hydrogen atom or a halogen atom, and (C) represents a group of phthalocyanine compounds having a phthalocyanine skeleton represented by the following general formula (1)

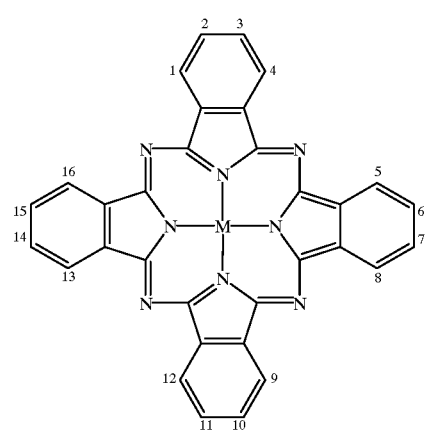

(1)

wherein M represents a divalent metal or a ligand-containing tetravalent metal, in which 1 to 8 of the 16 positions of benzene rings permitting substitution are occupied each by and unsubstituted or substituted alkoxy group and/or an unsubstituted or substituted phenoxy group and the remainders of the positions are occupied each by a halogen atom.

The first object of this invention (2) is accomplished also by a photosensitive resin coloring composition according to Item (1) above, wherein the quinizarine compound (A) mentioned above is a quinizarine compound represented by the following general formula (2)

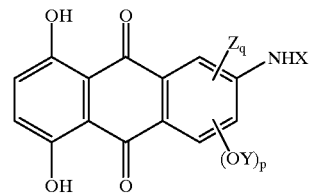

(2)

wherein Z represents a halogen atom or $NHX^2$, X, $X^2$, and Y independently represent an unsubstituted or substituted alkyl group or an unsubstituted or substituted aryl group, p and q each represent an integer of 0–3, providing P+q is not more than 3 and, where p is 2 or over, the plurality of OY's are identical or different and each is a substituent and, where q is 2 or over, the plurality of Z's are identical or different and each is a substituent.

The first object of this invention (3) is accomplished by a photosensitive resin coloring composition according to Item (1) or (2), wherein the anthraquinone compound (B) is an anthraquinone compound represented by the following general formula (3)

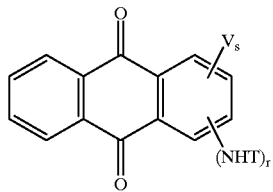

wherein V represents a halogen atom or OU, T and U independently represent an unsubstituted or substituted alkyl group, a cycloalkyl group, or an unsubstituted or substituted aryl group, r and s each represent an integer of 1–3, providing r+s is not more than 4 and, where s is 2 or over, the plurality of V's are identical or different and each is a substituent.

The first object of this invention (4) is accomplished further by a photosensitive resin coloring composition according to any of Items (1) through (3), wherein the phthalocyanine compound (C) is such that in the general formula (1) mentioned above, the unsubstituted or substituted alkoxy group and/or the unsubstituted or substituted phenoxy group has at least three of the 2, 3, 6, 7, 10, 11, 14, and 15 positions occupied each by a substituent.

The first object of this invention (5) is accomplished further by a photosensitive resin coloring composition according to any of Items (1) through (3), wherein the phthalocyanine compound (C) mentioned above is such that in the general formula (1) mentioned above, M represents a tetravalent metal containing a ligand, the number of phenoxy groups substituting in the benzene ring in the phthalocyanine skeleton is 3–5, and the total of atomic radii of the atoms minus hydrogen atoms contained in the substituent at the ortho position of that of the phenoxy groups which possesses a substituent at the ortho position is not less than 3.0 Å and the remainders of the positions are occupied each by a fluorine atom.

The first object of this invention (6) is accomplished further by a photosensitive resin coloring composition according to any of Items (1) through (5), wherein the resin mentioned above is an acrylic resin having a number average molecular weight of 30,000–200,000.

A further aspect of the first object of this invention (7) is accomplished by a color filter, characterized in that a photosensitive resin coloring composition for use in a color filter set forth in any of Items (1) through (6) is used as the material for the formation of the colored layer.

A further aspect of the first object of this invention (8) is accomplished by a color filter according to Item (7) above, characterized in that a photosensitive resin coloring composition for use in a color filter containing a dye composed of a quinizarine compound (A) such that in the general formula (2) described in Item (2) above, p represents a numeral of 1–2, X and Y each represent an aryl group having a substituent at the ortho position, and the remainder position is occupied by a fluorine atom and an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted phenoxy group and the remainders of the V's each represent a fluorine atom is used as the material for the formation of a red colored layer.

A further aspect of the first object of this invention (9) is accomplished by a color filter according to Item (7) above, characterized in that a photosensitive resin coloring composition for use in a color filter containing a dye composed of an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted phenoxy group and the remainders of the V's each represent a fluorine atom and a phthalocyanine compound (C) described in Item (5) above is used as the material for the formation of a green colored layer.

A further aspect of the first object of this invention (10) is accomplished by a color filter according to Item (7) above, characterized in that a photosensitive resin coloring composition for use in a color filter containing a dye composed of a quinizarine compound (A) such that in the general formula (2) described in Item (2) above, at least one of the Z's is $NHX^2$ and X and $X^2$ each represent an aryl group having a substituent at the ortho position and an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted phenoxy group and the remainders of the V's each represent a fluorine atom is used as the material for the formation of a green colored layer.

A further aspect of the first object of this invention (11) is accomplished by a color filter according to Item (7) above, characterized in that a photosensitive resin coloring composition for use in a color filter containing a dye composed of an anthraquinone compound (B) such that in the general formula (3) described in Item (3) above, at least one of the NHT's occupies the 2 or 3 position of the anthraquinone skeleton, T represents an aryl group having a substituent at the ortho position, and V's at the remainders of positions each represent a fluorine atom and a phthalocyanine compound (C) such that in the general formula (1) described in Item (4) above, M represents a divalent metal, the number of phenoxy groups substituting in the benzene ring of the phthalocyanine skeleton is 3–5, and the remainders of the positions are occupied each by a fluorine atom is used as the material for the formation of a blue colored layer.

A further aspect of the first object of this invention (12) is accomplished by a color filter according to Item (7) above, characterized in that a photosensitive resin coloring composition for use in a color filter containing a dye composed of an anthraquinone compound (B) such that in the general formula (3) described in Item (3) above, two of the NHT's are substituents at the 1 and 4 positions of the anthraquinone skeleton, T represents an unsubstituted or substituted aryl group or cycloalkyl group, the remaining 2 and 3 positions are occupied each by V which is a fluorine atom and/or OU and a phthalocyanine compound (C) such that in the general formula (1) described in Item (4) above, M represents a divalent metal and the remainders of the positions are occupied by a fluorine atom is used as the material for the formation of a blue colored layer.

A further aspect of the first object of this invention (13) is accomplished by a color filter according to Item (7) above, characterized in that a photosensitive resin coloring composition for use in a color filter containing a dye composed of a quinizarine compound (A) such that in the general formula (2) described in Item (2) above, at least one of the Z's is $NHX^2$ occupying the 6 or 7 position of the quinizarine skeleton and a phthalocyanine compound (C) such that in the general formula (1) described in Item (4) above, M is a divalent metal is used as the material for the formation of a blue colored layer.

The second object of this invention (14) is accomplished by a method for the production of a color filter by sequentially forming a plurality of color patterns on one surface of a substrate in accordance with a procedure comprising the steps of forming a colored layer for the formation of a color pattern with a photosensitive resin coloring composition and patterning the colored layer by the photolithographic technique, characterized by using a photosensitive resin coloring composition for use in a color filter set forth in any of Items (1) through (6) above, forming a color pattern of a preceding stage and, without forming an intermediate protective film on the color pattern of the preceding state, forming a colored layer for the formation of a color pattern of the subsequent stage.

The third object of this invention (15) is accomplished by an anthraquinone compound represented by the following general formula (4)

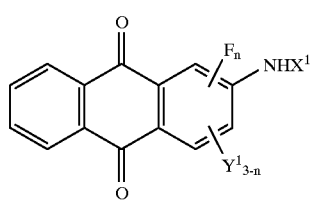

(4)

wherein $X^1$ represents an unsubstituted or substituted aryl group, $Y^1$ represents at least one group selected from the class consisting of unsubstituted or substituted anilino group, unsubstituted or substituted alkylamino group, unsubstituted or substituted alkoxy group, unsubstituted or substituted phenoxy group, unsubstituted or substituted alkylthio group, and unsubstituted or substituted phenylthio group, and n represents an integer of 1–3.

A further aspect of the third object of this invention (16) is accomplished by a method for the production of an anthraquinone compound according to Item (15) described above, wherein a tetrafluoranthraquinone compound represented by the following structural formula (5)

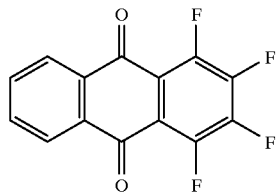

(5)

is caused to react with an unsubstituted or substituted aniline alone or to react sequentially or simultaneously with the aniline mentioned above in combination with at least one member selected from the group consisting of alkylamine, unsubstituted or substituted alkyl alcohol, unsubstituted or substituted phenol, unsubstituted or substituted alkylthiol, and unsubstituted or substituted phenylthiol.

DETAILED DESCRIPTION OF PREFERRED EMBODIMENTS

Figure 1A:
FIG. 1 is a schematic diagram illustrating a process of production of the photosensitive resin type pigment dispersion method which is one of the typical conventional production processes for a color filter.
Figure 1B:
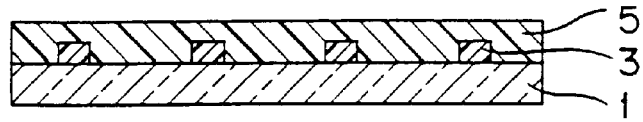
Figure 1C:
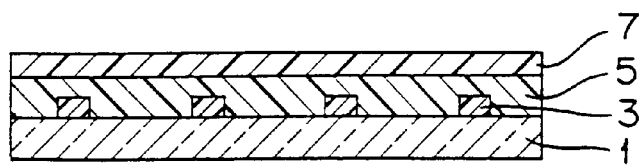
Figure 1D:
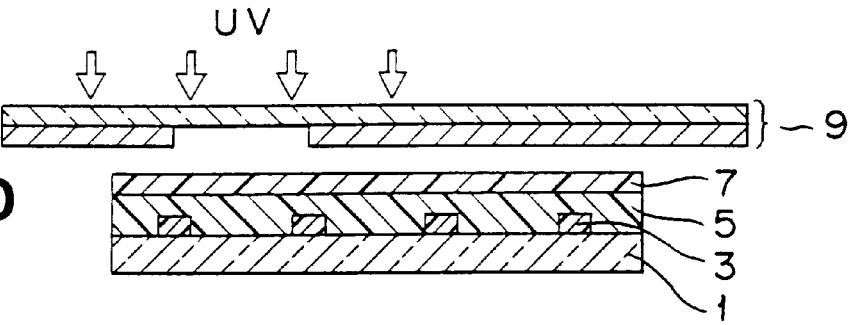
Figure 1E:
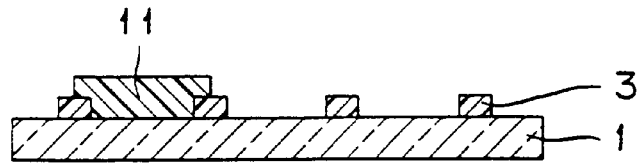
Figure 1F:
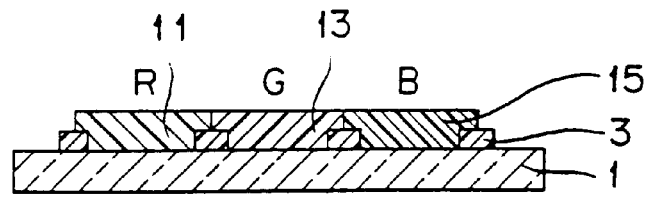
Figure 1G:
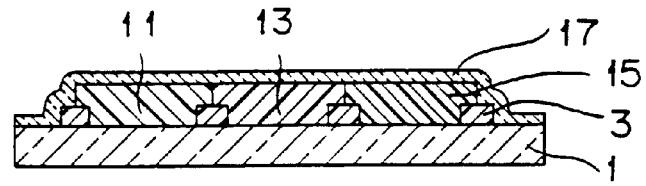
Figure 2A:
FIG. 2 is a schematic diagram illustrating a process of production of the dyeing method which is another one of the typical conventional production processes for a color filter.
Figure 2B:
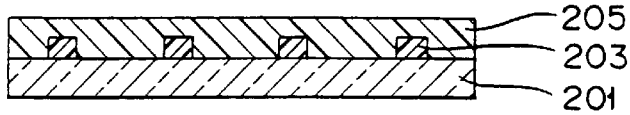
Figure 2C:
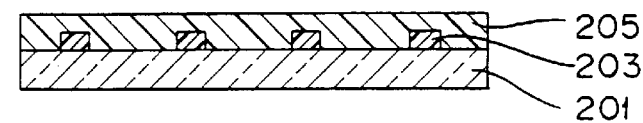
Figure 2D:
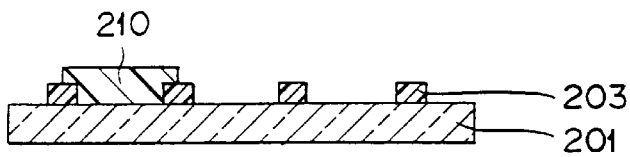
Figure 2E:
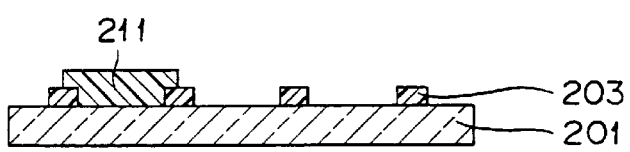
Figure 2F:
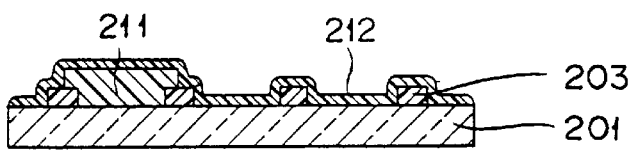
Figure 2G:
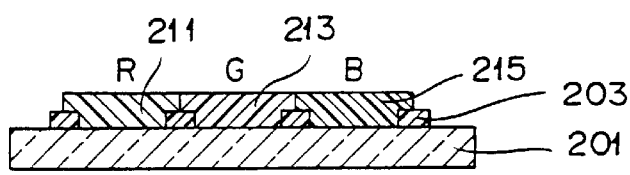
Figure 2H:
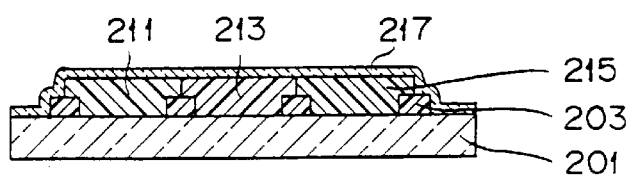
Figure 3A:
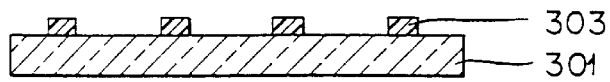
FIG. 3 is a schematic diagram illustrating a process of production of the dye dispersion method which is yet another one of the typical conventional production processes for a color filter.
Figure 3B:
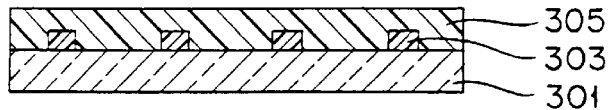
Figure 3C:
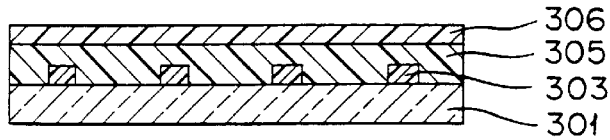
Figure 3D:
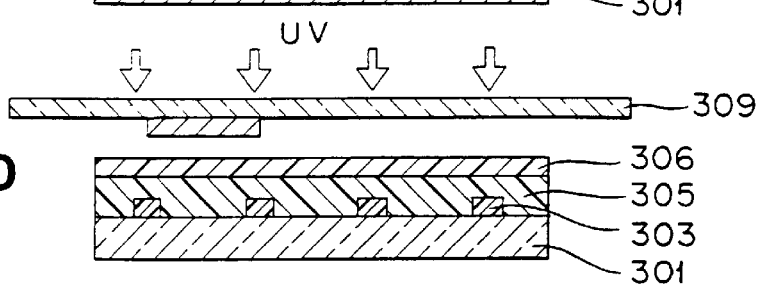
Figure 3E:
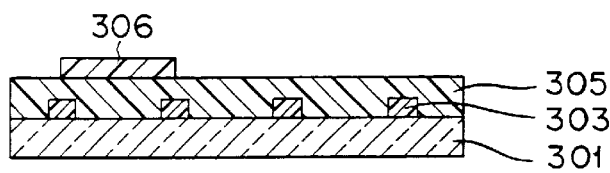
Figure 3F:
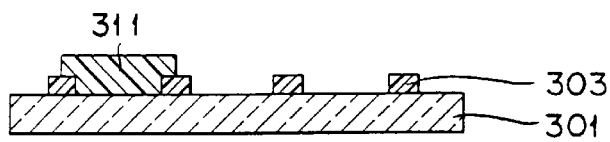
Figure 3G:
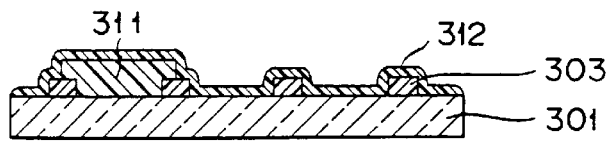
Figure 3H:
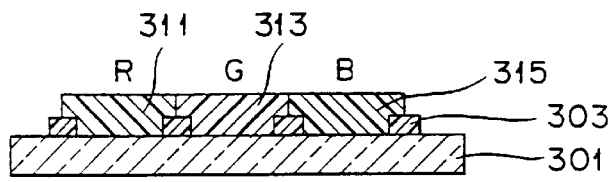
Figure 3I:
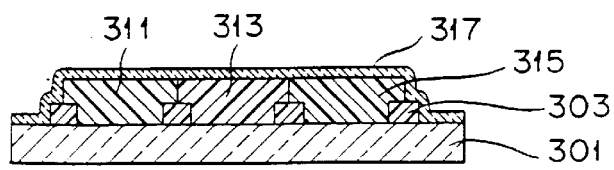
Figure 4A:
FIG. 4 is a schematic diagram illustrating a process of production for a color filter of the present invention.
Figure 4B:
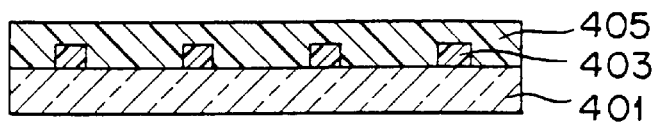
Figure 4C:
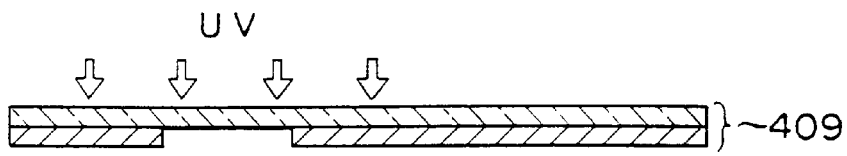
Figure 4D:
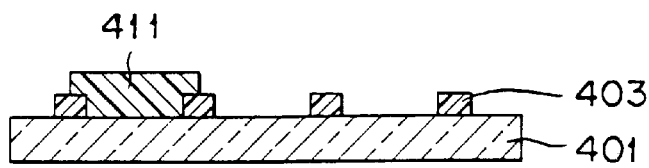
Figure 4E:
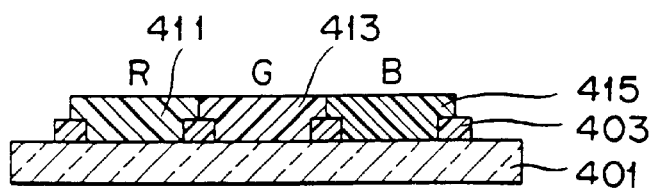
Figure 4F:
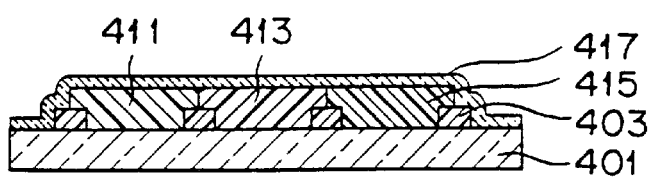

The photosensitive resin coloring composition of this invention for use in a color filter serves as the material for the formation of a colored layer in the color filter and comprises a resin and a dye.

The dyes which can be used for the color filter grade photosensitive resin coloring composition belong to the class of (A)–(C) groups, i.e. (A) group of quinizarine compounds, (B) group of anthraquinone compounds, and (C) group of phthalocyanine compounds, which groups are adopted in five different types, namely, the (C) group alone, the combination of (A)+(B) groups, the combination of (A)+(C) groups, the combination of (B)+(C) groups, and the combination of (A)+(B)+(C) groups. The dyes of these (A)–(C) groups are compound dyes which have absorptions in their severally specific visible radiation ranges. They invariably excel in solubility in resin, exhibit excellent lightfastness and thermal resistance, show prominent transparency and no turbidity, and excel also in terms of color tone. The dye obtained by using these three (A)–(C) groups in any of the five different types, i.e. the (C) group alone, the combination of (A)+(B) groups, the combination of (A)+(C) groups, the combination of (B)+(C) groups, and the combination of (A)+(B)+(C) groups, can create the relevant one of the three primary colors of red, green, and blue (RGB) in extreme purity by independently or mutually absorbing and complementing any surplus of the range of transmitting wavelength. By forming colored layers for the formation of a color pattern with the color filter grade photosensitive resin coloring compositions containing the dyes of the primary colors mentioned above and patterning the colored layers by the photolithographic technique, therefore, it is made possible to form sequentially a plurality of color patterns (of the RGB colors) having laid out in a prescribed pattern the coloring picture elements necessary for realizing a color display on a liquid crystal panel on one surface of a substrate and complete a color filter. This invention permits the color pattern having the coloring picture elements laid out in the prescribed pattern to be formed by the dye method or the pigment method on a substrate having a black matrix superposed thereon, for example, by forming a green colored layer with a color filter grade photosensitive resin coloring composition containing a dye composed of a green dye of the (A) or (C) group and a toning yellow dye of the (B) group and patterning this colored layer by the photolithographic technique thereby completing a color pattern having a green colored picture elements laid out in the pattern, similarly forming a blue colored layer with a color filter grade photosensitive resin coloring composition containing a dye composed of a blue dye of the (A) or (B) group and a blue dye of the (C) group and patterning this colored layer by the photolithographic technique thereby completing a color pattern having a blue colored picture elements laid out in the pattern, and further forming a red colored layer with a color filter grade photosensitive resin coloring composition containing a dye composed of a red dye of the (A) group and a toning yellow dye of the (B) group and patterning this colored layer by the photolithographic technique thereby completing a color pattern having a red colored picture elements laid out in the pattern. Thus, the color pattern having the picture elements of the three primary colors RGB laid out in the pattern can be formed. The color filter according to this invention is completed by further superposing a protective film on the color pattern and optionally forming thereon a transparent conductive film. The color filter of this invention completed as described above can manifest perfectly such outstanding properties of the dyes of the three (A)–(C) groups, as solubility in resin, lightfastness, thermal resistance, transparency, and color tone.

Now, the color filter grade photosensitive resin coloring composition as the means for accomplishing the first object of this invention and the color filter produced by using the composition will be described more specifically below with reference to their respective embodiments.

I. Color Filter Grade Photosensitive Resin Coloring Composition

The color filter grade photosensitive resin coloring composition according to this invention is a material for the formation of a colored layer in a color filter as described above and is composed of a resin and a dye. Now, the dye and the resin into which the composition is broadly divided will be described in detail below with reference to their embodiments.

I-i. Dye

The dye which is contained in the color filter grade photosensitive resin coloring composition is any member selected from the class consisting of (A)–(C) groups, i.e. (A) group of quinizarine compounds, (B) group of anthraquinone compounds, and (C) group of phthalocyanine compounds, which groups are adopted in five different types, namely, the (C) group alone, the combination of (A)+(B) groups, the combination of (A)+(C) groups, the combination of (B)+(C) groups, and the combination of (A)+(B)+(C) groups. It is only required to be capable of either independently or mutually absorbing any surplus portion of the range of wavelength and allow exclusive passage of the wavelength of a sharp and pure primary color. Specifically, the compound dyes of the three (A)–(C) groups are not limited to those which exclusively pass the range of wavelength of particular one of the three primary colors. A red dye, for example, possesses an excellent property of transmittance (strong transmitting ability) in the wavelength range of red color (600–700 nm) and, when allowed to pass part of the range of wavelength of a blue color of 400–500 nm which forms a surplus range of wavelength, can be combined with a toning yellow dye compound capable of absorbing the wavelength in the range of wavelength of a blue color which has a complementary relation therewith to give rise to a sharp and pure red dye composition. It goes without saying that a blue dye composition and a green dye composition can be created in the same manner as described above.

I-i-(1) Compound

Now, the compounds of the (A)+(c) groups will be described below with reference to their working examples.

I-i-(1)-<1>. Quinizarine Compound (A)

The quinizarine compound (A) to be used in this invention excels in solubility is resin, exhibits excellent lightfastness and thermal resistance, shows prominent transparency and no turbidity, and excels also in terms of color tone. This quinizarine compound is such that in the quinizarine skeleton thereof, one to three of the 5, 6, 7, and 8 positions and at least either of the 6 and 7 positions are each occupied by a secondary amino group and the remainders of the 5, 6, 7, and 8 positions are each occupied by at least one member selected from the class consisting of hydrogen atom, halogen atoms, unsubstituted or substituted alkoxy groups, unsubstituted or substituted phenoxy groups, unsubstituted or substituted alkylthio groups, and unsubstituted or substituted phenylthio groups.

At least one of the secondary amino groups mentioned above is preferred to be an unsubstituted or substituted anilino group on account of perfect lightfastness. The substituent in this anilino group is at least one member selected from the class consisting of optionally esterified carboxyl group, nitro group, unsubstituted or substituted cyano group, unsubstituted or substituted alkyl groups, unsubstituted or substituted alkoxy groups, and halogen atoms. For example, this substituent is an anilino group represented by the general formula (6)

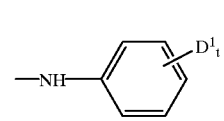

(6)

wherein the plurality of $D^1$'s independently represent at least one member selected from the class consisting of —COOR$^1$, wherein R$^1$ representing a hydrogen atom or an alkyl group of 1–18, preferably 1–12, carbon atoms, a nitro group, a cyano group, an alkyl group of 1–8, preferably 1–6, carbon atoms, an alkoxy group of 1–8, preferably 1–6, carbon atoms, and halogen atoms, and t represents an integer of 0–5, preferably 1–3. In this case, the anilino group is preferred to have substituents one each at the 2 and 6 positions thereof on account of excellence in solubility.

The expression "halogen atom" mentioned as one of the members represented by $D^1$ in the general formula (6) is meant to embrace fluorine atom, chlorine atom, and bromine atom, preferably fluorine atom and chlorine atom.

The secondary amino group other than the anilino group mentioned above is —$NHR^2$, wherein $R^2$ represents an alkyl group of 1–18, preferably 1–12, carbon atoms, for example.

Of the several alkyl groups mentioned above, the alkyl groups having 1–6 carbon atoms mean methyl group, ethyl group, n-propyl group, isopropyl group, n-butyl group, isobutyl group, tertiary butyl group, linear or branched pentyl group, and linear or branched hexyl group. The alkyl groups having 1–8 carbon atoms mean linear or branched heptyl group and linear or branched octyl group besides the alkyl groups mentioned above. The alkyl groups of 1–12 carbon atoms mean linear or branched nonyl group, linear or branched decyl group, linear or branched undecyl group, and linear or branched dodecyl group besides the alkyl groups mentioned above. The alkyl groups of 1–18 carbon atoms mean linear or branched tridecyl group, linear or branched tetradecyl group, linear or branched pentadecyl group, linear or branched hexadecyl group, linear or branched heptadecyl, and linear or branched octadecyl group besides the alkyl groups mentioned above.

Of the alkoxy groups included in the members represented by $D^1$ in the general formula (6) mentioned above, the alkoxy groups of 1–6 carbon atoms mean methoxy group, ethoxy group, n-propyloxy group, isopropyloxy group, n-butyloxy group, isobutyloxy group, tertiary butyloxy group, linear or branched pentyloxy group, and linear or branched hexyloxy group. The alkoxy groups of 1–8 carbon atoms mean heptyloxy group and linear or branched octyloxy group besides the alkoxy groups mentioned above.

The unsubstituted or substituted alkoxy groups allowed to form substituents at the remainders of the 5, 6, 7, and 8 positions in the quinizarine compound (A) are alkoxy groups of 1–12 carbon atoms, alkoxy groups having one to five ether bonds and a total of 2–12 carbon atoms, and alkoxy groups having a alkyl groups containing a heterocycle and a total of 3–12 carbon atoms and mean to embrace linear or branched pentyloxy group, linear or branched hexyloxy group, linear or branched heptyloxy group, linear or branched octyloxy group, linear or branched nonyloxy group, linear or branched decyloxy group, linear or branched undecyloxy group, linear or branched dodecyloxy group, methoxymethoxy group, methoxyethoxy group, ethoxyethoxy group, 3',6'-oxaheptyloxy group, 3',6'-oxaoctyloxy group, 3',6',9'-oxadecyloxy group, 3',6',9'-oxaundecyloxy group, 3',6',9',12'-oxatridecyloxy group, methoxybutoxy group, ethoxybutoxy group, 4',8',12'-oxatridecyloxy group, 4',4',12',16'-oxaheptadecyloxy group, tetrahydrofurfuryloxy group, 4-morpholinoethoxy group, 1-piperazinethoxy group, etc.

The unsubstituted or substituted phenoxy groups allowed to form substituents at the 5, 6, 7, and 8 positions in the quinizarine compound (A) are unsubstituted phenoxy groups and phenoxy groups which have alkyl groups of 1–4 carbon atoms, alkoxy groups of 1–4 atoms, or one or two halogen atoms substituted in the benzene rings thereof and are meant to embrace phenoxy group, o-methylphenoxy group, m-methylphenoxy group, p-ethylphenoxy group, p-propylphenoxy group, p-isopropylphenoxy group, m-butylphenoxy group, p-butylphenoxy group, p-tertiary butylphenoxy group, m-methoxyphenoxy group, p-methoxyphenoxy group, p-ethoxy-phenoxy group, p-isopropyloxyphenoxy group, p-butoxyphenoxy group, 2,6-dimethylphenoxy group, 2,6diethylphenoxy group, 2,6-diisopropylphenoxy group, 2,6-dimethoxyphenoxy group, 2,6-diethoxyphenoxy group, 2,6-diisopropioxphenoxy group, 2,6-dichlorophenoxy group, and 2-chloro-6-methylphenoxy group.

The halogen atoms allowed to form substituents at the remainders of the 5, 6, 7, and 8 positions in the quinizarine compound (A) mean fluorine atom, chlorine atom or bromine atom, preferably fluorine atom. The fluorine atom in the compound imparts an addition to the solubility of the compound in a solvent or a resin.

The unsubstituted or substituted alkylthio groups allowed to from substituents at the remainders of the 5, 6, 7, and 8 positions in the quinizarine compound (A) mean methylthio group, ethylthio group, n-propylthio group, isopropylthio group, n-butylthio group, isobutythio group, tertiary butylthio group, linear or branched pentylthio group, linear or branched hexylthio group, linear or branched heptylthio group, linear or branched octylthio group, etc.

The unsubstituted or substituted pheylthio groups allowed to form substituents at the remainders of the 5, 6, 7, and 8 positions in the quinizarine compound (A) mean unsubstituted phenylthio groups and pheylthio groups having one to four methyl groups, hydroxy groups, methoxy groups, carboxyl groups, cyano groups, or fluoro groups substituted in the benzene rings thereof and mean to embrace thiophenol group, p-toluenethiol group, p-hydroxyphenol group, o-methoxythiophenol group, 4-cyano-2,3,5,6-tetrafluorothiophenol group, etc.

The quinizarine compound (A) of this invention may well be regarded as such that in the quinizarine skeleton thereof, one to three of the 5, 6, 7, and 8 positions and at least either of the 6 and 7 positions are occupied severally by secondary amino substituents of the (a), (b), and (c) types which will be cited specifically herein below and the remainders of the 5, 6, 7, and 8 positions are occupied by an unsubstituted hydrogen atom and/or varying combinations of the substituents of the (d), (e), and (f) types which will be cited specifically herein below.

The substituents of the (a) type include anilino group, o-ethoxycarbonyl, anilino group, m-ethoxycarbonyl anilino group, p-butoxycarbonyl anilino group, p-octyloxycarbonyl anilino group, p-cyanoanilino group, p-nitroanilino group, p-methoxyanilino group, p-fluoroanilino group, 2,3,5,6-tetrafluoroanilino group, 4-cyano-2,3,5,6-tetrafluoroanilino group, 2-methyl-4-cyanoanilino group, 2-methyl-4-carboxyanilino group, 2methyl-4-methoxy-carbonyl anilino group, 2,6-difluoroanilino group, etc.

The substituents of the (b) type include 2,6-dimethylanilino group, 2,6-diethyl anilino group, 2,6,-diisopropyl anilino group, 2,6-dibutyl anilino group, 2,6-ditertiary butyl anilino group, 2,6-dimethoxyanilino group, 2,6-diethoxyanilino group, 2,6-dibutoxyanilino group, 2,6-diethyl-3-chloroanilino group, 2,6-dichloroanilino group, 2,6-dibromoanilino group, 2-methyl-5-cyanoanilino group, 2-methyl-6-nitroanilino group, 2-methyl-6-carboxyanilino group, 2-methyl-6-methoxycarbonyl anilino group, 2-methoxy-6-methyl anilino group, 2-chloro-6-methyl anilino group, 4-cyano-2,6-dimethoxyanilino group, 4-cyano-2,6-diethyl anilino group, 4-cyano-2,6-diisopropyl anilino group, 4-cyano-2,6-dimethylanilino group, 4-cyano-2,6-diisopropoxyanilino group, 4-nitro-2,6-dimethyl-anilino group, 4-nitro-2,6-diethyl anilino group, 4-nitro-2,6-diisopropyl anilino group, 4-nitro-2,6-dimethoxyanilino group, 4-nitro-2,6-diisopropoxyanilino group, 4-ethoxycarbonyl-2,6-dimethylanilino group, 4-ethoxycarbonyl-2,6-diethyl anilino group, 4-ethoxycarbonyl-2,6-diisopropyl anilino group, 4-ethoxycarbonyl-2,6-dimethoxyanilino group, 4-ethoxycarbonyl-2,6-diisopropoxy anilino group, etc.

The substituents of the (c) type include methylamino group, ethylamino group, n-propylamino group, isopropylamino group, n-butylamino group, isobutylamino group, tertiary butylamino group, hexylamino group, octylamino group, nonylamino group, decylamino group, dodecylamino group, cyclohexylamino group, etc.

The substituents of the (d) type include phenoxy group, o-methylphenoxy group, m-methylphenoxy group, p-methylphenoxy group, o-methoxyphenoxy group, m-methoxyphenoxy group, p-methoxy-phenoxy group, methoxy group, ethoxy group, n-propyloxy group, isopropyloxy group, n-butyloxy group, isobutyloxy group, tertiary butyloxy group, pentyloxy group, hexyloxy group, hetyloxy group, octyloxy group, nonyloxy group, decyloxy group, dodecyloxy group, methoxymethoxy group, methoxyethoxy group, ethoxyethoxy group, 3',6',9'-oxadecyloxy group, 3',6',9'-oxaundecyloxy group, etc.

The substituents of the (e) type include methylthio group, ethylthio group, propylthio group, isopropylthio group, butylthio group, isobutylthio group, tertiary butylthio group, hexylthio group, octylthio group, nonylthio group, thiophenol group, p-toluenethiol group, p-hydroxythiophenol group, o-methoxythiophenol group, 4-cyano-2,3,5,6-tetrafluorothiophenol group, etc.

The substituents of the (f) type include fluorine atom, chlorine atom, bromine atom, etc.

The quinizarine compound (A) in this invention can form the dye of green color or blue color in addition to the dye of red color. The present inventors have tried various combinations of the quinizarine compound (A) with the compound dyes of the other (B) and (C) groups with a view of forming dyes in red, green, or blue color as required. As a result, they have found that the combinations capable of imparting necessary properties to the dyes can be attained by introducing the secondary amino substituents of the (a)–(c) types and the substituents of the (d) and (e) types mentioned above, depending on the purposes to be described herein below, in the 5, 6, 7, and /or 8 positions of the quinizarine skeleton and introducing hydrogen atoms or the substituents of the (f) type, preferably fluorine atoms among others, into the remainders of the positions.

Appropriately, the secondary amino substituents of the (a), (b), and (c) types are used mainly for the purpose of shifting the wavelength for absorption toward the longer wavelength side. The substituents of the (b) type are preferably used for this purpose. The width of the shift can be varied by the kinds of substituents or the number of substituents to be used. In other words, the absorption wavelength can be controlled within the range of wavelength of 480–700 nm depending on the kinds of substituents or the number of substituents to be used.

Appropriately, the substituents of the (d) type are used mainly for the purpose of markedly improving the solubility. The use of the substituents permits the quinizarine compound (A) to exhibit high solubility in solvents of the ketone type such as acetone and methylethyl ketone, solvents of the hydrocarbon type such as benzene, toluene, and xylene, and solvents of the halogen type such as chloroform and dichloroethane. The effect in enhancing the solubility grows in the proportion as the number of substituents to be used increases.

Appropriately, the substituents of the (e) type are used for the purpose of permitting minor control of the absorption wavelength and, at the same time, allowing impartation of solubility.

The substituents of the (f) type are capable of promoting the enhancement of solubility in solvents or resins. The use of fluorine atom among others proves particularly effective in this respect.

These substituents, when introduced in a combined state, permit the quinizarine compound (A) to manifest notably exalted solubility in ketone solvents such as acetone and methylethyl ketone, hydrocarbon solvents such as benzene, toluene, and xylene, and halogenated solvents such as chloroform and dichloroethane and, at the same time, allow control of the absorption wavelength in the range of wavelength of 480–700 nm, depending on the kinds of substituents or the number of substituents to be used.

In the quinizarine compound (A) mentioned above, a quinizarine compound represented by the general formula (2)

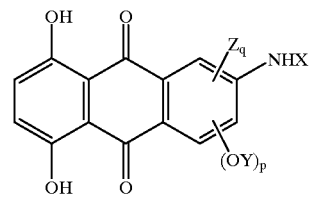

(2)

wherein Z represents halogen atom or $NHX^2$, X, $X^2$, and Y independently represent an unsubstituted or substituted alkyl group, or an unsubstituted or substituted aryl group, and p and q each represent an integer of 0–3, providing p+q is not more than 3 and, when p is 2 or more, the plurality of OY's independently represent identical or different substitutes and when q is 2 or more, the plurality of Z's independently represent identical or different substituents, proves advantageous from the viewpoint of forming a dye. The NHX and $NHX^2$ in the general formula (2) mentioned above are the same as those of the secondary amino group described above and the OY is the same as the unsubstituted or substituted alkoxy group or the unsubstituted or substituted phenoxy group mentioned above.

In order for this quinizarine compound (2) to be used for the photosensitive resin coloring composition for use in a color filter of red color, it is only required to have one of the substituents of the (a)–(c) types, preferably those of the (b) type, introduced to either of the 6 and 7 positions of the quinizarine skeleton and the substituents of the (d)–(f) types introduced to the remainders of the 5–8 positions. Preferably this compound has halogen atoms for Z in the general formula (2) mentioned above.

In order for this quinizarine compound (2) to be used for the photosensitive resin coloring composition for use in a color filter of blue color, it is preferred to have $NHX^2$ for at least one of the Z's in the general formula (2) mentioned above and have this $NHX^2$ introduced into the 6 or 7 position of the quinizarine skeleton.

Particularly when the quinizarine compound (2) is intended as a dye usable for the photosensitive resin coloring composition for a color filter of green color, the compound is preferred to have the substituents of the (a), (b), or (c) type introduced into two or three of the 5, 6, 7, and 8 positions of the quinizarine skeleton and into at least either of the 6 and 7 positions and, when necessary, have one or two of the substituents of the (d) or (e) type introduced into the remainders of the positions. Preferably the quinizarine compound has $NHX^2$ for at least one of the Z's in the formula (2).

The present invention requires to have at least one of the secondary amino substituents of the (a)–(c) types introduced into the 6 or 7 position of the quinizarine skeleton. The present inventors have found that the quinizarine compound acquires better lightfastness when it has the substituents introduced into the 6 and 7 positions of quinizarine skeleton than when it has the substituents introduced into the 5 and 8 positions. As respects the introduction of the substituents of the (a)–(c) types, therefore, this invention prefers to have the substituents introduced faster into the 6 and 7 positions than into the 5 and 8 positions of the quinizarine skeleton. Further as respects the introduction of the substituents of the (d) and (e) types, the introduction into the 6 and 7 positions proves more advantageous in terms of lightfastness than into the 5 and 8 positions when the 6 and 7 positions of the skeleton are the remainders.

Typical examples of the quinizarine compound (A) of the present invention described above are as follows.

(I) Quinizarine compounds having a secondary amino group at the 6 position

A. Examples having one secondary amino group (anilino group) and fluorine atoms at the remainders of positions
  (1) 6-Anilino-5,6,7,-trifluoroquinizarine
  (2) 6-(o-Ethoxycarbonylanilino)-5,6,8,-trifluoroquinizarine,
  (3) 6-(p-Cyanoanilino)-5,6,8,-trifluoroquinizarine,
  (4) 6-(2-Methyl-6-carboxyanilino)-5,7,6,-trifluoroquinizarine,
  (5) 6-(2,6-Dichloroanilino)-5,6,8,-trifluoroquinizarine,
  (6) 6-(2-Chloro-6-methylanilino)-5,7,8,-trifluoroquinizarine
  (7) 6-(2,6-Diisopropylanilino)-5,7,8,-trifluoroquinizarine.

B. Examples having one secondary amino group (anilino group) and alkoxy groups and fluorine atoms at the remainders of positions
  (8) 6-anilino-7-butoxy-5,8-difluoroquinizarine,
  (9) 6-(o-Ethoxycarbonylanilino)-7-butoxy-5,8-difluoroquinizarine,
  (10) 6-(p-Cyanoanilino)-7-butoxy-5,8-difluoroquinizarine,
  (11) 6-(p-Nitroanilino)-7-octyloxy-5,8-difluoroquinizarine,
  (12) 6-(2,6-Diethylanilino)-7-butoxy-5,8-difluoroquinizarine,
  (14) 6-(2,3,5,6-Tetrafluoroanilino)-7-butoxy-5,8-difluoro-quinizarine,
  (15) 6-(p-Butoxycarbonylanilino)-(5 or 6), 7-dioctyloxy-(8 or 5)-fluoroquinizarine,
  (16) 6-(p-Cyanoanilino)-(5 or 8),7-dibutoxy-(8 or 5)-fluoroquinizarine.

C. Examples having one secondary amino group (anilino group) and hydrogen atoms at the remainders of positions
  (17) 6-Anilinoquinizarine,
  (18) 6-(p-cyanoanilino) quinizarine,
  (19) 6-(2,6-Diisopropylanilino) quinizarine,
  (20) 6-(2,6-Dichloroanilino) quinizarine.

D. Examples having one secondary amino group (anilino group) and phenoxy groups and fluorine atoms at the remainders of positions
  (21) 6-(p-Cyanoanilino)-7-(2,6-dichlorophenoxy)5,5,8-difluoroquinizarine,
  (22) 6-(m-Ethoxycarbonylanilino)-7-phenoxy-5,8-difluoroquinizarine,
  (23) 6-(2,6-Dichloroanilino)-7-(2,6-dichlorophenoxy)-6,8-difluoroquinizarine,
  (24) 6-(2,6-Dichloroanilino)-7-(4-ethlycarbonyl-2,6-dichlorophenoxy)-5,8-difluoroquinizarine,
  (25) 6-(3-Chloro-4-cyanoanilino)-7-(2,8-dichlorophenoxy)-5,8-difluoroquinizarine,
  (26) 6-(p-Cyanoanilino)-7-(5 or 8)-bis(2,6-dichlorophenoxy)-(8 or 5)-fluoroquinizarine,
  (27) 6-(2,6-Dichloroanilino)-7,(5 or 8)-bis(2,6-dichloro-phenoxy)-(8 or 5)-fluoroquinizarine,
  (28) 6-(3-Chloro-4-cyanoanilino)-7-(2,6-dichlorophenoxy)-(5 or 8)-phenoxy-(8 or 5)-fluoroquinizarine.

E. Examples having one secondary amino group (anilino group) and phenoxy groups or alkoxy groups exclusively at the remainders of positions
  (29) 6-(p-Cyanoanilino)-5,7,8,-tris(2,6-dichlorophenoxy)-quinizarine,
  (30) 6-(3-Chloro-4-cyanoanilino)-5,7,8,-tris(phenoxy)-quinizarine,
  (31) 6-(m-Ethoxycarbonylanilino)-5,7,8,-tributoxyquinizarine.

F. Example having one secondary amino group (anilino group) and phenylthio groups and fluorine atoms at the remainders of positions
  (32) 6-Anilino-7-phenylthio-5,8-difluoroquinizarine.

G. Examples having one secondary amino group (alkylamino group) and fluorine atoms at the remainders of positions
  (33) 6-Butylamino-5,7,8,-trifluoroquinizarine,
  (34) 6-cyclohexylamino-5,7,8-trifluoroquinizarine.

H. Examples having two secondary amino groups (anilino groups) and fluorine atoms at the remainders of positions
  (35) 6,7-Bis(p-butoxycarbonylanilino)5,8-difluoroquinizarine,
  (36) 6,7-Bis(p-cyanoanilino)-5,8-difluoroquinizarine,
  (37) 6,7-Bis(2,6-diisopropylanilino)-5,8-difluoroquinizarine,
  (39) 6,7-Bis(2-ethoxycarbonyl-6-methylanilino)-5,8-difluoroquinizarine, I. Examples having two secondary amino groups (anilino groups) and alkoxy groups and fluorine atoms at the remainders of positions
  (40) 6,7-Bis(2,6-diisopropylanilino)-5-butoxy-8-fluoroquinizarine
  (41) 6,7-Bis(2-ethoxycarbonyl-6-methylanilino)-5-butoxy-8-fluoroquinazarine,
  (42) 6,7-Bis(2,6-difluoroanilino)-5-octyloxy-8-fluoroquinizarine,
  (43) 6,7-Bis(2,6-dichloroanilino)-5-butoxy-8-fluoroquinizarine.

J. Example having two secondary amino groups (anilino group and alkylamino group) and alkoxy groups and fluorine atoms at the remainders of positions
  (44) 6-(p-cyanoanilino)-7-butylamino-8)- or 5)-octyloxy-5(or 8-fluoroquinizarine.

K. Example having two secondary amino groups (anilino group and alkylamino group) and alkoxy groups at the remainders of positions
  (45) 6-(p-Cyanoanilino)-7-butylamino-5,8-dibutoxyquinizarine.

L. Example having two secondary amino groups (anilino group and alkylamino group) and fluorine atoms at the remainders of positions
  (46) 6-(p-Methoxyanilino)-7-butylamino-5,8-difluoroquinizarine.

M. Example having two secondary amino groups (anilino groups) and alkylthio groups or phenylthio groups and fluorine atoms at the remainders of positions

(47) 6,7-Bis(2,6-dichloroanilino)-5-octylthio-2-fluoroquinizarine.

N. Example having two secondary amino groups (anilino groups) and alkylthio groups or phenylthio groups at the remainders of positions
(48) 6,7-Bis(2,6-diethylanilino)-5,8-dibutylthioquinizarine.

O. Example having two secondary amino groups (anilino group and alkylamino group) and alkylthio groups or phenylthio groups and fluorine atoms at the remainders of positions
(49) 6-Diisopropylanilino)-7-butylamino-5-octylthio-8-fluoroquinizarine.

P. Example having three secondary amino groups (anilino groups) and fluorine atoms at the remainders of positions
(50) 5,6,7-Tris(2,6-diisopropylanilino)-8-fluoroquinizarine.

Q. Example having three secondary amino groups (anilino group and alkylamino group) and fluorine atoms at the remainders of positions
(51) 5,6-Bis(2,6-diisopropylanilino)-7-butylamino-8-fluoro-quinizarine.

R. Example having one secondary amino group (anilino group) and chlorine atoms at the remainders of positions
(52) 6-(2,6-Diisopropylanilino)-5,7,8-trichloroquinizarine.

S. Examples having one secondary amino group (anilino group) and alkoxy groups or phenoxy groups and chlorine atoms at the remainders of positions
(53) 6-(p-Cyanoanilino)-7-octyloxy-5,8-dichloroquinizarine,
(54) 6-(2,6-Dichloroanilino)-7,(5 or 8)-bis(2,6-dichloro-phenoxy)-(8 or 5)-chloroquinizarine.

T. Example having two secondary amino groups (anilino groups) and alkoxy groups and chlorine atoms at the remainders of positions
(55) 6,7-Bis(2,6-diisopropylanilino)-6-butoxy-8-chloroquinizarine.

U. Example having two secondary amino groups (anilino group and alkylamino group) and alkoxy groups and chlorine atoms at the remainders of positions
(56) 6-(p-Ethoxycarbonylanilino)-7-butylamino-8 (or 5)-octyloxy-5 (or 8)-chloroquinizarine.

V. Example having two secondary amino groups (anilino group and alkylamino group) and alkoxy groups and hydrogen atoms at the remainders of positions
(57) 6-(p-Ethoxycarbonylanilino)-7-butylamino-8 (or 5)-octyloxyquinizarine.

W. Example having two secondary amino groups (anilino groups) and alkoxy groups and hydrogen atoms at the remainders of positions
(58) 6,7-Bis(2,6-diisopropylanilino)-5-butoxyquinizarine.

When the quinizarine compounds cited above are to be mentioned herein below, they will be indicated with the relevant prefixed numerals inserted in the parentheses following the names of quinizarine compounds. For example, "quinizarine compound (58)" refers to "6,7-Bis(2,6-diisopropylanilino)-5-octyloxy-quinizarine" bearing the reference number (58) shown above.

I-i-(1(-<2>. Anthraquinone compound (B)

The anthraquinone compound (B) to be used in this invention excels in solubility in resin, exhibits excellent lightfastness and thermal resistance, shows prominent transparency and no turbidity, and excels also in terms of color tone. This anthraquinone compound is such that in the anthraquinone skeleton thereof, one to three of the 1, 2, 3, and 4 positions are each occupied by at least one member selected from the class consisting of secondary amino groups, unsubstituted or substituted alkoxy groups, unsubstituted or substituted phenoxy groups, unsubstituted or substituted alkylthio groups, and unsubstituted or substituted phenylthio groups and the remainders of the 1, 2, 3, and 4 positions are each occupied by a hydrogen atom or a halogen atom.

At least one of the secondary amino groups is preferred to be an unsubstituted or substituted anilino group on account of fine lightfastness. Of the substituents usable for the anilino group, those which possess the quality of a donor include hydroxy group, unsubstituted or substituted alkyl groups, unsubstituted or substituted phenyl groups, unsubstituted or substituted alkoxy groups, unsubstituted or substituted phenoxy groups, unsubstituted or substituted alkylamino groups, unsubstituted or substituted arylamino groups, unsubstituted or substituted arylthio groups, and unsubstituted or substituted phenylthio groups, for example. Among other substituents cited above, unsubstituted or substituted alkyl groups and unsubstituted or substituted alkoxy groups prove particularly favorable. Of the substituents usable for the anilino group, those which possess the quality of an acceptor include cyano group, nitro group, carboxy group, alkoxycarbonyl group, aryloxy carbonyl group, and halogen atoms, for example. Among other substituents cited above, cyano group, nitro group, and halogen atoms prove particularly favorable.

The anthraquinone compound (B) of this invention is such that in the anthraquinone skeleton thereof, one to three of the 1, 2, 3, and 4 positions are each occupied by at least one member selected from the class consisting of the amine substituents of the (a), (b), and (c) types and the substituents of the (d)–(g) groups and the remainders of the 1, 2, 3, and 4 positions are each occupied by an unsubstituted hydrogen atom and/or a varying combination of the substituents of the (h) type which will be cited specifically herein below.

The substituents of the (a) type include o-ethoxycarbonyl anilino group, m-ethoxycarbonyl anilino group, p-octyloxycarbonyl anilino group, p-cyanoanilino group p-nitroanilino group, p-chloroanilino group, o-fluoroanilino group, p-fluoroanilino group, 3-chloro-4-cyanoanilino group, 2,6-dichloroanilino group, 4-cyano-2,6-dichloroanilino group, 4-nitro-2,6-dichloroanilino group, 2,6-difluoroanilino group, 2-chloro-6-methyl anilino group, 2-fluoro-6-methyl anilino group, 2,4,6-trichloroanilino group, 2,3,5,6-tetrachloroanilino group, 2,3,5,6-tetrafluoroanilino group, and 4-cyano-2,3,5,6-tetrafluoroanilino group, for example.

The substituents of the (b) type include anilino group, p-hydroxyanilino group, o-methoxyanilino group, p-methoxyanilino group, m-ethoxyanilino group, p-methylanilino group, p-ethyl-anilino group, p-butyl anilino group, p-tertiary butyl anilino group, 2,4-dimethoxyanilino group, 2,4-dibutoxyanilino group, 2,6-dimethyl anilino group, 2,4-diethyl anilino group, 2,6-diisopropyl anilino group, 2-methoxy-6-methyl anilino group, and 2-methoxy-6-ethyl anilino group, for example.

The substituents of the (c) type include methyl amino group, ethyl amino group, n-propyl amino group, isopropyl amino group, n-butyl amino group, isobutyl amino group, tertiary butyl amino group, linear or branched pentyl amino group, linear or branched hexyl amino group, linear or branched heptyl amino group, linear or branched octyl amino group, hydroxyethyl amino group, hydroxyethyl amino group, and cyclohexyl amino group, for example.

The substituents of the (b) type include methoxy group, ethoxy group, n-propyl oxy group, isopropyl oxy group, n-butyl oxy group, isobutyl oxy group, tertiary butyl oxy group, linear or branched pentyl oxy group, linear or branched hexyl oxy group, linear or branched heptyl oxy group, linear or branched octyl oxy group, methoxymethoxy group, methoxyethoxy group, and ethoxy-ethoxy group, for example.

The substituents of the (e) type are unsubstituted alkyl groups and alkyl groups having one to four carbon atoms in the benzene ring thereof, alkoxy groups of 1 to 4 carbon atoms, and phenoxy groups having one or two halogen atoms as substituted. Specifically, they include phenoxy group, o-methyl phenoxy group, m-methyl phenoxy group, p-ethyl phenoxy group, p-propyl phenoxy group, p-isopropyl phenoxy group, p-tertiary butene phenoxy group, p-methoxy phenoxy group, p-ethoxy phenoxy group, p-isopropyloxy phenoxy group, p-butoxy phenoxy group, 2,6-dimethyl phenoxy group, 2,6-diethyl phenoxy group, 2,6-diisopropyl phenoxy group, 2,6-dimethoxy phenoxy group, 2,6-dimethoxy phenoxy group, 2,6-diisopropyloxy phenoxy group, 2,6-dichlorophenoxy group, 2-chloro-6-methyl phenoxy group, and 2-chloro-6-ethyl phenoxy group, for example.

The substituents of the (f) type include methylthio group, ethylthio group, n-propylthio group, isopropyl thio group, tertiary butyl thio group, linear or branched pentyl thio group, linear or branched hexyl thio group, linear or branched heptyl thio group, linear or branched octyl thio group, and 2-hydroxy-ethyl thio group, for example.

The substituents of the (g) type are unsubstituted phenyl thio groups and phenyl thio groups having one to four groups selected from among methyl group, hydroxy group, methoxy group, carboxyl group, cyano group, and fluoro group as substituents. Specifically, they include thiophenol group, p-toluene thiol group, p-hydroxythiophenol group, o-methoxythiophenol group, and 4-cyano-2,3,5,6-tetrafluorothiophenol group, for example.

The substituents of the (h) type include fluorine atom, bromine atom, chlorine atom, and iodine atom, for example. Among other substituents cited above, fluorine atom proves particularly favorable because it is effective in promoting the solubility in solvent or resin.

The anthraquinone compound (B) of this invention is enabled to form dyes in yellow, red, or blue color by being combined with other compounds of the (A) and (c) groups.

The present inventors have tried various combinations of the anthraquinone compound (B) with the compound dyes of the other (A) and (C) groups (further, with the other dyes) with a view to forming dyes in yellow, red, or blue color as required. As a result, they have found that the combinations capable of imparting necessary properties to the dyes can be attained by introducing the amine substituents of the (a)–(c) types mentioned above and the substituents of the (d)–(g) types, depending on the purposes to be described herein below, in the 1 2, 4, and/or 4 positions of the substituents of the (h) type, preferably fluorine atoms among others, into the remainders of the positions.

Appropriately, the amine substituents of the (a), (b), and (c) types are used mainly for the purpose of shifting the wavelength for absorption toward the longer wavelength side. The width of the shift can be varied by the kinds of substituents or the number of substituents to be used. The absorption wavelength can be specifically controlled within the range of wavelength of 400–650 nm, depending on the kinds of substituents or the number of substituents to be used. In this case, the secondary amino groups to be introduced into one to three of the 1, 2, 3, and 4 positions of the anthraquinone skeleton are preferred to be those of anilino groups of the (a) and (b) types for the sake of improving lightfastness.

Appropriately, the substituents of the (d) and (e) types are used mainly for the purpose of notably improving the solubility. The use of the substituents permits the anthraquinone compound (B) to exhibit high solubility in solvents of the ketone type such as acetone and methylethyl ketone, solvents of the hydrocarbon type such as benzene, toluene, and xylene, and solvents of the halogen type such as chloroform and dichloroethane. The effect in enhancing the solubility grows in proportion as the number of substituents to be used increases.

Appropriately, the substituents of the (f) and (g) types are used for the purpose of permitting minor control of the absorption wavelength and, at the same time, allowing impartation of solubility.

The substituents of the (h) type are capable of promoting the enhancement of solubility in solvents of resins. The use of fluorine atom among others proves particularly effective in this respect.

These substituents, when introduced in a combined state, permit the anthraquinone compound (B) to manifest notably exalted solubility in solvents of the ketone type such as acetone and methylethyl ketone, solvents of the hydrocarbon type such as benzene, toluene, and xylene, and solvents of the halogen type such as chloroform and dichloroethane and, at the same time, allow control of the absorption wavelength in the range of wavelength of 400–650 nm, depending on the kinds of substituents or the number of substituents to be used.

In the anthraquinone compound (B) mentioned above, an anthraquinone compound represented by the general formula

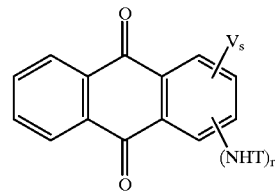

(3)

wherein V represents a halogen atom or OU, T and U independently represent an unsubstituted or substituted alkyl group, a cycloalkyl group, or an unsubstituted or substituted aryl group, and r and s each represent an integer of 1–3, providing p+q is not more than 4 and, when s is 2 or more, the plurality of V's independently represent identical or different substituents, proves advantageous from the viewpoint of enabling the compound to form a dye. The NHT in the general (3) mentioned above is the same as that of the secondary amino group of the (a)–(c) types described above and the OU is the same as the unsubstituted or substituted alkoxy group or the unsubstituted or substituted phenoxy group of the (d) and (f) types mentioned above.

In order for this anthraquinone compound (3) to be used as a toning yellow dye usable for the photosensitive resin coloring composition for use in a color filter of red color or green color, it is preferred to be such that in the general formula (3), r is 1, NHT occupies the 2 or 3 position of the anthraquinone skeleton, T is an aryl group having a substituents, preferably of a quality of an acceptor, at the ortho position, at least one of the V's is an unsubstituted or substituted alkoxy group or an unsubstituted or substituted phenoxy group, the remainders of the V's are fluorine atoms. Particularly, this compound prefers T to be an aryl group having substituents at the 2 and 6 positions as for the sake of improving the solubility.

In order for this anthraquinone compound (3) to be used as a dye for red color in the photosensitive resin coloring composition for use in a color filter of red color, it is preferred to have one of the anilino groups, particularly containing a substituents of a quality of a donor, of the (b) type mentioned above introduced into either of the 2 and 3 positions of the anthraquinone skeleton or have anilino groups, particularly containing a substituents of a quality of acceptor, of the (a) type introduced into two of the 2 1, 2, 3, and 4 positions and at least either of the 2 and 3 positions of the anthraquinone skeleton. For the sake of imparting solubility to the compound, the introduction of alkoxy groups or phenoxy groups of the (d) or (e) type proves favorable.

When the anthraquinone compound (3) is intended as a dye usable for the photosensitive resin coloring composition for a color filter of blue color, the compound is preferred to be such that in the general formula (3) mentioned above, r is 2–3, at least one of the NHT's is substituted at the 2 or 3 position of the anthraquinone skeleton, T is an aryl group (an anilino group of the (b) type as NHT), the aryl group has a substituents (particularly having a substituents of a quality of a donor) at the ortho position, and the remainders of position are occupied each by a fluorine atom or, in the general formula (3), two of the NHT's are substituted at the 1 and 4 positions of the anthraquinone skeleton, T is an unsubstituted or substituted alkyl group or cycloalkyl group, and the 2 and 3 positions of the remainders are occupied by fluorine atoms and/or OU. When the solubility is particularly necessary, the introduction of alkoxy groups or phenoxy groups of the (d) or (e) type prove favorable.

The introduction of an unsubstituted or substituted anilino group as a secondary amino group as described above results in improving the lightfastness. In contrast, the introduction of an alkylamino group instead of the anilino group as the secondary amino group results in degrading the lightfastness. It is, therefore, preferable to use an unsubstituted or substituted anilino group as at least one of the substituents under discussion. (Though alkyl amino substituents are disclosed in literature (Zh. Obsch. Khim. 1968, Vol. 38, No. 8, pp, 1884–1888), they have very poor lightfastness and are deficient n practical serviceability.)

The present invention requires to have at least one of the secondary amino substituents of the (a) or (c) type introduced into the 2 or 3 position of the anthraquinone skeleton. The present inventors have found that the anthraquinone compound acquires better lightfastness when it has the substituents introduced into the 2 and 3 positions of the anthraquinone skeleton than when it has the substituents introduced into the 1 and 4 positions. As respects the introduction of the substituents of the (a)–(c) types, therefore, this invention prefers to have the substituents introduced faster into the 2 and 3 positions than into the 1 and 4 positions of the anthraquinone skeleton. Further as respects the introduction of the substituents of the (d)–(g) types, the introduction into the 2 and 3 positions proves more advantageous in terms of lightfastness than into the 1 and 4 positions.

Typical examples of the anthraquinone compound (B) of the present invention described above are as follows.

(1) 2-Anilino-1,3,4-trifluoroanthraquinone, (2) 2-(o-Ethoxycarbonylanilino)-1,3,4-trifluoroquinizarine, (3) 2-(p-Cyanoanilino)-1,3,4-trifluoroquinizarine, (4) 2-(o-Nitroanilino)-1,3,4-trifluoroquinizarine, (5) 2-(p-Tertiary butyl anilino)-1,3,4-trifluoroquinizarine, (6) 2-(o-methoxyanilino)-1,3,4-trifluoroquinizarine, (7) 2-(2,6-Diisopropylanilino)-1,3,4-trifluoroquinizarine, (8) 2-(2,6-Dichloroanilino)-2,3,4-trifluoroquinizarine, (9) 2-(2,3,5,6-Tetrachloroanilino)-1,3,4-trifluoroquinizarine,

(10) 2-(2,3,5,6-tetrafluoroanilino)-1,3,4-trifluoroquinizarine,

(11) 3-(2,3,4,5-Tetrafluoroanilino)-2-butoxy-1,4-difluoro-anthraquinone,

(12) 3-(4-Cyano-3-chloroanilino)-2-octyloxy1,4-difluoro-anthraquinone,

(13) 3-(4-Cyano-3-chloroanilino)-1,2-dibutoxy-4-fluoro-anthraquinone,

(14) 3-(p-Cyanoanilino)-2-phenoxy-1,4-difluoroanthraquinone,

(15) 3-(p-Cyanoanilino)-2-(2,6-diethylphenoxy)-1,4-difluoroanthraquinone,

(16) 3-(2,6-Dichloroanilino)-2-(2,6-dichlorophenoxy-1,4-difluoroanthraquinone,

(17) 3-(2,3,5,6-Tetrachloroanilino)-2-(2,6-dimethoxyphenoxy)-1,4-difluoroanthraquinone,

(18) 2,3-Bis(p-methoxyanilino)-1,4-difluoroanthraquinone,

(19) 2,3-Bis(2-methoxy-6-methylanilino)-1,4-difluoroanthraquinone,

(20) 2,3-Bis(2,5-diisopropylanilino)-1,4-difluoroanthraquinone,

(21) 2,3-Bis(2,3,5,6-tetrafluoroanilino)-1,4-difluoroanthraquinone,

(22) 3-(2,6-Dichloroanilino)-2-(2,6-dichlorophenoxy)-1,4-dichloroanthraquinone,

(23) 2-(2,6-Dichloroanilino) anthraquinone,

(24) 3-(2,6-Dichloroanilino)-2-(2,6-dichlorophenoxy)-anthraquinone,

(25) 2,3-Bis(2-methoxy-6-methylanilino)-1,4-dichloroanthraquinone,

(26) 2-Butylamino-1,3,4-trifluoroquinizarine,

(27) 1,4-Bis(n-butylamino)-2,3-difluoroanthraquinone,

(28) 1,4-Bis(cyclohexylamino)-2-octyloxy-3-fluoroanthraquinone.

When the anthraquinone compounds cited above are to be mentioned herein below, they will be indicated with the relevant prefixed numerals inserted in the parentheses following the names of anthraquinone compounds. For example, "anthraquinone compound (28)" refers to "1,4-Bis (cyclohexylamino)-2-octyloxy-3-fluoro-anthraquinone" bearing the reference number (28) shown above.

The anthraquinone compound (B) mentioned above can be produced by the following method, for example.

Anthraquinones which have halogen atoms substituted at the 1, 2, 3, and 4 positions, or at the 1, 2, and 3 positions, or at the 1, 2, and 4 positions, or at the 1 and 2 positions, or at the 1 and 3 positions, or at the 2 and 3 positions, or at the 2 position, or at the 3 position as represented by the following general formula (7)

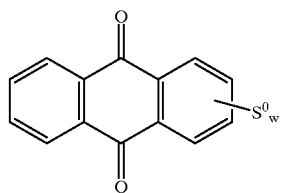

(7)

wherein $S^0$ represents a halogen atom and w represents an integer of 0–3, are used as starting raw materials. They are each caused to react sequentially or simultaneously with an aromatic amino compound alone or an aromatic amino compound together with a nucleophilically reactive substance selected from among aliphatic amino compounds, aromatic hydroxy compounds, aliphatic hydroxy compounds, aromatic mercapto compounds, and aliphatic mercapto compounds thereby inducing nucleophilic substitution of fluorine atoms.

The nucleophilically reactive substances used herein are such compounds as are represented by the general formula (8)

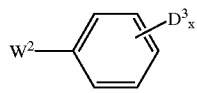

(8)

wherein $W^2$ represents $—NH_2$, $—OH$, or SH, $D^3$'s independently represent at least one member selected from the class consisting of $—COOR^5$, wherein $R^5$ represents hydrogen atom or an alkyl group of 1–18, preferably 1–12, carbon atoms, nitro group, cyano group, alkyl groups of 1–8, preferably 1–6, carbon atoms, alkoxy groups of 1–8, preferably 1–6, carbon atoms, and halogen atoms, and x represents and integer of 0–5, preferably 1–3. In this case, the nucleophilically reactive substances are preferred to have substituents at the 2 and 6 positions thereof. Other nucleophilically reactive substances are compounds of the formula, $W^2R^6$, wherein $R^6$ represents an alkyl group of 1–18, preferably 1–12, carbon atoms, for example.

The nucleophilic substitution reaction is generally carried out in an organic solvent. The organic solvents which are used effectively in the reaction include inert solvents such as nitrobenzene, acetonitrile, and benzonitrile, nonprotonic polar solvents such as pyridine, N,N-dimethyl acetamide, N-methyl-2-pyrrolidone, triethyl amine, tri-n-butyl amine, dimethyl sulfone, and sulfolane, halogen type solvents such as α-chloronaphthalene, trichlorobenzene, dichlorobenzene, chloroform, and dichloroethane, and benzene, toluene, and xylene, for example. Such nucleophilically reactive substances as amino compounds and hydroxy compounds mentioned above themselves may be used as solvents in the place of the organic solvents mentioned above.

Appropriately, such organic bases as triethyl amine and tri-n-butyl amine and such inorganic bases as potassium fluoride, potassium hydroxide, potassium carbonate, sodium hydroxide, and sodium carbonate may be used as condensing agents. The condensing agents mentioned above do not need to be used when the nucleophilically reactive substances themselves manifest a quality as a condensing agent in such amino compounds as aniline, toluidine, or anisidine. No use is found for any condensing agent when the nucleophilically reactive substances themselves have strong reactivity.

The reaction temperature generally is in the range of 20°–120° C., though variable with such factors as the reaction solvent. Preferably, the substitution reaction of an aromatic amino compound is carried out in the range of 50°–180° C., that of an aromatic hydroxy compound in the range of 20°–120° C., that of an aliphatic hydroxy compound in the range of 50°–180° C., that of an aromatic mercapto compound in the range of 20°–100° C., or that of an aliphatic mercapto compound in the range of 50°–180° C.

I-i-(1)-<3>. Phthalocyanine Compound (C)

The phthalocyanine compound (C) to be used in this invention excels in solubility in resin, exhibits excellent lightfastness and thermal resistance, shows prominent transparency and no turbidity, and excels also in terms of color tone. This is a phthalocyanine compound (C) such that in the phthalocyanine skeleton represented by the following general formula (1)

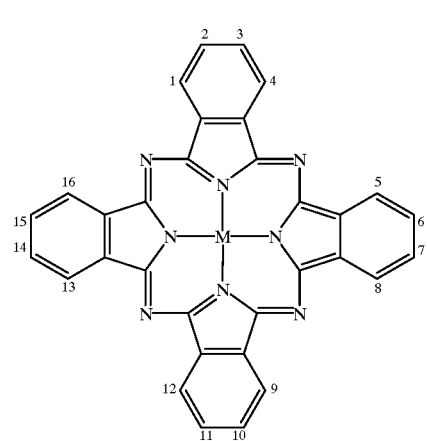

(1)

wherein M represents a divalent metal or a tetravalent metal possessing a ligand, one to eight of the 16 substitutable positions of the benzene ring are each occupied by an unsubstituted or substituted alkoxy group and/or an unsubstituted or substituted phenoxy group and the remainders of the positions are occupied each by a halogen atom. In the (C) group, those phthalocyanine compounds which have one to eight substituents at the 2, 3, 6, 7, 10, 11, 14, and 15 positions of the unsubstituted or substituted alkoxy group and/or unsubstituted or substituted phenoxy group, when not combined with the compounds of the (A) and (B) groups but used alone, excel in solubility in resin, exhibit excellent lightfastness and thermal resistance, show prominent transparency and no turbidity, and excel also in terms of color tone and, therefore, can form a dye to be used in the photosensitive resin coloring composition for a color filter.

In the phthalocyanine compound (C) mentioned above, the substituents used in the unsubstituted or substituted alkoxy group and/or phenoxy group do not need to be construed in a narrow sense of the word but mean all the nonmetallic atomic groups other than hydrogen atom. The nonmetallic atomic groups include halogen atoms, alkyl groups, aryl groups, heterocyclic groups, cyano group, hydroxy group, nitro group, amino groups including substituted amino groups, alkoxy groups, aryloxy groups, acyl amino groups, aminocarbonyl amino groups, sulfamoyl amino groups, alkyl thio groups, aryl thio groups, alkoxycarbonyl amino groups, sulfonyl amino groups, carbamoyl group, sulfamoyl group, sulfonyl group, alkoxycarbonyl groups, heterocyclic oxy groups, azo group, acyloxy group, carbamoyl oxy group, silyloxy group, aryloxy carbonyl group, imide group, heterocyclic thio group, sulfinyl group, phosphoryl group, and acyl group, for example.

Of the phthalocyanine compounds (C) mentioned above, those in which the total of atomic radii of the atoms minus hydrogen atoms contained in the substituents at the ortho position of that of the phenoxy group which possesses a substituents at the ortho position is not less than 3.0 Å prove favorable. Here, the atomic radii of main atoms, i.e. carbon= 0.77 Å, oxygen=0.74 Å, nitrogen=0.74 Å, fluorine=0.72 Å, chlorine=0.99 Å, bromine=1.14 Å, silicon=1.17 Å, phosphorus=1.10 Å, and sulfur=1.04 Å, are used.

The phthalocyanine compound (C) manifests a still better effect on the solubility in resin and the absorption wavelength when the total of atomic radii is not less than 3.0 Å.

Of the phthalocyanine compounds (C) mentioned above, those which are represented by the general formula (9)

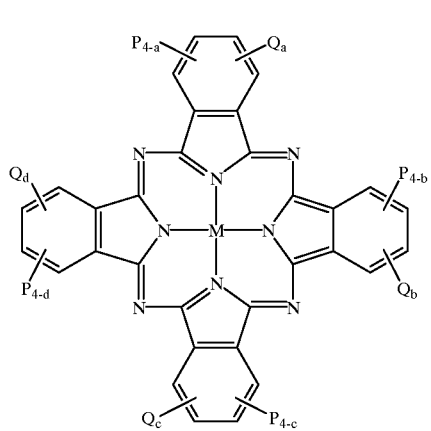

(9)

wherein P represents at least on atom selected from among halogen atoms, Q represents a phenoxy group having a substituents at the ortho position as represented by the general formula (10),

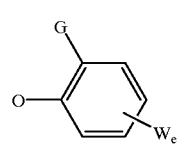

(10)

wherein G represents at least one substituents selected from among the substituents of the following (1)–(7) groups (1) group $R^{11}$
(2) group $CO_2R^{12}$
(3) group $CO_2(CH_2CH_2O)_2R^{13}$
(4) group $CO_2(CH_2CH_2CH_2O)_gR^{14}$
(5) group $O[(CH_2)_nO)]_iR^{15}$
(6) group $CO_2(CH_2)_fR^{16}$

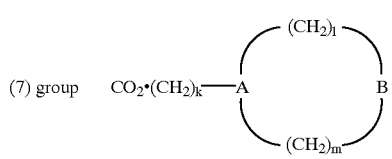

(7) group $CO_2 \cdot (CH_2)_k$—A wherein $R^{11}$, $R^{12}$, $R^{13}$, $R^{14}$, and $R^{15}$ independently represent a linear, branched, or cyclic alkyl group of 1–20 carbon atoms or an unsubstituted or substituted aryl group, $R^{16}$ represents an unsubstituted or substituted aryl group, A represents a CH group or a nitrogen atom, B represents an oxygen atom, a sulfur atom, a $CH_2$ group, a NH group, or an alkyl amino group of 1–4 carbon atoms, f, g, h, and j each represent an integer of 1–5, i and k each represent an integer of 0–6, and l and m independently represent an integer of 1–4, W represents at least one substituents selected from among halogen atoms and/or G, and e represents an integer of 0–4, a–d each represent an integer of 0–4, providing the total of a–d is an integer of 1–8, and M represents a divalent metal or a tetravalent metal possessing a ligand, prove particularly favorable.

The substituents which possibly occur in the unsubstituted or substituted aryl group involved in the definition of G above include lower alkyl groups ($C_1$–$C_4$), lower alkoxy groups ($C_1$–$C_4$), halogen atoms, nitro group, amino groups, alkyl ($C_1$–$C_4$) amino groups, and alkoxycarbonyl ($C_1$–$C_4$) groups, for example.

the phthalocyanine compounds represented by the general formula (12) mentioned above have one to eight unsubstituted or substituted alkoxy group and/or unsubstituted or substituted phenoxy group introduced into the positions of linkage of the benzene rings in the phthalocyanine skeleton. The present inventors have been ascertained that the phthalocyanine compound is enabled particularly by the introduction of the substituted G, defined in the general formula (10) above, in high bulkiness into the ortho position of the phenoxy group to acquire excellent properties of retaining the lightfastness and controlling the solubility in resin and the absorption wavelength and further that the color filter grade photosensitive resin coloring composition containing a dye incorporating therein at least one of the phthalocyanine compound and the color filter using this coloring composition are capable of manifesting an excellent effect in controlling lightfastness and absorption wavelength.

Further in this invention, the phthalocyanine compound (C) in which the substituents represented as Q in the general formula (12) occupy the so-called β positions, i.e. the 2, 3, 6, 7, 10, 11, 14, and 15 positions in the total of 16 substitutable positions of the benzene ring of the phthalocyanine skeleton represented by the general formula (1)

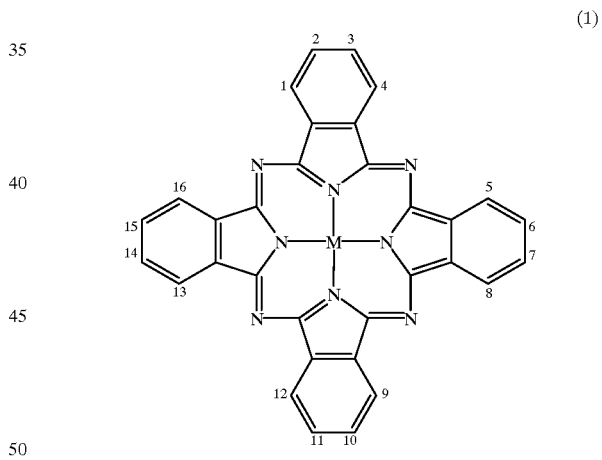

(1)

wherein M represents a divalent metal or a tetravalent metal possessing a ligand, when not combined with the compound of the (A) and/or (B) group mentioned above but used alone as a compound of the (C) group, acquires excellent properties of retaining the lightfastness and meanwhile controlling the solubility in resin and the absorption wavelength and the color filter grade photosensitive resin coloring composition containing a dye incorporating at least one of the phthalocyanine compound of the (C) group and the color filter using this coloring composition are at an advantage in manifesting excellent effects in the lightfastness and the control of the absorption wavelength.

While one to eight of the total of 16 positions of linkage in the benzene ring of the phthalocyanine compound (C) are occupied by unsubstituted or substituted alkoxy groups an/or unsubstituted or substituted phenoxy groups, the remainders, indicated as P in the general formula (9), of the positions are required to be occupied by halogen atoms, preferably by fluorine atoms. The use of fluorine atoms produces a better effect in promoting the solubility of the phthalocyanine compound (C).

The phthalocyanine compound (C) mentioned above prefers the remainders, indicated as P in the general formula (9) of the positions to be occupied by fluorine atoms. Particularly, the fact that fluorine atoms occupy not less than five of the 1, 4, 5, 8, 9, 12, 13, and 16 positions in the structural formula of phthalocyanine shown as the general formula (1) proves favorable because it brings about a still better effect in enhancing the solubility of the compound in resin.

In the phthalocyanine compound (C) mentioned above, the number of unsubstituted or substituted phenoxy groups attached at all to the positions of linkage in the benzene ring of the phthalocyanine skeleton represented by the general formula (1) mentioned above is preferred to be 3–5. More preferably, the phenoxy groups mentioned above occupy some of the 2, 3, 6, 7, 10, 11, 14, and 15 positions in the structural formula of phthalocyanine shown as the general formula (1) above. The fact that a total of three to five phenoxy groups are attached to as many of the 2, 3, 6, 7, 10, 11, 14, and 15 positions brings about a still better effect on the adaptability of the color filter grade photosensitive resin coloring composition to the absorption wavelength as a dye.

In the unsubstituted or substituted phenoxy groups attached to the positions of linkage of the benzene ring of the phthalocyanine skeleton in the phthalocyanine compound (C) mentioned above, substituents are preferred to be introduced in high bulkiness into the ortho positions of the phenoxy groups. It is proper particularly to use the substituents of the (1)–(7) groups which are represented by G in the general formula (13) mentioned above. The phenoxy groups offer the substituents, W for further substitution of the compound. W represents G or a halogen atom, preferably G. Appropriately, at least one the substituents W occupies the ortho position of the phenoxy group, namely the substituents G and W occupy the 2 and 6 positions of the phenoxy group. The fact that the phenoxy group has substituents at the 2 and 6 positions thereof produces a favorable effect on the solubility in resin and the absorption wavelength.

In this case, the total number of atoms less hydrogen in the substituents attached to the 2 and 6 positions of the phenoxy group is preferred to be not less than 4, more properly not less than 7.

The typical examples of the substituents which are attached to either or both of the 2 and 6 positions of the phenoxy group are as follows.

Substituents of the (1) group: Methyl, ethyl, propyl, isopropyl, cyclopropyl, butyl, isobutyl, sec-butyl, tert-butyl, linear or branched pentyl, linear or branched hexyl, cyclohexyl, linear or branched heptyl, linear or branched octyl, linear or branched nonyl, linear or branched decyl, linear or branched undecyl, linear or branched dodecyl, phenyl, o-methyl phenyl, m-methyl phenyl, p-ethyl phenyl, p-isopropyl phenyl, p-butyl phenyl, p-tert-butyl phenyl, o-methoxyphenyl, m-methoxyphenyl, p-ethoxyphenyl, p-isopropoxyphenyl, p-butoxyphenyl, 2,6-dimethyl phenyl, 2,6-diethyl phenyl, 2,6-diisopropyl phenyl, 2,6-di-tert-butyl phenyl, 2,6-dimethoxy phenyl, 2,6-diethoxy phenyl, 2,6-diisopropoxy phenyl, 2-fluorophenyl, 2-chloropheynyl, 2-bromo-phenyl, 2-iodophenyl, 4-fluorophenyl, 4-chlorophenyl, 4-bromo-phenyl, 4-iodophenyl, 2,3-difluorophenyl, 2,3-dichlorophenyl, 2,4-difluorophenyl, 2,4-dichlorophenyl, 2,4-dibromophenyl, 2,6-difluorophenyl, 2,6-dichlorophenyl, 2,6-difluorophenyl, 2,6-dichlorophenyl, 2,6-dibromophenyl, 3,4-difluorophenyl, 3,4-dichlorophenyl, 3,4-difluorophenyl, 3,5-dichlorophenyl, 2,4,6-trifluorophenyl, 2,4,6-trichlorophenyl, 2,3,5,6-tetrafluorophenyl, pentafluorophenyl, and pentachlorophenyl.

Substituents of the (2) group: Methoxy carbonyl, ethoxy carbonyl, propoxy carbonyl, isopropoxy carbonyl, butoxy carbonyl, isobutoxy carbonyl, sec-bustoxy carbonyl, tert-butoxy carbonyl, linear or branched pentyl carbonyl, linear or branched hexyloxy carbonyl, cyclohexyloxy carbonyl, linear or branched heptyloxy carbonyl, linear or branched octyloxy carbonyl, linear or branched nonyloxy carbonyl, linear or branched decyloxy carbonyl, linear or branched undecyloxy carbonyl, linear or branched dodecyloxy carbonyl, cyclohexane methoxy carbonyl, cyclohexane ethoxy carbonyl, 3-cyclohexyl-1-propoxy carbonyl, tert-butyl cyclohexyloxy carbonyl, phenoxy carbonyl, 4-methylphenoxy carbonyl, 4-chlorophenoxy carbonyl, 4-cyclohexylphenoxy carbonyl, 4-phenylphenoxy carbonyl, 2-fluorophenoxy carbonyl, and 4-ethoxy-phenoxy carbonyl.

Substituents of the (3) group: Methoxyethoxy carbonyl, ethoxyehtoxy carbonyl, 3',6'-oxaheptyloxy carbonyl, 3',6'-oxa-octyloxycarbonyl, 3',6',9'-oxadecyloxycarbonyl, and 3',6',9',-12'-oxatridecyloxy carbonyl.

Substituents of the (4) group: Methoxypropyloxy carbonyl, ethoxypropyloxy carbonyl, 4',8'-oxanonyloxy carbonyl, 4',8'-oxa-decyloxy carbonyl, and 4',8',12'-oxatridecyloxy carbonyl.

Substituents of the (5) group: Methoxy, ethoxy, propoxy, isopropoxy, butoxy, isobutoxy, sec-butoxy, tert-butoxy, linear or branched pentyloxy, linear or branched hexyloxy, cyclohexyl-oxy, linear or branched heptyloxy, linear or branched octyloxy, linear or branched nonyloxy, linear or branched decyloxy, linear or branched undecyloxy, linear or branched dodecyloxy, methoxy-ethoxy, ethoxyehtoxy, 3',6'-oxaheptyloxy, 3',6'-oxacryloxy, 3',6',9'-oxadecyloxy, 3',6',9', 12'-oxatridecyloxy, methoxypropyloxy, ethoxypropyloxy, 4',8'-oxanonyloxy, and 4',8'-oxadecyloxy.

Substituents of the (6) group: Benzyloxy carbonyl, phenetyloxy carbonyl, 3-phenyl-2-propoxy carbonyl, 4-phenyl-1-butoxy carbonyl, 5-phenyl-1-pentoxy carbonyl, and 6-phenyl-1-hexyloxy carbonyl.

Substituents of the (7) group: 2-Tetrahydroxyfuranoxy carbonyl, 4-tetrahydropyranoxy carbonyl, 2-pyridinoxy carbonyl, 2-piperidinoxy carbonyl, 2-tetrahydrothiophenoxy carbonyl, tetra-hydrofurfuryloxy carbonyl, 4-tetrahydropyranoxy carbonyl, 2-morpholinoethoxy carbonyl, 2-pyrrolidinoethoxy carbonyl, and 2-piperadinoethoxy carbonyl.

Of the phthalocyanine compounds (C) mentioned above, those which have substituents attached in high bulkiness to the 2 and 6 positions of the phenoxy group. One of the substituents at the 2 and 6 positions is preferred to be selected from among the substituents of the (2)–(4) groups and those of the (6) and (7) groups. Particularly favorably, one of the substituents at the 2 and 6 positions is selected from among the substituents of the (2)–(4) groups and those of the (6) and (7) groups and the other substituent is selected from among the substituents of the (1) and (3) groups. Even when a colored layer in green color is formed with a green color filter grade photosensitive resin coloring composition using the phthalocyanine compound (C) alone as a dye, for example, the particular combination of substituents just mentioned brings above a favorable effect on enhancing the adaptability of the coloring composition to the absorption wavelength.

The halogen atoms may be cited as typical examples of the substituent W besides the substituents of the (1)–(7) groups. Specifically, they are fluorine atom, chlorine atom, bromine atom, and iodine atom. Among the halogen atoms mentioned above, chlorine atom and bromine atom prove particularly favorable.

To the positions for linkage in the phenoxy group mentioned above which remain after the introduction of the substituents g and W mentioned above, other substituents may be introduced for the sake of enhancing the solubility and controlling the absorption wavelength. The substituents which are fit for the additional introduction include halogen atoms and/or alkoxy carbonyl the alkoxy group of which comprises an unsubstituted or substituted linear or branched alkoxy of 1–20, preferably 1–4 carbon atoms, unsubstituted or substituted aryloxy carbonyl group, unsubstituted or substituted linear or branched alkyl groups of 1–12, preferably 1–4 carbon atoms, linear or branched alkoxy groups of 1–12, preferably 1–4 carbon atoms, linear or branched alkylamino groups of 1–20, preferably 1–4, carbon atoms, linear or branched dialkyl amino groups of 1–20, preferably 1–4 carbon atoms, cyclohexyl group, unsubstituted or substituted phenoxy group, unsubstituted or substituted anilino group, and nitro group, for example.

The alkoxy groups attached as substituents to one to eight of the total of 16 substitutable positions of the benzene ring of the phthalocyanine skeleton in the phthalocyanine compound (C) mentioned above may be substituted by any of the nonmetallic atomic groups other than hydrogen atom mentioned above. These substituents are preferred to be methoxy, ethoxy, propoxy, isopropoxy, butoxy, isobutoxy, sec-butoxy, tert-butoxy, linear or branched pentyloxy, linear or branched hexyloxy, cyclohexyl-oxy, linear or branched heptyloxy, linear or branched octyloxy, linear or branched nonyloxy, linear or branched decyloxy, linear or branched undecyloxy, linear or branched dodecyloxy, methoxyethoxy, ethoxyehtoxy, 3',6'-oxaheptyloxy, 3',6'-oxaoctyloxy, 3',6',9'-oxadecyloxy, 3',6',12'-oxatridecyloxy, methoxypropyloxy, ethoxypropyloxy, 4',8'-oxanonyloxy, and 4',8'-oxadecyloxy, for example.

The phthalocyanine compounds (C) mentioned above embrace metal phthalocyanine compounds. The compounds represented by the general formula (12) mentioned above may be cited as typical examples of the metal phthalocyanine compounds. Specifically, in the general formula (12) mentioned above, M represents a divalent metal or a tetravalent metal possessing a ligand. As typical examples of the core metal, M, in the phthalocyanine compound, divalent metals such as iron chloride, iron, magnesium, nickel, cobalt, copper, palladium, and zinc and tetravalent metals such as aluminum chloride, indium chloride, germanium chloride, tin chloride, and metals possessing such ligands as titanyl or vanadyl may be cited. Among other core metals cited above, cobalt, copper, palladium, zinc, tin chloride, and vanadyl prove particularly favorable on account of fine lightfastness.

Of the phthalocyanine compounds (C) mentioned above, those which have a divalent metal or a tetravalent metal possessing a ligand as the substituent M and have unsubstituted or substituted alkoxy groups and/or unsubstituted or substituted phenoxy groups attached as substituents to at least three of the 2, 3, 6, 7, 10, 11, 14, and 15 positions with respect to the general formula (1)

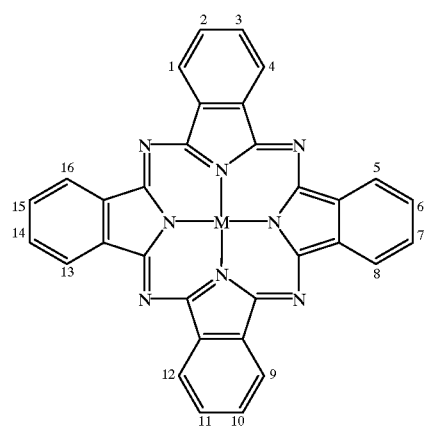

(1)

prove favorable for the sake of forming a dye.

With respect to the general formula (1) mentioned above, for the production of a dye fit for use in a glue color filter grade photosensitive resin coloring composition, the core metal M is preferred to be a divalent metal such as, for example, cobalt, copper, palladium, nickel, or zinc, particularly zinc, cobalt or copper from the viewpoint of the adaptability of the absorption wavelength. More preferably, the core metal M is a divalent metal and the number of phenoxy groups attached as substituents to the benzene ring of the phthalocyanine skeleton is three to five and the remainders of positions for linkage are occupied by fluorine atoms.

Again with respect to the general formula (1) mentioned above, for the production of a dye fit for use in a green color filter grade photosensitive resin coloring composition, the core metal M is preferred from the viewpoint of the adaptability of the absorption wavelength to be a tetravalent metal possessing a ligand such as, for example, tin chloride ($SnCl_2$), vanadyl (VO), titanyl (TiO), particularly vanadyl, More preferably, the core metal M is a tetravalent metal possessing a ligand, the number of phenoxy groups attached as substituents to the benzene ring of the phthalocyanine skeleton is three to five, the total of atomic radii of the atoms minus hydrogen atoms contained in the substituents at the ortho positions of those of the phenoxy groups which possess a substituent at the ortho position is not less than 3.0 Å, and the remainders of the positions are occupied by fluorine atoms.

As typical examples of the phthalocyanine compound (C) of this invention mentioned above, the phthalocyanine compounds identified as Nos. 1–34 as shown in the following tables 5–11 may be cited. The phenoxy groups and the alkoxy groups are attached as substituents to some of the 2, 3, 6, 7, 10, 11, 14, and 15 positions in the general formula (1) mentioned above.

TABLE 1

| Number | Element of residual substituent Kind | Element of residual substituent Number | Substituent Kind | Substituent Number | Central metal |
|---|---|---|---|---|---|
| 1 | Cl | 14 | Et–⟨C6H3⟩–O–, $CO_2(C_2H_4O)_3CH_3$ | 2 | $SnCl_2$ |
| 2 | F | 14 | $CH_3O$–⟨C6H3⟩–O–, $CO_2C_2H_4OCH_3$ | 2 | VO |
| 3 | F | 12 | O–⟨C6H5⟩ | 4 | $SnCl_2$ |
| 4 | F | 12 | O—$CH_2CH_2CH_2CH_3$ | 4 | TiO |
| 5 | F | 12 | O–⟨C6H3⟩–, $CO_2(C_3H_6O)_2Bu$ | 4 | $SnCl_2$ |

TABLE 2

| Number | Element of residual Substituent Kind | Element of residual Substituent Number | Substituent Kind | Substituent Number | Central metal |
|---|---|---|---|---|---|
| 6 | F | 12 | (2-i-PrO-phenoxy) | 4 | TiO |
| 7 | F | 12 | (3-F-2-oxy-phenyl-CO$_2$Bu) | 4 | VO |
| 8 | F | 12 | (3-CH$_3$-2-oxy-phenyl-CO$_2$C$_2$H$_4$OCH$_3$) | 4 | VO |
| 9 | F | 12 | (3-CH$_3$-2-oxy-phenyl-CO$_2$CH$_2$-tetrahydrofuran-2-yl) | 4 | VO |
| 10 | F | 12 | (3-CH$_3$-2-oxy-phenyl-CO$_2$-phenyl) | 4 | SnCl$_2$ |

TABLE 3

| Number | Element of residual Substituent Kind | Element of residual Substituent Number | Substituent Kind | Substituent Number | Central metal |
|---|---|---|---|---|---|
| 11 | F | 12 | (3-phenyl-2-oxy-phenyl-CO$_2$Bu) | 4 | VO |
| 12 | F | 12 | (3-CH$_3$O-2-oxy-phenyl-CO$_2$C$_2$H$_4$OCH$_3$) | 4 | VO |
| 13 | F | 12 | (3-EtO-2-oxy-phenyl-CO$_2$-i-Pr) | 4 | VO |
| 14 | F | 12 | (3,6-diMeO-2-oxy-phenyl) | 4 | TiO |
| 15 | F | 12 | (2-oxy-1,3-bis(CO$_2$C$_2$H$_4$OCH$_3$)-phenyl) | 4 | VO |

TABLE 4

| Number | Element of residual Substituent Kind | Element of residual Substituent Number | Substituent Kind | Substituent Number | Central metal |
|---|---|---|---|---|---|
| 16 | F | 12 | (2-oxy-1,3-bis(CO$_2$(CH$_2$)$_3$-cyclohexyl)-phenyl) | 4 | TiO |
| 17 | F | 8 | (2-i-PrO-phenoxy) | 8 | VO |

TABLE 4-continued

| Number | Element of residual Substituent Kind | Element of residual Substituent Number | Substituent Kind | Substituent Number | Central metal |
|---|---|---|---|---|---|
| 18 | F | 8 | 2-(benzyloxycarbonyl)phenoxy (O-C₆H₄-CO₂CH₂-C₆H₅) | 8 | VO |
| 19 | F | 8 | 2-((CO₂(C₂H₄O)₃CH₃))phenoxy | 8 | VO |
| 20 | F | 8 | 2,6-dimethoxyphenoxy (MeO, O, MeO) | 8 | TiO |

TABLE 5

| Number | Element of residual Substituent Kind | Element of residual Substituent Number | Substituent Kind | Substituent Number | Central metal |
|---|---|---|---|---|---|
| 21 | Cl | 12 | 2-t-Bu-phenoxy | 4 | Co |
| 22 | F | 12 | O—CH₂CH₂OCH₃ | 4 | Zn |
| 23 | F | 12 | phenoxy | 4 | Zn |
| 24 | F | 12 | 3-CH₃-2-(CO₂C₂H₄OCH₃)phenoxy | 4 | Pd |
| 25 | F | 12 | phenoxy | 4 | Cu |

TABLE 6

| Number | Element of residual Substituent Kind | Element of residual Substituent Number | Substituent Kind | Substituent Number | Central metal |
|---|---|---|---|---|---|
| 26 | F | 12 | 3-CH₃-2-(CO₂C₂H₄OCH₃)phenoxy | 4 | Co |
| 27 | F | 12 | 3-CH₃-2-(CO₂C₂H₄OCH₃)phenoxy | 4 | Fe |
| 28 | F | 12 | 3-CH₃-2-(CO₂C₂H₄OCH₃)phenoxy | 4 | Ni |
| 29 | F | 12 | 3-CH₃-2-(CO₂C₂H₄OCH₃)phenoxy | 4 | Zn |
| 30 | F | 12 | 3-CH₃-2-(CO₂C₂H₄OCH₃)phenoxy | 4 | Cu |

TABLE 7

| Number | Element of residual Substituent Kind | Number | Substituent Kind | Number | Central metal |
|---|---|---|---|---|---|
| 31 | F | 12 | 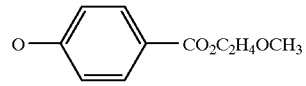 | 4 | Zn |
| 32 | F | 12 | 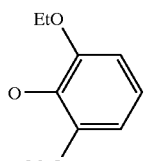 | 4 | Pd |
| 33 | F | 8 | 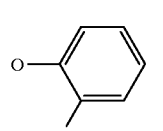 | 8 | Co |
| 34 | F | 8 | 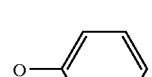 | 8 | Zn |

When the phthalocyanine compounds cited above are to be mentioned herein below, they will be indicated with the relevant prefixed numerals inserted in the parentheses following the names of phthalocyanine compounds. For example, "phthalocyanine compound (34)" refers to "phthalocyanine compound" bearing the reference number (34) shown in Table 11 above.

The phthalocyanine compound (C) mentioned above such as, for example, phthalocyanine containing fluorine atoms can be synthesized by following the first step and the second step severally of the first or the second process of the following scheme. The present inventors have implemented the synthesis in accordance with the method of production resorting to the first and the second step of the following scheme because they have disclosed this method in JP-A-63-30,566, JP-A-63-141,982, JP-A-64-45,474, JP-A-02-175,763, JP-A-02-282,386, JP-A-04-39,361, JP-A-05-222,302, JP-A-06-107,663, JP-A-05-221,952, and JP-A-05-345,861.

In the following formulas, the symbols G, W, and e have the same meanings as defined in the general formulas (9) and (10) above.

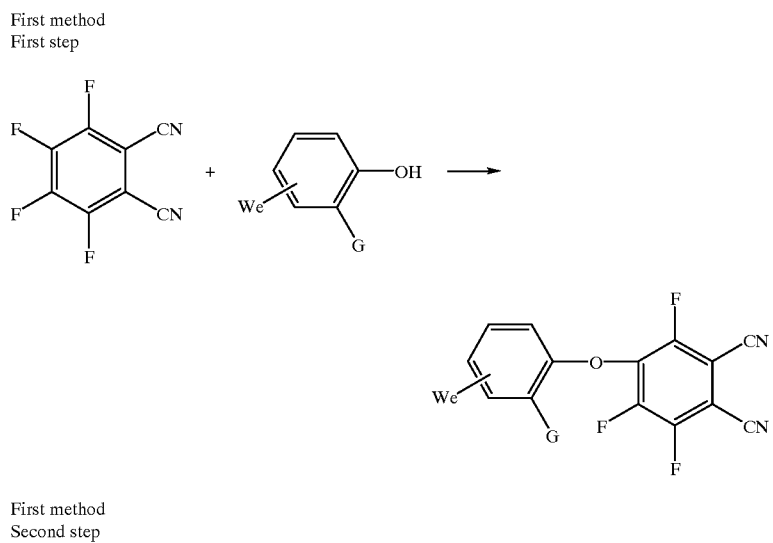

First method
First step

First method
Second step

-continued
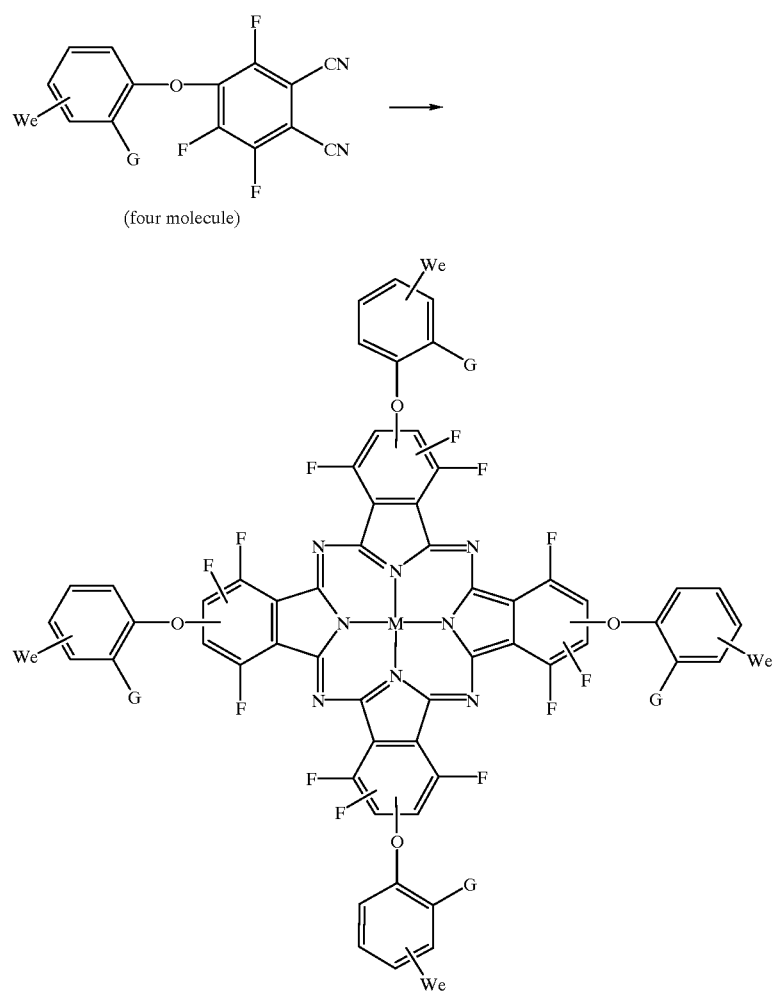
(four molecule)
Second method
First step
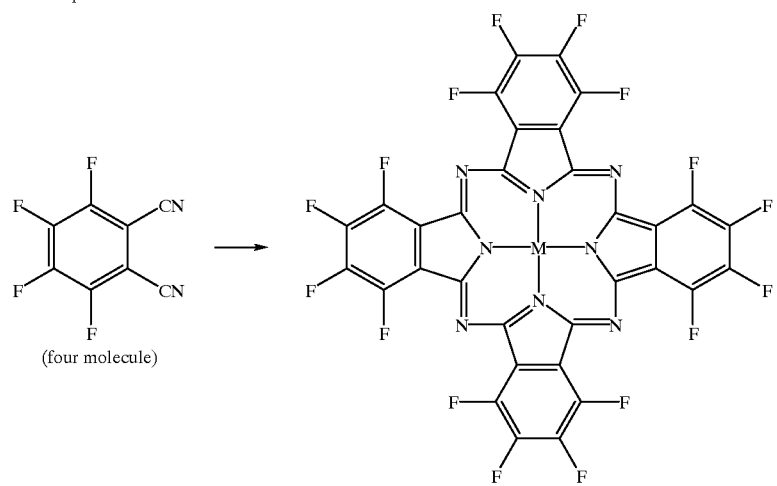
(four molecule)
Second method
Second step -continued

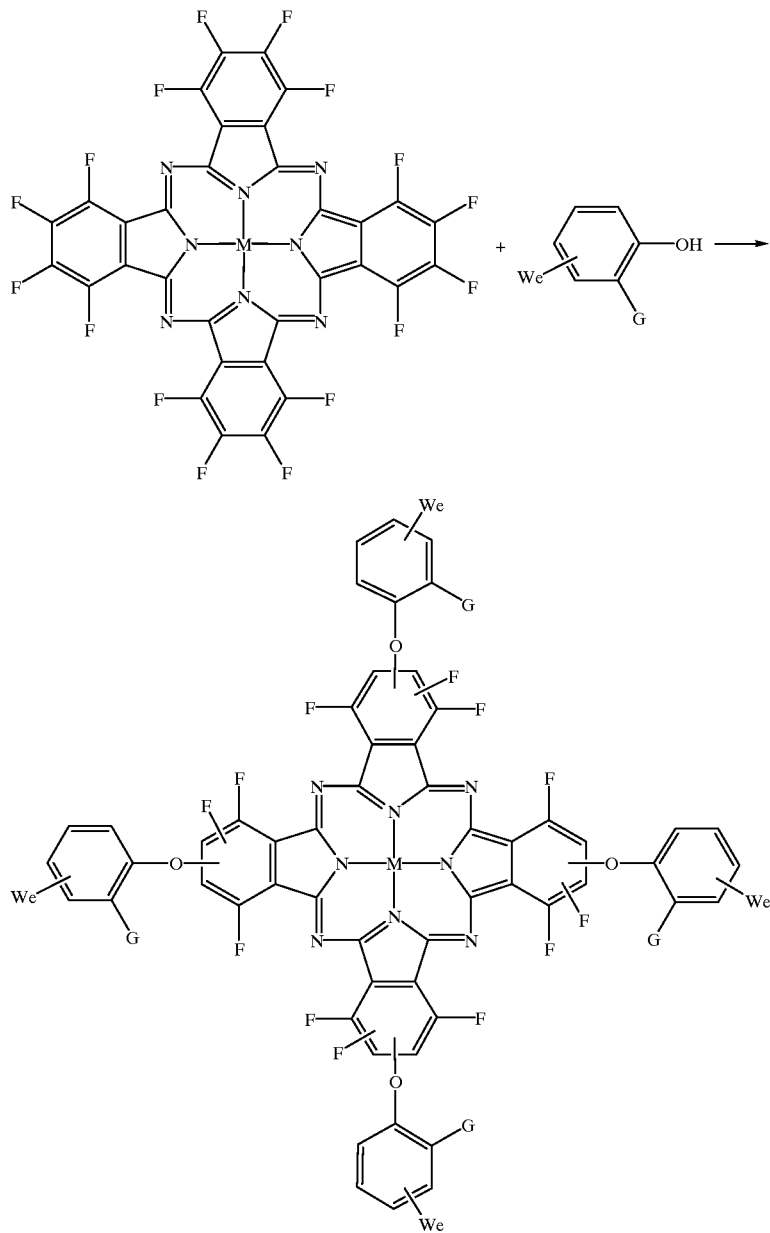

I-i-(2). Dyes for RGB

The dyes in the three primary colors (red, green, and blue) are manufactured by using proper members selected from the class consisting of (A)–(C) groups, namely the (C) group (limited by the requirement that the unsubstituted or substituted alkoxy groups and/or unsubstituted or substituted phenoxy groups are attached as substituents to one–eight of the 2, 3, 6, 7, 10, 11, 14, and 15 positions in the general formula (1) mentioned above) alone, the combination (A)+(B) groups, the combination of (A)+(C) groups, the combination of (B)+(C) groups, and the combination of (A)+(B)+(C) groups. The dyes necessary for the manufacture of the dyes in the three primary colors (red, green, and blue) by suitably combining the compounds of the (C) group alone or the (A)–(C) groups mentioned above will be divided into four groups, i.e. dyes for red color, dyes for green color, dyes for blue color, and dyes for toning yellow color and will be described below with reference to typical examples.

I-i-(2)-<1>. Dyes for Green Color

As the dyes for green color which can form the dyes in green (primary) color contemplated by this invention, the quinizarine dyes for green color and the phthalocyanine dyes for green color which will be shown below may be cited.

I-i-(2)-<1>-a. Quinizarine Dyes for Green Color

As the quinizarine dyes for green color, of the quinizarine compounds (A) represented by the general formula (2) mentioned above, those which have $NHX^2$ for at least one of the Z's can be used. Of the quinizarine compounds (A)

represented by the general formula (2) mentioned above, those which have NHX² for one to three of the substituents, Z, and also contain an unsubstituted or substituted aryl group in at least either of X and X² constitute appropriate quinizarine dyes for green color. As typical examples of the quinizarine dyes for green color which prove favorable, the quinizarine compounds (35)–(39), (40), (41), (44)–(46), (50), (51), and (55)–(58) may be cited.

Of the quinizarine compounds (A) represented by the general formula (2) mentioned above, those which have NHX² for one or two of the substituents Z, contain an unsubstituted or substituted aryl group in each of the substituents X and X², have OY attached as a substituent to at least one of the remainders of positions, and have an alkyl group or an unsubstituted or substituted aryl group for Y are used particularly favorably as quinizarine dyes for green color. As typical examples of the particularly favorable quinizarine dyes for green color, the quinizarine compounds (40), (41), (55), and (58) may be cited.

Of the quinizarine compounds (A) represented by the general formula (2) mentioned above, those which fulfill the requirement that one or two of the substituents Z are each NHX², X and X² are each an aryl group having a substituent at the ortho position, at least one of the remainders of positions has OY attached as a substituent thereto, Y is an alkyl group or an unsubstituted or substituted aryl group, and Z's at the remainders of positions are each a fluorine atom is the most favorable quinizarine dye for green color. As typical examples of the most favorable quinizarine dyes for green color, the quinizarine compounds (40), (41), and (58) may be cited.

Those quinizarine dyes which contain fluorine atoms are preferred on account of high solubility in resin and solvent and high lightfastness and thermal resistance. Those which have unsubstituted or substituted anilino groups for NHX and NHX² are preferred over those having unsubstituted or substituted alkylamino groups instead by reason of high thermal resistance and light-fastness. Those having anilino groups containing a substituent at the ortho position thereof for NHX and NHX² prove favorable particularly because these anilino groups enable the relevant dyes to manifest enhanced solubility in resin and solvent, impart increased sharpness to the absorption wavelength, and emit improved color tone. The substitution by OY is effective in enhancing the solubility of the dye in resin or solvent.

I-i-(2)-<1>-b. Phthalocyanine Dyes for Green Color

The favorable phthalocyanine dyes for green color are those of the phthalocyanine compounds (C) represented by the general formula (1) mentioned above which have a tetravalent metal containing a ligand for M. As typical examples of the favorable phthalocyanine dyes for green color, the phthalocyanine compounds (3)–(20) may be cited.

Of the phthalocyanine compounds (C) represented by the general formula (1) mentioned above, those which fulfill the requirement that M is a tetravalent metal possessing a ligand, the number of phenoxy groups attached as substituents to the benzene ring of the phthalocyanine skeleton is three to five, the phenoxy groups each possess a substituent, and preferably the total of atomic radii of the atoms minus hydrogen atoms contained in the substituents at the ortho positions of those of the phenoxy groups which possess a substituent at the ortho position is not less than 3.0 Å are particularly favorable phthalocyanine dyes for green color. The substitution by phenoxy groups is particularly at an advantage in further enhancing the solubility, sharpening the absorption wavelength, and improving the color tone. As typical examples of the particularly favorable phthalocyanine dyes for green color, the phthalocyanine compounds (5) and (8)–(16) may be cited.

Of the phthalocyanine compounds (C) represented by the general formula (1) mentioned above, those which fulfill the requirement that M is a tetravalent metal possessing a ligand, preferably vanadyl (VO), the number of phenoxy groups attached as substituents to the benzene ring of the phthalocyanine skeleton is three to five, preferably four, the phenoxy groups each possess a substituent at (both) the ortho positions, the total of atomic radii of the atoms minus hydrogen atoms contained in the substituents at the ortho positions of those of the phenoxy groups which possess a substituent at the ortho position is not less than 3.0 Å, and the remainders of positions are occupied each by a fluorine atom are most favorable phthalocyanine dyes for green color. The substitution by the phenoxy groups having substituents at both the ortho positions is particularly at an advantage in enhancing the solubility. As typical examples of the most favorable phthalocyanine dyes for green color, the phthalocyanine compounds (8), (9), (11), (12), (13), and (15) may be cited.

I-i-(2)-<2>. Dyes for Red Color

As the dyes for red color which can form the dyes of the primary red color contemplated by this invention, the quinizarine dyes for red color and the anthraquinone dyes for red color which will be shown herein below may be cited. The quinizarine dyes are preferred as dyes for red color over the anthraquinone dyes on account of sharpness of the absorption wavelength.

I-i-(2)-<2>-a. Quinizarine Dyes for Red Color

First, as quinizarine dyes for red color, those of the quinizarine compounds (A) represented by the general formula (2) which have halogen atoms for Z can be used. Of the quinizarine compounds (A) represented by the general formula (2), those which have an unsubstituted or substituted aryl group for X and a halogen atom for Z are favorable quinizarine dyes for red color. As typical examples of the favorable quinizarine dyes for red color, the quinizarine compounds (1)–(31) and (52)–(54) may be cited.

Those of the quinizarine compounds (A) represented by the general formula (2) mentioned above which fulfill the requirement that X is an unsubstituted or substituted aryl group and p is not less than 1 are particularly favorable quinizarine dyes for red color. The introduction of at least one OY (alkoxy group or phenoxy group) is effective in enhancing the solubility in resin or solvent and also effective in improving the thermal resistance. As typical examples of the particularly favorable quinizarine dyes for red color, the quinizarine compounds (8)–(16), (21)–(31), and (53) and (54) may be cited.

Those of the quinizarine compounds (A) represented by the general formula (2) mentioned above which fulfill the requirement that X is an unsubstituted or substituted aryl group and p is not less than 1 are particularly favorable quinizarine dyes for red color. The introduction of at least one OY (alkoxy group or phenoxy group) is effective in enhancing the solubility in resin or solvent and also effective in improving the thermal resistance. As typical examples of the particularly favorable quinizarine dyes for red color, the quinizarine compounds (8)–(16), (21)–(31), and (53) and (54) may be cited.

Those of the quinizarine compounds (A) represented by the general formula (2) mentioned above which fulfill the requirement that p is 1–2, X and Y are each an aryl group having a substituent at the ortho position, and the remainders of Z's are fluorine atoms are most favorable quinizarine dyes for red color. The inclusion of fluorine atoms is at an advantage in enhancing the solubility in resin or solvent and augmenting the lightfastness and the thermal resistance. The dye using unsubstituted or substituted aryl groups is preferred over that using unsubstituted or substituted alkyl groups on account of higher thermal resistance and lightfastness. As typical examples of the most favorable quinizarine dyes for red color, the quinizarine compounds (23), (24), and (27) may be cited.

I-i-(2)-<2>-b. Anthraquinone Dyes for Red Color

As typical examples of the favorable anthraquinone dyes for red color, the anthraquinone compounds (5), (7), and (21) may be cited.

I-i-(2)-<3>. Dyes for Blue Color

As the dyes for blue color which can form the dyes of the primary blue color contemplated by this invention, the quinizarine dyes for blue color and the anthraquinone dyes for blue color which will be shown herein below may be cited. The anthraquinone dyes are preferred over the quinizarine dyes on account of a shallow absorption wavelength. As the dyes for blue color which can form the blue dye composition contemplated by this invention, the phthalocyanine dyes for blue color which will be described herein below may be cited.

I-i-(2)-<3>-a. Anthraquinone Dyes for Blue Color

As the anthraquinone dyes for blue color, those of the anthraquinone compounds (B) represented by the general formula (3) mentioned above which have 2–3 for r can be used. Those of the anthraquinone compounds (B) represented by the general formula (3) mentioned above which fulfill the requirement that r is 2–3, at least one of the NHT's is attached as a substituent to the 2 or 3 position of the anthraquinone skeleton, and T is an aryl group possessing a substituent of the quality of a donor are favorable anthraquinone dyes for blue color. The fact that the substituents have the quality of a donor and the number of anilino groups or amino groups which are present is at least two is adequate for the wavelength range of a blue dye. As typical examples of the anthraquinone dyes for blue color, the anthraquinone compounds (18)–(20) and (25) may be cited.

Of the anthraquinone compounds (B) represented by the general formula (3) mentioned above, those which fulfill the requirement that at least one of the NHT's is attached as a substituent to the 2 or 3 position of the anthraquinone skeleton, T is an aryl group, preferably the aryl group possesses a substituent at the ortho position thereof, at least one of the substituents at the ortho position is a substituent of the quality of a donor, and V is a halogen atom, a substituted alkoxy group, or a substituted phenoxy group are particularly favorable anthraquinone dyes for blue color. When T is an unsubstituted or substituted aryl group, the toner proves favorable on account of higher thermal resistance and lightfastness than when T is an unsubstituted or substituted alkyl group. The fact that T is an aryl group having a substituent at the ortho position thereof is considered particularly favorable because this aryl group enables the relevant dye to enjoy enhanced solubility in resin or solvent, sharpened absorption wavelength, and an improved color tone. As typical examples of the particularly favorable anthraquinone dye for blue color, the anthraquinone compounds (19), (20), and (25) may be cited.

Of the anthraquinone compounds (B) represented by the general formula (3) mentioned above, those which fulfill the requirement that at least one of the NHT's is attached as a substituent to the 2 or 3 position of the anthraquinone skeleton, T is an aryl group, the aryl group possesses a substituent at the ortho position thereof, at least one of the substituents at the ortho position is a substituent of the quality of a donor, and V's at the remainders of positions are each a fluorine atom and/or OU, preferably a fluorine atom are the most favorable anthraquinone dyes for blue color. As typical examples of the most favorable anthraquinone dyes for blue color, the anthraquinone compounds (19) and (20) may be cited.

Of the anthraquinone compounds (B) represented by the general formula (3) mentioned above, those which fulfill the requirement that two of the NHT's are attached as substituents to the 1 or 4 position of the anthraquinone skeleton, T is an unsubstituted or substituted alkyl group or cycloalkyl group, and V's at the remainders of positions are fluorine atoms and/or OU are other most favorable anthraquinone dyes for blue color. As typical examples of the most favorable anthraquinone dyes for blue color, the anthraquinone compounds of (46)–(50) may be cited.

I-i-(2)-<3>-b. Quinizarine Dyes for Blue Color

Those of the quinizarine compounds (A) represented by the general formula (3) mentioned above which fulfill the requirement that at least one of Z's is $NHX^2$ and this $NHX^2$ is attached to the 6 or 7 position of the quinizarine skeleton are favorable quinizarine dyes for blue color. As typical examples of the favorable phthalocyanine dyes for blue color, the quinizarine compounds (42) and (43) may be cited.

I-i-(2)-<3>-c. Phthalocyanine Dyes for Blue Color

Of the phthalocyanine compounds (C) represented by the general formula (1) mentioned above, those which fulfill the requirement that M is a divalent metal and preferably fluorine atoms occupy the remainders of positions are favorable phthalocyanine dyes for blue color. As typical examples of the favorable phthalocyanine dyes for blue color, the phthalocyanine compounds (21)–(34) may be cited.

Of the phthalocyanine compounds (C) represented by the general formula (1) mentioned above, those which fulfill the requirement that M is a divalent metal, phenoxy groups possessing a substituent preferably at the ortho position thereof are attached as substituents to the benzene ring of the phthalocyanine skeleton, and the total of atomic radii of the atoms minus hydrogen atoms contained in the substituents at the ortho positions of those of the phenoxy groups which possess a substituent at the ortho position is not less than 3.0 Å are particularly favorable phthalocyanine dyes for blue color. The substitution by the phenoxy groups is particularly at an advantage in enhancing the solubility, sharpening the absorption wavelength, and improving the color tones. As typical examples of the particularly favorable phthalocyanine dyes for blue color, the phthalocyanine compounds (24) and (26)–(33) may be cited.

Those of the phthalocyanine compounds (C) represented by the general formula (1) mentioned above which fulfill the requirement that M is a divalent metal, preferably Zn, Cr, or Co, the number of phenoxy groups attached as substituents to the benzene ring of the phthalocyanine skeleton is three to five, preferably four, the phenoxy groups possess substituents at (both) the ortho positions thereof, and the remainders of positions of the benzene ring are occupied by fluorine atoms are the most favorable phthalocyanine dyes for blue color. The substitution by the phenoxy groups possessing substituents at the ortho positions (particularly both of the ortho positions) enables the relevant dye to enjoy enhance solubility, sharpened absorption wavelength, and an improved color tone. Further, the attachment of fluorine atoms as substituents to all the remainders of positions of the benzene ring is at an advantage in enhancing the solubility. As typical examples of the most favorable phthalocyanine dyes for blue color, the phthalocyanine compounds (26), (27) (29), and (30) may be cited.

I-i-(2)-<4>. Dyes for Toning Yellow Color

As the dyes for toning yellow color which can form the dyes of the primary colors (green color and red color) according to this invention, the following anthraquinone dyes for yellow color may be cited.

As the anthraquinone dyes for yellow color, those of the anthraquinone compounds (B) represented by the general formula (3) mentioned above which fulfill the requirement that r is 1 and NHT is attached to the 2 or 3 position of the anthraquinone skeleton can be used. Of the anthraquinone compounds (B) represented by the general formula (3) mentioned above, those which fulfill the requirement that r is 1, NHT is attached to the 2 or 3 position of the anthraquinone skeleton, and T is an aryl group possessing a substituent of the quality of an acceptor or an unsubstituted or substituted aklyl group are favorable anthraquinone dyes for yellow color. The fact that NHX is attached to the 2 or 3 position and T is an aryl group possessing a substituent of the quality of an acceptor or an unsubstituted or substituted alkyl group is adequate for the wavelength range of a yellow dye. As typical examples of the anthraquinone dye for yellow color, the anthraquinone compounds (2)–(4), (8)–(17), (22), (24), and (26) may be cited.

Of the anthraquinone compounds (B) represented by the general formula (3) mentioned above, those which fulfill the requirement that r is 1, NHT is attached to the 2 or 3 position of the anthraquinone skeleton, T is an unsubstituted or substituted aryl group, preferably an aryl group possessing at least on substituent of the quality of an acceptor, and at least one of V's is OU are particularly favorable anthraquinone dyes for yellow color. When T is an unsubstituted or substituted aryl group, the toner proves favorable on account of higher thermal resistance and lightfastness than when T is an unsubstituted or substituted alkyl group. As typical examples of the particularly favorable anthraquinone dyes for yellow color, the anthraquinone compounds (11)–(17), (22), and (24) may be cited.

Those of the anthraquinone compounds (B) represented by the general formula (3) mentioned above which fulfill the requirement that r is 1, NHT is attached to the 2 or 3 position of the anthraquinone skeleton, T is an aryl group possessing substituents attached to the ortho positions, preferably at least one of the substituents at the ortho positions is a substituent of the quality of an acceptor, at least one of V's is OU (wherein U is preferred to be an unsubstituted or substituted alkyl group), and V's at the remainders of positions are fluorine atoms are the most favorable anthraquinone dyes for yellow color. As typical examples of the most favorable anthraquinone dyes for yellow color, the anthraquinone compounds (11)–(13) may be cited.

I-1-(3). Dyes for Primary Colors (RGB)

No particular limit is imposed on the production of an arbitrary dye by the use of proper members selected from the class consisting of (A)–(C) groups, namely the (C) group (limited by the requirement that the unsubstituted or substituted alkoxy groups and/or unsubstituted or substituted phenoxy groups are attached as substituents to one–eight of the 2, 3, 6, 7, 10, 11, 14, and 15 positions in the general formula (1) mentioned above) alone, the combination of (A)+(B) groups, the combination of (A)+(C) groups, the combination of (B)+(C) groups, and the combination of (A)+(B)+(C) groups. Dyes of excellent primary colors (red color, green color, and blue color) can be prepared by properly selecting phthalocyanine dyes for green color or phthalocyanine dyes for blue color of the (C) group from among the dyes for red color, dyes for green color, anthraquinone dyes for blue color, phthalocyanine dyes for blue color, and dyes for toning yellow color or suitably combining the dyes of the varying combinations of two or more groups, i.e. the combination of (A)+(B) groups, the combination of (A)+(C) groups, the combination of (B)+(C) groups, and the combination of (A)+(B)+(C), and compounding them. For example, a dye of red color can be manufactured by using the quinizarine dye for red color mentioned above in combination with a toning anthraquinone dye for yellow, a dye for green color by using the phthalocyanine dye for green color mentioned above or the quinizarine dye for green color or the phthalocyanine dye for green color mentioned above in combination with a toning anthraquinone dye for yellow color, and a dye of blue color by using the phthalocyanine dye for blue color mentioned above or the anthraquinone dye for blue color or the quinizarine dye for blue color in combination with a phthalocyanine dye for blue color. Particularly, as regards the compounds and the combinations thereof which excel in solubility, transmittance, lightfastness, and thermal resistance, i.e. the properties inherent in a color filter grade photosensitive resin coloring composition containing relevant dyes and a color filter using the composition, appropriate dyes can be formed with compounds of the (C) group alone or with compounds of combinations of the (A)–(C) groups, which are esteemed highly among the various compounds mentioned above. Since the relevant compounds (dyes) have been already described individually in detail above and the combinations thereof are self-explanatory, the combinations of such compounds for the formation of dyes of primary colors of RGB will be shown below and a few working examples thereof will be cited below.

I-i-(3)-<1>. Dyes of Red Color

A quinizarine dye for red color can be obtained by combining a quinizarine compound (A) having a halogen atom for Z in the general formula (2) mentioned above and an anthraquinone compound (B) having NHX attached to the 2 or 3 position of the anthraquinone skeleton and having 1 for p in the general formula (3) mentioned above.

A dye of red color which proves favorable can be obtained by combining a quinizarine compound (A) having 1 or over for p, aryl groups possessing a substituent at the ortho position thereof for X and Y, and halogen atoms attached to all the remainders of positions in the general formula (2) mentioned above as a quinizarine dye of red color with an anthraquinone compound (B) having 1 for r, NHT attached to the 2 or 3 position of the anthraquinone skeleton, an aryl group possessing a substituent at the ortho position thereof for T, OU (an alkyl group preferred to have U in a substituted form) for at least one of V's, and halogen atoms for V's at the remainders of positions in the general formula (3) mentioned above as a toning anthraquinone dye for yellow color.

A particularly favorable dye of red color can be obtained by combining a quinizarine compound (A) having 1–2 for p, aryl groups having a substituent at the ortho position thereof for X and Y, and fluorine atoms for all the Z's attached to the remainders of positions in the general formula (2) mentioned above as a quinizarine dye for red color with an anthraquinone compound (B) having 1 for r, NHT attached to the 2 or 3 position of the anthraquinone skeleton, OU's for one or two of T's, aryl groups (at least one of which is preferred to be a substituent of the quality of an acceptor) possessing a substituent at the ortho position thereof for T and U, and fluorine atoms for all the V's at the remainders of positions in the general formula (3) mentioned above as a toning anthraquinone dye for yellow color.

As typical examples of the combination proper for a dye of red color, the combination of the quinizarine compound (23) with the anthraquinone compound (17) which is represented by the following formula

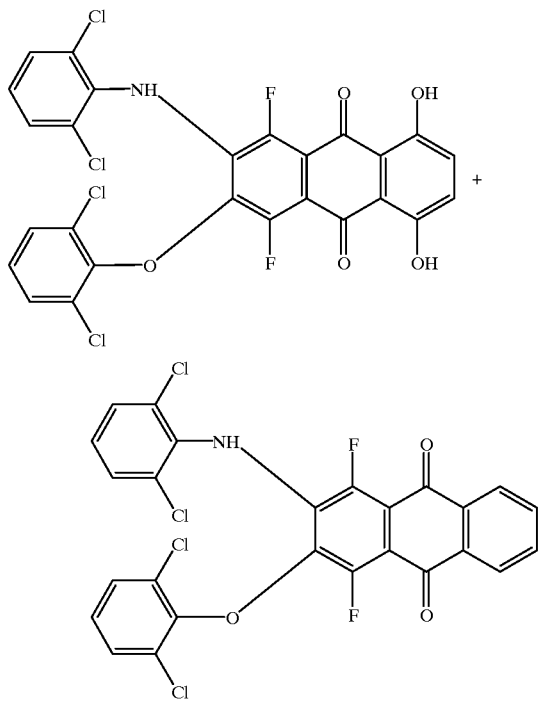

and the combination of the quinizarine compound (27) with the anthraquinone compound (1) which is represented by the following formula

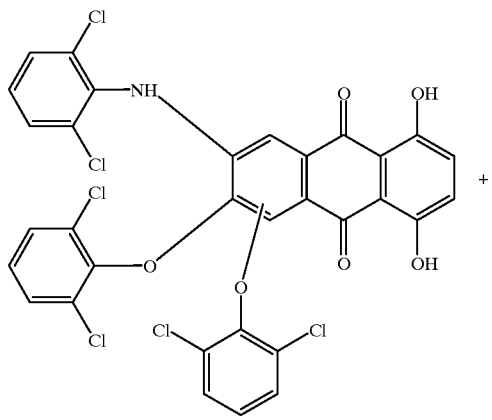

-continued

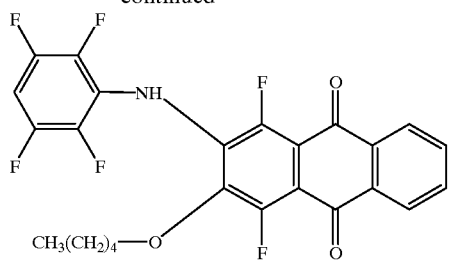

may be cited.

I-i-(3)-<2>. Dyes of Green Color

A dye of green color can be obtained by combining an anthraquinone compound (B) having 1 for r and NHT attached to the 2 or 3 position of the anthraquinone skeleton in the general formula (3) as a toning anthraquinone dye for yellow color with a phthalocyanine compound (C) having a tetravalent metal containing a ligand for M in the general formula (1) as a phthalocyanine dye for green color.

A dye of green color which proves favorable can be obtained by combining an anthraquinone compound (B) having 1 for 5, NHT attached to the 2 or 3 position of the anthraquinone skeleton, an aryl group possessing a substituent at the ortho position thereof or an unsubstituted or substituted phenoxy group for T, an unsubstituted or substituted alkoxy group for at least one of V's, and fluorine atoms for V's at the remainders of positions in the general formula (3) as a toning anthraquinone dye for yellow color with a phthalocyanine compound (C) having a tetravalent metal possessing a ligand for M, three to five phenoxy groups attached as substituents to the benzene ring of the phthalocyanine skeleton, and not less than 3.0 Å for the total of atomic radii of the atoms minus hydrogen atoms contained in the substituents at the ortho positions of those of the phenoxy groups which possess a substituent at the ortho position in the general formula (1) as a phthalocyanine dye for green color.

A particularly favorable dye of green color can be obtained by combining an anthraquinone compound (B) having 1 for r, NHT attached to the 2 or 3 position of the anthraquinone skeleton, OU for at least one of V's, aryl groups (at least one of which is preferred to be a substituent of the quality of an acceptor) possessing a substituent at the ortho position thereof for T and U, and fluorine atoms for all the V's at the remainders of positions in the general formula (3) mentioned above as a toning anthraquinone dye for yellow color with a phthalocyanine compound (C) having a vanadyl (VO) for M, 3 to 5 phenoxy groups attached as substituents to the benzene ring of the phthalocyanine skeleton, and fluorine atoms attached to all the remainders of positions in the general formula (1) and also having phenoxy groups possessed of G's at both the ortho positions thereof in the general formula (13) as a phthalocyanine dye for green color.

A dye of green color can be otherwise obtained by combining a quinizarine compound (A) having $NHX^2$ for at least one of Z's in the general formula (2) as a quinizarine dye for green color with an anthraquinone compound (B) having 1 for r and NHT attached to the 2 or 3 position of the anthraquinone skeleton in the general formula (3).

A particularly favorable toner of green color can be obtained by combining a quinizarine compound having $NHX^2$ for at least one of Z's and Aryl groups possessing a substituent at the ortho position thereof for X and $X^2$ in the general formula (2) as a quinizarine dye for green color with an anthraquinone compound (B) having 1 for 5, NHT attached to the 2 or 3 position of the anthraquinone skeleton, an aryl group possessing a substituent at the ortho position thereof for T, an unsubstituted or substituted alkoxy group or an unsubstituted or substituted phenoxy group for at least one of V's, and fluorine atoms for V's at the remainders of positions in the general formula (3) as a toning anthraquinone dye for yellow color.

As typical examples of the combination proper for a dye of green color, the combination of the phthalocyanine compound (22) with the anthraquinone compound (14) which is represented by the following formula

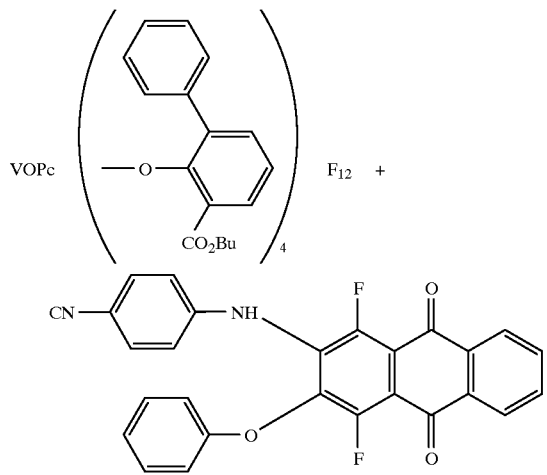

and the combination of the phthalocyanine compound (27) with the anthraquinone compound (24) which is represented by the following formula

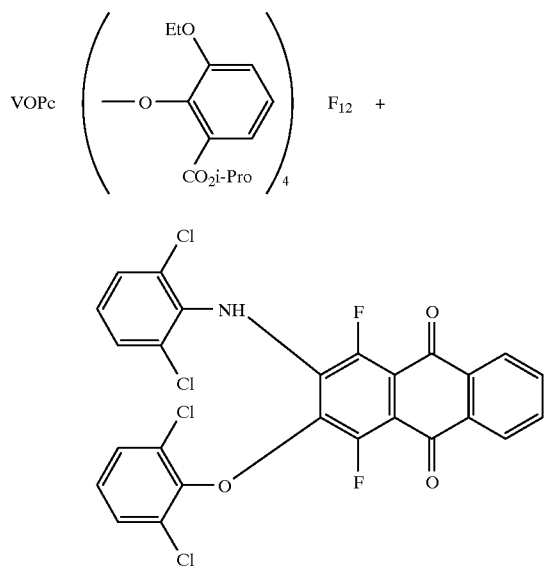

may be cited.

I-i-(3)-<3>. Dyes of Blue Color

A toner of blue color can be obtained by combining an anthraquinone compound (B) having 2–3 for r in the general formula (3) as an anthraquinone dye for blue color with a phthalocyanine compound (C) having a divalent metal for M in the general formula (1) as a phthalocyanine dye for blue color.

A favorable dye of blue color can be obtained by combining an anthraquinone compound (B) having at least one of NHT's attached as a substituent to the 2 or 3 position of the anthraquinone skeleton, an aryl group possessing a substituent at the ortho position thereof for T, and fluorine atoms attached to the remainders of positions in the general formula (3) as an anthraquinone dye for blue color with a phthalocyanine compound (C) having a divalent metal for M, three to five phenoxy groups attached as substituents to the benzene ring of the phthalocyanine skeleton, and fluorine atoms attached to the remainders of positions in the general formula (1) as a phthalocyanine dye for blue color.

A particularly favorable dye of blue color can be obtained by combining an anthraquinone compound (B) having two of NHT's attached as substituents to the 1 and 4 positions of the anthraquinone skeleton, an unsubstituted or substituted alkyl group or cycloalkyl group for T, and fluorine atoms and/or OU's for V's attached as substituents to the remainders of positions in the general formula (3) as an anthraquinone dye for blue color with a phthalocyanine compound (C) having a divalent metal for M and fluorine atoms attached to the remainders of positions in the general formula (1) as a phthalocyanine dye for blue color.

A dye of blue color can be otherwise obtained by combining a quinizarine compound (A) having $NHX^2$ for at least one of Z's and the $NHX^2$ attached to the 6 or 7 position of the quinizarine skeleton in the general formula (2) as a quinizarine dye for blue color with a phthalocyanine compound (C) having a divalent metal for M in the general formula (1) as a phthalocyanine dye for blue color.

As a typical example of the combination proper for a dye of blue color, the combination of the anthraquinone compound (20) with the phthalocyanine compound (17) which is represented by the following formula

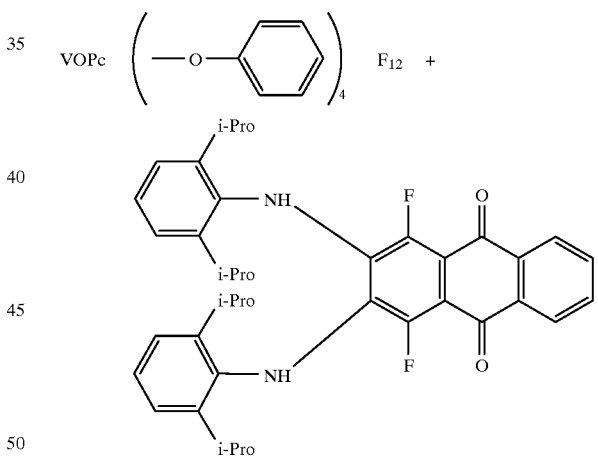

may be cited.

I-i-(4). Properties of Dyes

The dyes of the primary colors (red color, green color, and blue color) described above can eliminate the problems attendant heretofore on physical properties because they excel in solubility in resin, thermal resistance, lightfastness, and chemical-resistance and, at the same time, can offer quality color filters by making the most of the advantages of high contrast and prominent spectral property. Since the dyes of primary colors (red color, green color, and blue color) of this invention excel in solubility in resin, thermal resistance, lightfastness, and chemical-resistance, they manifest solubility of not less than 2% by weight in toluene and preferably manifest solubility of not less than 2% by weight in toluene and not less than 4% by weight in diethylene glycol dimethyl ether solvent. When an organic solvent is used in a color filter grade photosensitive resin coloring composition, the dyes manifest solubility of not less than 2% by weight, preferably not less than 4% by weight, in an organic solvent (hereinafter referred to as "solvent to be used") to be used for a resin which has a solubility parameter ($\delta$) in the range of 8–13 $(cal/cm^3)^{1/2}$, preferably in the range of 8–11 $(cal/c,m^3)^{1/2}$. Since the resin particularly acrylic resin having a number average molecular weight in the range of 30,000–200,000 fit for this invention, has a solubility parameter in the range of 8–13 $(cal/cm^3)^{1/2}$, mostly in the range of 8–11 $(cal/cm^3)^{1/2}$, the dye of this invention which manifests solubility of not less than 2% by weight in a dye solubility rating a solvent (toluene) possessing a solubility parameter approximately closely to the resin or in the solvent to be used affords fully satisfactory compatibility with the resin. A dye solubility rating solvent having a solubility parameter outside the range of 8–13 $(cal/cm^3)^{1/2}$ cannot serve as an index for rating the solubility of a given dye in the solution of resin because the solubility parameter thereof departs from that of the resin. The resin to be used having a solubility parameter outside the range of 8–13 $(cal/cm^3)^{1/2}$ is unfit because the dye manifests no fully satisfactory solubility in the resin which contains the solvent to be used. When a dye which manifests solubility of less than 2% by weight in toluene or a solvent to be used having a solubility parameter in the range of 8–13 $(cal/cm^3)^{1/2}$ is tried, it has no fully satisfactory compatibility with the resin of this invention and insoluble particles of the dye are suffered to disperse within the relevant color filter grade photosensitive resin coloring composition. A color filter manufactured from this coloring composition, therefore, produces a prominent action of disturbing the phenomenon of polarization and poses the problem of degrading transparency and impairing contrast. If the resin to be used happens to have a high molecular weight, the degradation of transparency and the impairment of contrast will be conspicuously aggravated because the resin has high viscosity and renders difficult uniform dispersion of the particles of dye.

Further, since the dye of this invention possesses high solubility and consequently manifests high compatibility with the resin, it permits effective use of resin of a high molecular weight, specifically acrylic resin having a number average molecular weight of about 30,000–200,000, as compared with the resin which is effectively used in the conventional pigment method. For the color filter grade resin coloring composition which is used in the production of the color filter by a procedure of the type relying on the conventional pigment dispersion method to disperse a pigment in acrylic resin, the upper limit of the number average molecular weight of the resin allowed to be used in consideration of the dispersibility of the pigment is in the approximate range of 10,000 to 20,000. The color filter manufactured from the resin as a base polymer, therefore, is deficient in thermal resistance, resistance to solvent, and curability through the agency of light or heat. It is, therefore, necessary to increase the amount of a cross-linking agent relative to the amount of the resin or to adopt a special cross-linking agent. In contrast, the color filter grade photosensitive resin coloring composition of this invention allows use of a dye compatible with resin of high molecular weight and, therefore, permits a color filter excellent in thermal resistance and resistance to solvents to be manufactured without requiring an increase in the amount of a cross-linking agent or necessitating use of a special cross-linking agent.

The solvents to be used which have solubility parameters in the range of 8–13 $(cal/cm^3)^{1/2}$ include toluene (8.91), xylene (8.80), benzene (9.15) ethyl benzene (8.80), Tetralin (9.50), styrene (9.30), cyclohexane (8.18), dichloromethane (9.93), chloroform (9.21), ethyl chloride (9.76), 1,1,1-trichloroethane (8.57), 1-chlorobutane (8.46), cyclohexyl chloride (8.99), trans-dichloroethylene (9.20), cyclohexanol (10.95), methyl cellosolve (12.06), n-propanol (11.97), n-butanol (11.30), 2-ethyl butanol (10.38), n-heptanol (10.61), 2-ethylhexanol (9.85), butoxy ethanol (10.25), diacetone alcohol (10.18), benzaldehyde (10.40), $\gamma$-butyrolactone (12.78), acetone (9.77), methylethyl ketone (9.27), dibutyl ketone (8.17), methyl-1-butyl ketone (8.57), methyl-1-amyl ketone (8.55), cyclohexane (9.88), acetophenone (9.68), methylal (8.52), furan (9.09), $\beta$-$\beta$-dichloroethyl ether (10.33), dioxane (10,00), tetrahydrofuran (9.52), ethyl acetate (9.10), n-butyl acetate (8.46), amyl acetate (8.32), butyl n-acetate (8.04), cyclohexyl amine (9.05), ethanol amine (15.48), dimethyl formamide (12.14), acetonitrile (11.90), nitromethane (12.30), nitroethane (11.09), 2-nitropropane (10.02), nitrobenzene (10.42), dimethyl sulfoxide (12.93), diethylene glycol dimethyl ether (9.40), diethylene glycol monomethyl ether (8.50), propylene ethylene glycol monomethyl ether acetate (9.30), ethylene glycol monomethyl ether acetate (9.60), and cyclohexanone (9.90), for example. The numerals in the parentheses indicate the numerical values of solubility parameters. These solvents to be used may be used in the form of mixtures of two or more members on the condition that the relevant solubility parameters fall in the range of 8–13 $(cal/cm^3)^{1/2}$. Preferably the solubility parameter is in the range of 9–11 $(cal/cm^3)^{1/2}$. The solvents answering this description include diethylene glycol dimethyl ether, propylene ethylene glycol monomethyl ether acetate, and cyclohexanone, for example.

I-ii. Resins

The resin to be contained in the color filter grade photosensitive resin coloring composition of this invention is only required to comprise a resin possessing photosensitivity and a compound possessing photosensitivity (hereinafter referred to simply as "photosensitive resin"). All the known photosensitive resins are available herein. The photosensitive resin has only to be capable of inducing a chemical reaction in response to the action of light and consequently causing a change in the solubility in or the affinity for solvent and undergoing conversion from a liquid to a solid state. As typical examples of the photosensitive resin, <1> photodecomposing photosensitive resins such as aromatic diazonium salt resins, o-quinone diazide resins, bisazide resins, and polysilane, <2> photodimerizing photosensitive resins such as cinnamic acid resins or photodimerizing acrylic resins, and <3> (i) prepolymers such as unsaturated polyesters, epoxy acrylic esters, and urethane acrylic esters or binder resins (base polymers) such as polyvinyl alcohols, polyamides, and polymethacrylic esters, (ii) photosensitive monomers (photopolymerizing monomers) such as various acrylic esters or methacrylic esters, and (iii) photopolymerizing photosensitive resins manufactured by the addition of a photopolymerization initiator may be cited. Among other photosensitive resins enumerated above, photopolymerizing photo-sensitive resins prove particularly favorable. Especially, the photopolymerizing photosensitive resins manufactured by using acrylic resins as binder resins (base polymers) are advantageous. The use of the acrylic resin enables the dye to manifest enhanced solubility in the resin and, as a result, allows production of a color filter grade photosensitive resin coloring composition containing the dye as the material for forming the colored layer at a high concentration, and permits the colored layer of a varying color to be formed with high transparency. The use of the acrylic resin, therefore, brings about a more favorable effect on the lightfastness of the colored layer and the control of the absorption wavelength.

The resin generally embraces a resin solution which is obtained by dissolving the resin in a solvent to a proper level of viscosity and a resin solution which is allowed to assume a liquid state without addition of a solvent. The resin of this invention does not always require use of a solvent. Even when the resin happens to be a solventless type, it possibly avoids the use of a solvent so long as it assumes a liquid state, permits uniform solution of the dye mentioned above, and acquires viscosity appropriate for a color filter grade photosensitive resin coloring composition. In this case, a dye usable for the coloring composition can be selected by predetermining the solubility of the dye by the use of toluene alone or in combination with diethylene glycol dimethyl ether. The solubility of the dye is determined by preparing a saturated solution of the dye at room temperature (about 20° C.), filtering the solution with a filter having a pore diameter of 0.2 μm, and then measuring the concentration of the solution.

Now, the most favorable resin of this invention, i.e. the photopolymerizing photosensitive resin manufactured by using acrylic resin as a binder resin (base polymer) will be described specifically below by way of example.

First, the acrylic resin as a binder resin (base polymer) capable of forming a component for the composition of the photopolymerizing photosensitive resin is such that not less than 10% by weight of the monomer or oligomer forming the resin is at least one member selected from among acrylic acid, methacrylic acid, acrylic esters, and methacrylic esters and the monomer or oligomer contains 1–50% by weight, preferably 5–35% by weight, of acrylic acid or methacrylic acid and 10–90% by weight, preferably 30–80% by weight, of acrylic ester or methacrylic ester.

The monomers or oligomers which form the acrylic resin include acrylic acid, methacrylic acid, methyl acrylate, methyl methacrylate, propyl acrylate, propyl methacrylate, butyl acrylate, butyl methacrylate, 2-ethylhexyl acrylate, 2-ethylhexyl methacrylate, octyl acrylate, octyl methacrylate, benzyl acrylate, benzyl methacrylate, 2-hydroxyethyl acrylate, 2-hydroxy-ethyl methacrylate., 2-hydroxypropyl acrylate, 2-hydroxy-propyl methacrylate, 2-hydroxypropyl methacrylate, acryl amide, methacryl amide, N-hydroxymethyl acryl amide, acrylonitrile, styrene, vinyl acetate, maleic acid, fumaric acid, polyethylene glycol diacrylate, trimethylol propane triacrylate, trimethylol propane trimethacrylate, pentaerythritol triacrylate, dipentaerythritol hexacrylate, hexacrylate of the caprolactone adduct of dipentaerythritol hexacrylate, melamine acrylate, and epoxy acrylate prepolymer, for example. As typical examples of the acrylic resin which proves favorable, acrylic resins obtained by polymerizing (meth) acrylic acid, hydroxyalkyl (meth) acrylate, and various alkyl (meth) acrylates, acrylic resins obtained by polymerizing (meth) acrylic acid, hydroxyalkyl (meth)acrylates, various alkyl (meth)acrylates, benzyl (meth)acrylates, and styrene, and acrylic resins obtained by polymerizing (meth)-acrylic acid and various alkyl (meth)acrylates may be cited.

Among other acrylic resins mentioned above, acrylic resins comprising (meth)acrylic acid, hydroxyalkyl (meth) acrylates, various alkyl (meth)acrylates, and styrene, and acrylic resins comprising (meth)acrylic acid ad various alkyl (meth)acrylates prove favorable particularly.

As typical example of the favorable acrylic resin, the resins (1)–(3) shown in Table 8 below may be cited.

TABLE 8

| Kind of resin | Composition of monomer | Composition ratio of monomer (mol %) | Weight average molecular weight of resin |
|---|---|---|---|
| Resin (1) | Styrene | 5 | 1~100,000 |
| | 2-Hydroxyethyl methacrylate | 22 | |

TABLE 8-continued

| Kind of resin | Composition of monomer | Composition ratio of monomer (mol %) | Weight average molecular weight of resin |
|---|---|---|---|
| | Ethyl methacrylate | 54 | |
| | Methacrylic acid | 19 | |
| Resin (2) | Styrene | 62 | 1~100,000 |
| | Diethylene glycol monoethylether acrylate | 32 | |
| | Acrylic acid | 6 | |
| Resin (3) | Benzyl methacrylate | 70 | 1~100,000 |
| | Methacrylic acid | 30 | |

Now typical example of the production of these acrylic resins will be shown below. In the following examples of production, the term "parts" refers to "parts by weight" unless otherwise specified.

Example of production of resin (1)

In a four-necked flask having an inner volume of 1 liter, 175.0 parts of diethylene glycol dimethyl ether, 8.8 parts of styrene, 43.8 parts of 2-hydroxyethyl methacrylate, 26.3 parts of methacrylic acid, and 96.3 parts of ethyl methacrylate are kept heated at 90° C. and a solution prepared in advance by mixing 145.0 parts of diethylene glycol dimethyl ether, 8.8 parts of styrene, 43.8 parts of 2-hydroxyethyl methacrylate, 26.3 parts of methacrylic acid, 96.3 parts of ethyl methacrylate, and 2.92 parts of Niper BMT (produced by Nippon Oils & Fats Co. Ltd.) is added dropwise thereto over a period of three hours and they are left reacting at 90° C. for three hours. A solution of 1.75 parts of Niper BMT in 10 parts of diethylene glycol dimethyl ether is further added thereto and the reaction is continued for one hour to obtain a solution of resin (1) in diethylene glycol dimethyl ether.

Example of production of resin (2)

In a four-necked flask having an inner volume of 1 liter, 175.0 parts of acetic acid cellosolve, 113.8 parts of styrene, 19.6 parts of diethylene glycol monoethyl ether acrylate, and 41.3 parts of acrylic acid are heated to 90° C. and a solution prepared in advance by mixing 175.0 parts of acetic acid cellosolve, 113.8 parts of styrene, 19.6 parts of diethylene glycol monoethyl ether acrylate, 41.3 parts of acrylic acid, and 2.92 parts of Niper BMT (produced by Nippon Oils & Fats Co., Ltd.) is added dropwise thereto over a period of three hours and they are left reacting at 90° C. for three hours. A solution of 1.75 parts of Niper BMT in 10 parts of diethylene glycol dimethyl ether is further added thereto and the reaction is continued for one hour to obtain a solution of resin (2) in acetic acid cellosolve.

Example of production of resin (3)

In a four-necked flask having an inner volume of 1 liter, 175.0 parts of acetic acid cellosolve, 144.7 parts of benzyl methacrylate, and 30.3 parts of methacrylic acid are heated to 90° C. and a solution prepared in advance by mixing 175.0 parts of acetic acid cellosolve, 144.7 parts of benzyl methacrylate, 30.3 parts of methacrylic acid, and 2.92 parts of Niper BMT (produced by Nippon Oils & Fats Co., Ltd.) is added dropwise thereto over a period of three hours and they are left reacting at 90° C. for three hours. A solution of 1.75 parts of Niper BMT in 10 parts of diethylene glycol dimethyl ether is further added thereto and the reaction is continued for one hour to obtain a solution of resin (3) in acetic acid cellosolve.

The acrylic resin for use in this invention is allowed to have a higher molecular weight than conventionally accepted because the dye manifests high solubility in the resin. Specifically, it is advantageous to use acrylic resin having a number average molecular weight in the range of 30,000–200,000, preferably in the range of 40,000–100,000. In the color filter of the type manufactured by dispersing the pigment used for the conventional pigment dispersion method in acrylic resin having a large number average molecular weight and manifesting high viscosity, the upper limit of the number average molecular weight which the resin is allowed to have in view of the dispersibility of the pigment is about 10,000–20,000. This color filter, therefore, is deficient in thermal resistance and resistance to solvent and consequently poses the problem of increasing the amount of a cross-linking agent relative to the amount of the resin and adopting a special cross-linking agent. In contrast, this invention uses the dye of high solubility as described above and, therefore, enables the resin to manifest thorough compatibility with the resin of high viscosity without requiring use of a special cross-linking agent. Further, owing to the use of the acrylic resin of such high molecular weight as mentioned above, the dye of high solubility can be precluded from causing migration (transfer) of colors while the colored layers of red color, blue color, and green color (RGB) are sequentially superposed (spin coating) in the color filter. The formation of the color filter obviates the necessity for inserting protective films, allows a decrease in the number of steps of process as compared with the conventional dye dispersion method, and implements simplification of the process. Thus, the color filter excelling in thermal resistance and resistance to solvent can be produced. If the number average molecular weight is less than 30,000, the color filter grade photosensitive resin coloring composition to be finally produced will suffer the soluble dye, during the sequential superposition of the colored layers of red color, blue color, and green color (RGB) in the color filter, to induce migration (transfer) of color and consequently necessitate insertion of protective films and will also require as large an addition to the number of steps of process as the dye method using the conventional dye and consequently bring about the disadvantage of preventing accomplishment of the simplification of process, the second object of this invention. If the number average molecular weight exceeds 200,000, the acrylic resin having such a high molecular weight at all will not be easily obtained and will lack practical utility because of unduly high viscosity. Though the weight average molecular weight of the acrylic resin is not particularly limited, it is generally preferred to exceed 30,000 and fall in the range of 50,000–1, 000,000, more properly in the range of 70,000–300,000. The weight average molecular weight of a gel which is defined as infinite is unfit for the acrylic resin contemplated by this invention. The acrylic resin allows the dye to be contained therein at a high concentration as compared with the other resin such as polyimide because of the high solubility manifested by the dye to the resin. As a result, it is capable of forming colored layers of high transparency and clear tint and producing a fine effect on the lightfastness of the colored layers and the control of absorption wavelength.

The photosensitive monomers which can form a component for the photopolymerizable photosensitive resin mentioned above include various acrylic ester or methacrylic ester monomers which form the acrylic resin mentioned above, for example. As typical examples of such photosensitive monomer, trimethylol propane trimethacrylate, pentaerythritol triacryalte, pentaerythritol tetracrylate, and other polyfunctional (meth)acrylates may be cited.

The amount of the photosensitive monomer to be used is in the range of 30–100 parts by weight, preferably 55–75 parts by weight, based on 100 parts by weight of the binder resin (acrylic resin) mentioned above.

As the photopolymerization initiators which can form a component for the composition of the photopolymerizable photosensitive resin mentioned above, benzoyl alkyl ether type compounds, acetophenone compounds, benzophenone compounds, phenyl ketone compounds, thioxanthone compounds, triazine compounds, imidazole compounds, and anthraquinone compounds may be cited. More specifically, these photopolymerization initiators include acetophenone compounds such as 4-phenoxy dichloroacetophenone, 4-t-butyl-dichloroacetophenone, diethoxy acetophenone, 1-(4-isopropyl-phenyl)-2-hydroxy-2-methyl propan-1-on, 1-hydroxy cyclohexyl phenyl ketone, and 2-benzyl-1-dimethylamino-1-(4-morpholino-phenyl)-butan-1-on, benzophenone compounds such as benzophenone, benzoyl benzoic acid, methyl benzoyl benzoate, 4-phenyl benzophenone, hydroxybenzophenone, acrylated benzophenone, and 4-benzoyl-4'-methyldiphenyl sulfide, thioxanthone compounds such as thioxanthone, 2-chlorothioxanthone, 2-methyl thioxanthone, isopropyl thioxanthone, and 2–4-diisopropyl thioxanthone, triazine compounds such as 2,4,6-trichloro-3-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis (trichloromethyl)-s-triazine, 2-piperonyl-4,6-bis-(trichloromethyl)-s-triazine, 2,4-bis(tichloromethyl)-6-styryl-s-triazine, 2-(naphtho-1-yl)-4,6-bis(trichloromethyl)-s-triazine, 2-(4-methoxy-naphtho-1-yl)-4,6-bis (trichloromethyl)-s-triazine, 2,4-trichloromethyl-(piperonyl)-6-triazine, and 2,4-trichloromethyl (4'-methoxystyryl)-6-triazine, imidazole compounds such as 2-(2,3-dichlorophenyl)-4,5-diphenyl imidazole dimer, 2-(2, 3-dichlorophenyl)-4,5-bis(3-methoxyphenyl)-imidazole dimer, 2-2,3-dichlorophenyl)-4,5-bis(4-methoxyphenyl)-imidazole dimer, 1-(2,3-dichlorophenyl)-4,5-bis(4-chlorophenyl)-imidazole dimer, 2-(2,3-dichlorophenyl)-4,5-di(2-furyl)-imidazole, and 2,2'-bis(2-chlorophenyl)-4,5,4', 5'-tetraphenyl-1,2'-biimidazole, and acetophenone compounds such as Irgacure 369 and Irgacure 907 (both proprietary products of Ciba-Geigy K.K.), for example.

Though the amount of the photopolymerization initiator to be added is not particularly limited, it is in the range of 1–50 parts by weight, preferably 5–30 parts by weight, in the case of a triazine compound, in the range of 1–40 parts by weight, preferably 5–20 parts by weight, in the case of an imidazole compound, and in the range of 1–40 parts by weight, preferably 5–20 parts by weight, in the case of an acetophenone compound, severally based on 100 parts by weight of the photosensitive monomer (photopolymerizable monomer). As typical examples of the favorable photopolymerizing photosensitive resin, the photosensitive resins (1)–(3) shown in Table 9 below may be cited.

TABLE 9

| Kind of photosensitive resin | Composition of formulation | Component of formulation | Component ratio (part by weight) |
| --- | --- | --- | --- |
| Photosensitive resin (1) | Binder resin | Resin (1) shown in Table 8 | 61 |
| | Monomer | Trimethylolpropane trimethacrylate | 36 |
| | Photopolymerization initiator | | 4 |

TABLE 9-continued

| Kind of photosensitive resin | Composition of formulation | Component of formulation | Component ratio (part by weight) |
|---|---|---|---|
| Photosensitive resin (2) | Binder resin | Resin (2) shown in Table 8 | 57 |
| | Monomer | Pentaerythritol tetraacrylate | 41 |
| | Photopolymerization initiator | 4-(p-N,N-diethoxycarbonylethyl-2,6-di(trichloromethyl)-s-triazine | 2 |
| Photosensitive resin (3) | Binder resin | Resin (3) shown in Table 8 | 57 |
| | Monomer | Pentaerythritol tetraacrylate | 41 |
| | Photopolymerization initiator | 4-(p-N,N-diethoxycarbonylethyl-2,6-di(trichloromethyl)-s-triazine | 2 |

The photopolymerizable photosensitive resin can be produced by adding a photosensitive monomer and a photopolymerization initiator to a corresponding binder resin (acrylic resin) and dissolving them therein until a homogeneous solution is formed. The components for the composition of the photopolymerizable photosensitive resin can be used in arbitrary amounts. The amount of the acrylic resin mentioned above is in the range of 20–80%, preferably 40–70% by weight, based on the amount of solids components of the photopolymerizable photosensitive resin. If the amount of the acrylic resin is less than 20% by weight, the acrylic resin will possibly impair the compatibility of the dye and produce an unfavorable effect as to image strength on the color filter to be formed by the use of the color filter grade photosensitive resin coloring composition containing the acrylic resin. If the amount exceeds 80% by weight, the acrylic resin will possibly impair the photocuring sensitivity and bring about an adverse effect as to image strength on the color filter.

I-iii. Color Filter Grade Photosensitive Resin Coloring Composition

As respects the dye and the resin to be contained in the color filter grade photosensitive resin dye according to this invention, the amount of the dye to be used is in the range of 1–20% by weight, preferably 3–10% by weight and the amount of the resin to be used is in the range of 3–30% by weight, preferably 5–15% by weight, based on the amount of the solvent to be used. The amount of the dye to be used is in the range of 10–80% by weight, preferably 20–60% by weight, based on the amount of the resin.

The color filter grade photosensitive resin coloring composition according to this invention, when necessary, may incorporate therein arbitrary components such as a thermal polymerization inhibitor. The thermal polymerization initiator is added for the purpose of improving the stability of the composition during storage. As typical examples of the thermal polymerization inhibitor, hydroquinone, p-methoxyphenol, di-t-butyl-p-cresol, pyrogallol, t-butyl catechol, benzoquinone, 4,4'-thiobis (3-methyl-6-t-butylphenol), 2,2'-methylene (4-methyl-6-t-butylphenol), and 2-(mercapto benzoimidazole) may be cited. The coloring composition, when necessary, may further incorporate therein a photodegradation inhibitor.

No particular limit is imposed on the method for producing the color filter grade photosensitive resin coloring composition of this invention. The method shown in (1)–(3) below by way of example are available for the production under discussion.

(1) A method which comprises stirring one dye or a combination of two or more such dyes of this invention and mixing the stirred dye with a thermoplastic resin melted in advance by heating.

(2) A method which comprises stirring one dye or a combination of two or more such dyes of this invention, dissolving the stirred dye in a solvent together with a resin, and stirring the resultant blend (and optionally evaporating the blend subsequently to expel the solvent).

(3) A method which comprises stirring one dye or a combination of two or more such dyes of this invention, mixing the stirred dye with a polymerizing vinyl compound as a precursor of resin, and polymerizable the resultant mixed solution.

II. Color Filter

The color filter of this invention is characterized by comprising a substrate made of glass, plastic, and image pickup device, or a thin-film transistor, a black matrix, a color pattern having minute colored picture elements formed of colored layers of red, green, and blue (RGB) laid out in a prescribed pattern, and a color filter grade photosensitive resin coloring composition containing a dye and a resin as materials for the formation of colored layers of different colors of red, green, and blue (RGB) in a color filter of standard structure composed of protective films and transparent conducting films (ITO). Owing to this construction, the advantageous properties of the individual dye compounds which are claimed to excel in solubility in resin, lightfastness, thermal resistance, transparency, and color tone are enabled to manifest perfectly in the color filter. The rule of selecting the dyes for use in the color filter grade photosensitive resin coloring composition either from among the members of the (C) group or from among the members of the combinations of (A)+(B) groups, (A)+(C) groups, (B)+(C) groups, and (A)+(B)+(C) groups based on the wavelength data proper for the individual dye compounds so as to give the largest possible area to the triangle on the chromaticity diagram and, when a combination of members is selected rather than an individual member, then designing the mixing ratio of the selected members will suffice for the color filter of this invention.

Specifically, a color filter of red color, for example, may be manufactured from a color filter grade photosensitive resin coloring composition containing a red dye composed of a quinizarine compound (A) having a halogen atom for Z in the general formula (2) mentioned above and an anthraquinone compound (B) having NHT attached to the 2 or 3 position of the anthraquinone skeleton and 1 for r in the general formula (3) mentioned above at a weight ratio in the range of 50:50–90:10, preferably 55:45–70:30, particularly a red dye composed of a quinizarine compound (A) having 1–2 for p, an aryl group possessing a substituent at the ortho position for each of X and Y, and fluorine atoms for Z's at the remainders of position in the general formula (2) mentioned above and an anthraquinone compound (B) having 1 for 5, NHT attached to the 2 or 3 position of the anthraquinone skeleton, an aryl group possessing a substituent at the ortho position for T, an unsubstituted or substituted alkoxy group or an unsubstituted or substituted phenoxy group for at least one of V's, and halogen atoms for V's at the remainders of positions in the general formula (3) mentioned above at the same mixing ratio.

By the same token, a green color filter may be manufactured from a color filter grade photosensitive resin coloring composition containing a green dye composed of a phthalocyanine compound (C) having a tetravalent metal possessing a ligand for M in the general formula (1) mentioned above and an anthraquinone compound (B) having 1 for r and NHT attached to the 2 or 3 position of the anthraquinone skeleton in the general formula (3) mentioned above at a weight ratio in the range of 50:50–90:10, preferably 55:45–70:30, particularly a red dye composed of a phthalocyanine compound (C) having a tetravalent metal possessing a liquid for M, three to five phenoxy groups attached as substituents to the benzene ring of the phthalocyanine skeleton, not less than 3.0 Å for the total of atomic radii of the atoms minus hydrogen atoms contained in the substituents at the ortho positions of those of the phenoxy groups which possess a substituent at the ortho position, and fluorine atoms attached to the remainders of positions in the general formula (1) and an anthraquinone compound (B) having 1 for 5, NHT attached to the 2 or 3 position of the anthraquinone skeleton, an aryl group possessing a substituent at the ortho position for T, an unsubstituted or substituted alkoxy group or an unsubstituted or substituted phenoxy group for at least one of V's, and fluorine atoms for Z's at the remainders of positions in the general formula (3) mentioned above at the same weight ratio.

Then, a green color filter of a different combination may be manufactured from a color filter grade photosensitive resin coloring composition containing a green dye composed of a quinizarine compound (A) having $NHX^2$ for at least one of Z' in the general formula (2) mentioned above and an anthraquinone compound B) having 1 for p and NHX attached to the 2 or 3 position of the anthraquinone skeleton in the general formula (3) mentioned above at a weight ratio in the range of 60:40–90:10, preferably 70:30–80:20, particularly a green dye composed of a quinizarine compound (A) having $NHX^2$ for at least one of Z's and an aryl group possessing a substituent at the ortho position for each of X and $X^2$ in the general formula (2) mentioned above and an anthraquinone compound (B) having 1 for r, NHT attached to the 2 or 3 position of the anthraquinone skeleton, an aryl group possessing a substituent at the ortho position for T, an unsubstituted or substituted alkoxy group or an unsubstituted or substituted phenoxy group for at least one of V's, and fluorine atoms for V's at the remainders of positions in the general formula (3) mentioned above at the same weight ratio.

A blue color filter may be similarly manufactured from a color filter grade photosensitive resin coloring composition containing a blue dye composed of an anthraquinone compound (B) having 2–3 for r in the general formula (3) mentioned above and a phthalocyanine compound (C) having a divalent metal for M in the general formula (1) mentioned above at a weight ratio in the range of 20:80–60:40, preferably 35:65–40:60, particularly a blue dye composed of an anthraquinone compound (B) having at least one of NHT's attached as a substituent to the 2 or 3 position of the anthraquinone skeleton, an aryl group possessing a substituent at the ortho position thereof for T, and fluorine atoms for V's at the remainders of positions in the general formula (3) mentioned above and a phthalocyanine compound (C) having a divalent metal for M, three to five phenoxy groups attacked as substituents to the benzene ring of the phthalocyanine skeleton, and fluorine atoms attached to the remainders of positions in the general formula (1) mentioned above at the same weight ratio, and especially a blue dye composed of an anthraquinone compound (B) having two NHT's attached as substituents to the 1 and 4 positions of the anthraquinone skeleton, an unsubstituted or substituted alkyl group or a cycloalkyl group for T, and fluorine atoms and/or OU's for V's attached as substituents to the 2 and 3 positions in the remainders of positions in the general formula (3) mentioned above and a phthalocyanine compound (C) having a divalent metal for M and fluorine atoms attached to the remainders of positions in the general formula (1) mentioned above at the same weight ratio.

A blue color filter of a different combination may be manufactured from a color filter grade photosensitive resin coloring composition containing a blue dye composed of a quinizarine compound (A) having $NHX^2$ attached to the 6 or 7 position of the quinizarine skeleton and constituting at least one of Z' in the general formula (2) mentioned above and a phthalocyanine compound (C) having a divalent metal for M in the general formula (1) mentioned above at a weight ratio in the range of 20:80–60:40, preferably 30:70–40:60.

The color filter according to this invention, as described above, is characterized by using the aforementioned color filter grade photosensitive resin coloring composition as the material for the formation of a colored layer. It does not need to impose any particular limit on the other requirements for the formation of the color filter but may properly select them from those known to the art. When the standard construction of a color filter which comprises a substrate made of glass, plastic, an image pickup device, or a thin-film transistor, a black matrix, a color pattern having minute colored picture elements formed of colored layers of red, green, and blue (RGB) laid out in a prescribed pattern, and protective films and transparent conductive films (ITO) is assumed to constitute the basic structure of the color filter, for example, while the color layers must be formed with color filter grade photosensitive resin coloring compositions mentioned above, the glass substrate, the black matrix, the color pattern having minute colored picture elements formed of the relevant colored layers laid out in a prescribed pattern, the protective films, and the transparent conductive films may be selected from those known to the art.

III. Method for Production of Color Filter

Now, the method for producing a color filter using color filter grade photosensitive resin coloring compositions of this invention will be described more specifically below with reference to working examples thereof.

Since this method for the production of the color filter presumes use of such photosensitive raw materials for the formation of colored layers as to permit adoption of the photolithographic technique, it can be applied to the dye method and the pigment method which utilize the heretofore proposed photolithographic technique. The dyes used in the color filter grade photosensitive resin coloring compositions of this invention allow realization of the feature of retaining the fine color and high durability of the conventional dye system and excel in dispersibility and solubility in resin, lightfastness, thermal resistance, transparency, and color tone. No matter whether the production is effected by the dye method or the pigment method, therefore, the color filter manufactured either by the dye method or the pigment method manifests excellent transmittance and transparency and promises high contrast. Among the heretofore proposed dye and pigment methods utilizing the photolithographic technique, the pigment method which enjoys the characteristic properties of resistance not found in the dye method proves favorable. The conventional pigment type methods of production to which this invention can be applied will be specifically described in (1) and (2) below by way of example.

(1) Pigment dispersion method (etching method)

This method comprises forming a black matrix on a glass substrate [Step <1>], then applying a color filter grade photosensitive resin coloring composition (pigment resist) using a polyimide precursor as resin to the glass substrate thereby forming a colored layer [Step <2>], applying a positive photoresist thereon thereby forming a photoresist layer [Step <3>], exposing the photoresist layer to light through a photo mask of negative pattern [Step <4>], simultaneously developing the resist and etching the colored polyimide layer with an aqueous alkali solution thereby peeling the resist and subsequently curing the colored layer at a high temperature exceeding 250° C. thereby obtaining a fast color pattern of the first color [Step <5>], repeating the steps <2–5> mentioned above a total of three times each time using a different color filter grade photosensitive resin coloring composition (pigment resist) thereby forming a color pattern having colored picture elements of RGB laid out in a prescribed pattern [Step <6>], and thereafter forming a clear protective film for protecting and surface-smoothing the color pattern (and further forming a transparent conductive film) thereby giving rise to a color filter [Step <7>]. The color filter produced by the pigment dispersion method (etching method) excels in thermal resistance, chemical resistance, and lightfastness. It excels the other method particularly in thermal resistance as evinced by the durability to withstand temperatures exceeding 300° C.

(2) Pigment dispersion method (photocuring method)

This method, owing to the use of an organic photosensitive resin, allows omission of such steps of applying a resist and peeling the applied layer of the resist involved in the process of the etching method described above. This method comes in two types, the polymerization type using acrylic resin and the cross-linking type using polyvinyl alcohol resin, severally as the resin in the color filter grade photosensitive coating composition as the raw material for the formation of colored layers. This method, without reference to the distinction between the two types mentioned above, comprises first forming a black matrix on a glass substrate [Step <1>], then preparing a resist using a sensitive material such as azide or bisazide in the case of the cross-linking type or a photocurable monomer and a photopolymerization initiator such as benzophenone or Irgacure in the case of the polymerization type thereby forming a color filter grade photosensitive resin coloring composition as a pigment resist, and applying this composition to the glass substrate having formed a black matrix thereon thereby forming a colored layer [Step <2>], simultaneously forming an oxygen-intercepting film on the colored layer in the case of the polymerization type and exposing the colored layer to light under an inert state [Step <3>] thereby enabling the exposure under an inert condition to be implemented at the next step <4>, then exposing the colored layer to light through a photo mask of a negative pattern [Step <4>], developing the exposed colored layer with an alkali thereby forming a color pattern [Step <5>], repeating the steps <2–5> three times thereby giving rise to a colored pattern having colored picture elements of RGB laid out in a prescribed pattern [Step <6>], and thereafter forming a clear protective film for protecting and surface-smoothing the color pattern (and further forming a transparent conductive film) thereby giving rise to a color filter [Step <7>]. The color filter produced by the pigment dispersion method excels in thermal resistance, chemical resistance, and lightfastness.

In the method of production mentioned above, the colored layers can be patterned on an optically transparent substrate. The substrate to be used herein does not need to impose any particular limit so long as it allows the colored layers to be patterned infallibly thereon and permits production of a color filter capable of fulfilling prescribed functions. As typical examples of the substrate usable herein, glass plate and films or plates of polyvinyl alcohol, hydroxyethyl cellulose, methyl methacrylate, polyester, butylal, polyamide, polyethylene, vinyl chloride, vinylidene chloride, polycarbonate, polyolefin copolymer resin, vinyl chloride copolymer resin, vinylidene chloride copolymer resin, and styrene copolymer resin may be cited.

The conventional method for the production of a color filter can be properly utilized by using the color filter grade photosensitive resin coloring composition of this invention as described above. The method is preferred to be capable of utilizing the photolithographic technique. Appropriately the method is implemented by the means for accomplishing the second object of this invention claimed to provide a method for the production of a color filter by a convenient and expeditious procedure capable of enhancing the sensitivity of the photosensitive base resin material while this material is being photocured (patterning) and obviating the necessity of a treatment for preventing mixture of colors.

The method for the production of a color filter using a color filter grade photosensitive resin coloring composition which constitutes the means for the accomplishing the second object of this invention will be described in detail below with reference to working examples and accompanying drawings.

The method for the production of a color filter resorting to the means for accomplishing the second object of this invention resides in manufacturing the color filter by forming a colored layer for the formation of a color pattern with a photosensitive resin coloring composition, patterning the colored layer by the photolithographic technique, and repeating these steps thereby sequentially superposing a plurality of color patterns on one surface of a substrate. This method is characterized by using the color filter grade photosensitive resin coloring composition of this invention in the production of the color filter thereby forming a color pattern of the preceding step and then forming likewise a colored layer for the formation of a color pattern of the next step without requiring formation of an intermediate protective film on the color pattern of the preceding step. Thus, the use of the color filter grade photosensitive resin coloring composition of this invention enables a color film provided with color patterns each having colored picture elements of RGB laid out in a prescribed pattern to be manufactured by a simple procedure which has no use for an intermediate protective film intended to preclude mixture of colors. The requirements for the construction of this invention other than the use of the color filter grade photosensitive resin coloring method can be properly procured from those of the dye method utilizing the well know photolithographic technique. Here, the method for the production of a color filter possessing the standard construction of a color filter which comprises a substrate made of glass, plastic, an image pickup device, or a thin-film transistor, a black matrix, a color pattern having minute colored picture elements formed of colored layers of red, green, and blue (RGB) laid out in a prescribed pattern, protective films superposed on the color patterns, and transparent conducting films (ITO) further superposed thereon will be described below by way of example. Naturally, this invention is not limited to this method.

FIG. 4 is a schematic diagram illustrating the production process of color filters having the basic structure as described above and which is the representative embodiment of the production process in accordance with the second means to be achieved of the present invention. As illustrated in FIG. 4, a black matrix 403 is first formed on a substrate 401 such as glass (Step (1) as shown in FIG. 4A). The first photosensitive resin coloring composition for the first color filter containing a resin, preferably an acrylic resin having an average number molecular weight of 30,000 to 200,000 and a first dye (coating solution) is spread on the substrate 401 by means of a known coating means, such as spin-coat, and dried to form a first colored layer 405 so as to form a color pattern 411 (Step (2) as shown in FIG. 4B). The layers are then exposed to light through the medium of a photomask 409 (Step (3) as shown in FIG. 4C). The exposed layer is developed with an alkali to obtain the first color pattern 411 (Step (4) as shown in FIG. 4D). The Steps (2) to (4) are repeated, without the formation of an intermediate protective film on the first color pattern 411, to form a second color pattern 413 using a photosensitive resin coloring composition for the second color filter. Steps (2) to (4) are then repeated, without the formation of an intermediate protective film on the second color pattern 413, to form a third color pattern 415 using a photosensitive resin coloring composition for the third color filter. As a result, Steps (2) to (4) are repeated three times to form color patterns 411, 413 and 415 having colored picture elements of RGB laid out in patterns (Step (5) as shown in FIG. 4E). Thereafter, a transparent overcoat layer 417 is formed to protect the color patterns 411, 413, and 415 and smooth the surface and then a transparent conductive film (ITO) is accumulated on the overcoat layer 417 to form a color filter of the present invention (Step (6) as shown in FIG. 4F).

As described above, in the method of the production of the color filter of the present invention, the feature of the present invention is directed to, in Step (2) as shown above use the photosensitive coloring composition for color filters of the present invention containing the resin, preferably an acrylic resin having an average number molecular weight of 30,000 to 200,000 and the dye to from the former color pattern and then to form a colored layer so as to form the next color pattern without the intermediate protective film on the former color pattern. Accordingly, when the pattern of the n+1'th color is formed even if the pattern of the n'th color (n+1,2) is formed without an intermediate protective layer, for example, the pattern of the n'th color, after the coating liquid (resin coloring composition) of the n+1'th color has been applied thereto, does not sustain a crack therein or does not gather wrinkles thereon, does not release the dye therefrom, or does not dissolve and does not flow out itself, as a result the present invention can prevent the mixing of the colors. In addition to the above, since it is not necessary to effect an antifouling treatment and form an intermediate layer, the present invention can not only simplify the steps but also improve the sensitivity in the case of photocure (patterning).

In addition, since the excellent properties, such as tone, color, heat-resistance, durability and chemical-resistance, of the dye above can be provided to a color filter, the resultant color filer is excellent in transmittance and resistance properties (depolarization property, lightfastness property and heat-resistance), has the feeling of transparency, and a color filter having high contrast can be realized.

In the conventional pigment dispersion method in which the conventional dye is dispersed in an acrylic resin, when an acrylic resin is intended to be used having an average number molecular weight of 30,000 to 200,000 suitable for the resin of photosensitive resin coloring compositions of color filters of the present invention, the viscosity of such a resin is too high not to be fully dispersed therein, so that it brings about the problems of lowering of contrast as described above. For view of the dispersibility of the pigments, the resin to be used has the upper limit of the number average molecular weight in the approximate range of 10,000 to 20,000. The color filter produced from the above resin as a base polymer, therefore, is deficient in heat-resistance, resistance to solvent, and curability through the agency of light or heat. It is, therefore, necessary to increase the amount of a cross-linking agent relative to the amount of the resin or to adopt a special cross-linking agent.

In contrast, in the method for the production of a color filter of the present invention, soluble dyes are allowed not to disperse in a high molecular weight acrylic resin but the soluble dyes are compatible to such an acrylic resin, therefore, making a coating material is very easy and there is no problems of lowing of the contrast. In addition to the above, since the high molecular weight acrylic acid resin is included therein, in the case of photo cure or heat cure fully curing (further polymerization is effected) can be attained, so that in the case of the double coating (spin-coat) of colored layers so as to form a letter color pattern it can prevent the migration of the soluble dye (color migration) and thus it is not necessary to adopt an intermediate preventing film. As a result, the number of the procedures can be decreased and the simplification of the processes can be also attained compared to the conventional dye dispersion method.

If an acrylic resin having the average number molecular weight below 30,000 and a dye are used for photosensitive resin coloring compositions for color filters, the dye in the former n'th color pattern or the n'th color pattern itself, when the latter photosensitive resin coloring composition for the n+1'th color filter is spread (spin-coat), dissolves due to insufficient cure of the resin (higher molecular weight), so that it is necessary to form an intermediate film to prevent the mixing of the colors and also the same number of steps as the conventional method is required. As a result, it is not preferred since the simplification of steps of the second purpose of the present invention can not be attained. Adversely, if an acrylic resin having the number average molecular weight above 200,000 and a dye are used for photosensitive resin coloring compositions for color filters, it is difficult to produce a high molecular weight acrylic resin and also not practical due to the high viscosity.

Now, a novel anthraquinone compound which is a means for attaining a third object of this invention, and the method for the production thereof will be described in more detail below.

IV. Anthraquinone compound

The anthraquinone compound according to this invention is an anthraquinone compound represented by the formula (4) below:

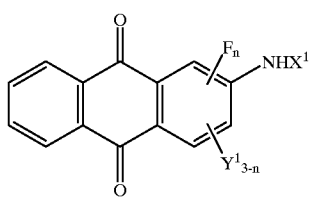

(4)

[wherein $X^1$ represents an unsubstituted or substituted aryl group, $Y^1$ represents at least one group selected from the class consisting of unsubstituted or substituted anilino groups, unsubstituted or substituted alkylamino groups, unsubstituted or substituted alkoxy groups, unsubstituted or substituted phenoxy groups, unsubstituted or substituted aklkylthio groups and unsubstituted or substituted phenylthio groups, and n is an integer of 1–3].

$Y^1$ in the formula (4) above preferably represents at least one member selected from the group consisting of unsubstituted or substituted anilino groups, unsubstituted or substituted alkoxy groups and unsubstituted or substituted phenoxy groups.

When —$NHX^1$ and $Y^1$ in the formula (4) above represent a substituted anilino group (a phenylamino group having a substituent(s) in the benzene ring), substituents acting as a donor include a hydroxyl group, unsubstituted or substituted alkyl groups, unsubstituted or substituted phenyl groups, unsubstituted or substituted alkoxy groups, unsubstituted or substituted phenoxy groups, unsubstituted or substituted alkylamino groups, unsubstituted or substituted arylamino groups, unsubstituted or substituted arylthio groups, and unsubstituted or substituted phenylthio groups. Among other substituents cited above, unsubstituted or substituted alkyl groups and unsubstituted or substituted alkoxy groups may be preferably used. Further substituents acting as an acceptor include a cyano group, a nitro group, a carboxyl group, a sulfone group, an alkoxycarbonyl group, an aryloxycarbonyl group, and halogen atoms. Among other substituents cited above, include a cyano group, a nitro group and halogen atoms may be preferably used. As typical examples of the substituted anilino group, such groups as of (a) type and (b) type may be cited as following.

As (a) type, there are, for example, an o-ethoxycarbonylanilino group, a m-ethoxycarbonylanilino group, a p-octyloxycarbonylanilino group, a p-cyanoanilino group, a p-nitroanilino group, a p-chloranilino group, a p-fluoroanilino group, a 3-chloro-4-cyanoanilino group, a 2,6-dichloroanilino group, a 4-cyano-2,6-dichloroanilino group, a 4-nitro-2,6-dichloroanilino group, a 2,6-difluoroanilino group, a 2-chloro-6-methylanilino group, a 2-fluoro-6-methylanilino group, a 2,4,6-trichloroanilino group, a 2,3,5,6-tetrachloroanilino group, a 2,3,5,6-tetrafluoroanilino group, and a 4-cyano-2,3,5,6-tetrafluoroanilino group and the like.

As (b) type, there are, for example, an anilino group, an o-hydroxyanilino group, a m-hydroxyanilino group, a p-methoxyanilino group, a p-ethoxyanilino group, an o-methylanilino group, a m-methylanilino group, a p-ethylanilino group, a p-bulylanilino group, a p-tert-bulylanilino group, a 2,4-dimethoxyanilino group, a 2,5-dimethoxyanilino group, a 2,4-dibutoxyailino group, a 2,5-dibutoxyanilino group, a 2,6-dimethylanilino group, a 2,6-diethylanilino group, a 2,6-diisopropyl-anilino group, a 2-methoxy-6-methylanilino group and a 2-methoxy-6-ethylanilino group.

Further, as a substituted or unsubstituted alkylamino group represented as $Y^1$ in the general formula (4), there are a methylamino group, an ethylamino group, a n-propylamino group, an isopropylamino group, a n-butylamino group, an isobutylamino group, a tert-butylamino group, a straight or branched pentylamino group, a straight or branched hexylamino group, a straight or branched heptylamino group, a straight or branched octylamino group, a hydroxymethylamino group, a hydroxyethylamino group, and the like.

Further, as the alkoxy represented by $Y^1$ in the general formula (4), there are a methoxy group, an ethoxy group, a n-propyloxy group, an isopropyloxy group, a n-butyloxy group, an isobutyloxy group, a tert-butyloxy group, a straight or branched pentyloxy group, a straight or branched hexyloxy group, a straight or branched heptyloxy group, a straight or branched octyloxy group, and the like.

Further, as a substituent of the substituted or unsubstituted alkoxy group, there is an alkoxy group, and typically a methoxymethoxy group, a methoxyethoxy group, an ethoxyethoxy group, and the like.

Furthermore, as the substituted or unsubstituted phenoxy group represented by $Y^1$ in the general formula (4), there are an unsubstituted phenoxy group or substituted phenoxy group by an alkyl group having 1–4 carbon atoms, an alkoxy having 1–4 carbon atoms or 1–2 hologen atoms, and typically, a phenoxy group, an o-methylphenoxy group, a m-methylphenoxy group, a p-ethylphenoxy group, a p-propylphenoxy group, a p-isopropylphenoxy group, a p-butylphenoxy group, a p-tert-butylphenoxy group, an o-methoxyphenoxy group, a m-methoxyphenoxy group, a p-ethoxyphenoxy group, a p-propoxyphenoxyl group, a p-isopropoxyphenoxy group, a p-butoxyphenoxy group, a 2,6-dimethylphenoxy group, a 2,6-diethylphenoxy group, a 2,6-diisoproxyphenoxy group, a 2,6-dichloro-phenoxy group, a 2-chloro-6-methylphenoxy group, a 2-chloro-6-ethylphenoxy group and the like.

As the substituted or unsubstituted alkylthio group represented $Y^1$ in the general formula (4), there are a methylthio group, an ethylthio group, a n-propylthio group, isopropylthio group, a n-butylthio group, an isobutylthio group, a tert-butylthio group, a straight or branched pentylthio group, a straight or branch hexylthio group, a straight or branched heptylthio group, a straight or branched octylthio group, a 2-hydroxyethylthio group, and the like in benzene ring.

Further, as the substituted or unsubstituted phenylthio represented by $Y^1$ in the general formula (4), there are unsubstituted phenylthio group or substituted phenylthio group by 1–4 methyl groups, hydroxyl groups, methoxy groups, carboxyl groups, cyano groups or fluorine atoms and typically a thiophenol group, a p-toluenethiol group, a p-hydroxy thiophenol group, a p-methoxy thiophenol group, a 4-cyano-2,3,5,6-tetrafluorothiophenol group.

The fluorine atoms contained in the anthraquinone compound represented by the formula (4) have an effect of promoting a solubility in a solvent or a resin.

A substituted may be introduced in the anthraquinone structure depending on the use aimed at. When the anthraquinone compound is to be mainly used for the improvement of the solubility, such a substituent as an alkoxy group and a phenoxy group may be preferably introduced in the anthraquinone structure. By using such a substituent, the anthraquinone compound can be dissolved in such a ketone type solvent as acetone and methylethylketone, such a hydrocarbon type solvent as benzene, toluene and xylene, such a halogen type solvent as chloroform and dichloroethane in a high concentration.

By introducing an alkylthio group or a phenylthio group therein, an absorption wavelength can be shifted in a little longer wavelength side.

For the purpose of shifting an absorption wavelength in a little longer wavelength side, an anilino group (a phenylamino group having a substituent(s) in the benzene ring) needs to be used. The shifting range can be changed with the kind of the substituent in the anilino group or the number of the substituents. On other words, an absorption wavelength can be controlled within an absorption wavelength in the range of 400 to 650 nm by the kind or number of the substituents. Particularly, when a visible light range of a yellow dye is to be obtained, it is preferable that one anilino group of the above (a) type (an anilino group having a substituent acting as an acceptor is particularly preferably used) is introduced, or that the above-mentioned anilino group is introduced in combination with an unsubstituted or substituted alkyloxy group or a phenoxy group optionally having a substituent in the benzene thereof. It is particularly preferable to introduce an anilino group(s) into the 2 and/or 6 position of the anthraquinone structure in the point of the improvement of solubility.

In particular, when a visible light range of a red dye is to be obtained, it is preferable that one anilino group of the above (b) type (an anilino group having a substituent acting as a donor is particularly preferably used) is introduced, or that two anilino groups of (a) type (anilino groups having a substituent acting as an acceptor are particularly preferably used) are introduced.

Further, when a visible light range of a blue dye is to be obtained, it is preferable that two anilino groups of the above (b) type (an anilino group having a substituent acting as a donor is particularly preferably used) are introduced. When a solubility is particularly necessary, an alkoxy group(s) and/or a phenoxy group(s) is preferably introduced therein.

By introducing these anilino groups, the lightfastness can be improved. Since the introduction of an alkylamino group sometimes lowers the lightfastness, an anilino group(s) must be introduced [although Zh. Obsch. Khim. 1968, vol. 38, No. 8, pp. 1884–1888, etc. disclose alkylamino-substituted substances, they are deficient in the lightfastness can be poorly used in actual use.].

In the case of the introduction of these substituents, since the anthraquinone compound having the substituents introduced in the 2 and/or 3 positions of the anthraquinone structure excels in the lightfastness to the anthraquinone compound having the substituents introduced in the 1 and/or 4 positions of the anthraquinone structure, the substituents may be preferably introduced in the 2 and/or 3 positions of the anthraquinone structure in advance.

The typical examples of the anthraquinone compounds represented by the general formula (4) are as below.

(1') 2-Anilino-1,3,4-trifluoroanthraquinone,
(2') 2-(o-Ethoxycarbonylanilino)-1,3,4-trifluoroanthraquinone,
(3') 2-(p-Cyanoanilino)-1,3,4-trifluoroanthraquinone,
(4') 2-(o-Nitroanilino)-1,3,4-trifluoroanthraquinone,
(5') 2-(p-t-Butylanilino)-1,3,4-trifluoroanthraquinone,
(6') 2-(o-Methoxyanilino)-1,3,4-trifluoroanthraquinone,
(7') 2-(2-Methoxy-6-methlanilino)-1,3,4-trifluoroanthraquinone,
(8') 2-(2-chloro-6-methlanilino)-1,3,4-trifluoroanthraquinone, (9') 2-(2,6-Diethlanilino)-1,3,4-trifluoroanthraquinone,
(10') 2-(2,6-Dichloroanilino)-1,3,4-trifluoroanthraquinone,
(11') 2-(2,3,5,6-Tetrachloroanilino)-1,3,4-trifluoroanthraquinone,
(12') 2-(2,3,5,6-Tetrafluoroanilino)-1,3,4-trifluoroanthraquinone,
(13') 3-(p-Cyanoanilino)-2-phenoxy-1,4-difluoroanthraquinone,
(14') 3-(p-Cyanoanilino)-2-(2,6-diethylphenoxy)-1,4-difluoroanthraquinone,
(15') 3-(2,6-Dichloroanilino)-2-(2,6-dichlorophenoxy)-1,4-difluoroanthraquinone,
(16') 3-(2,3,5,6-Tetrachloroanilino)-2-(2,6-dimethoxyphenoxy)-1,4-difluoroanthraquinone,
(17') 2,3-Bis(p-ethoxycarbonylanilino)-1,4-difluoroanthraquinone,
(18') 2,3-Bis(p-cyanoanilino)-1,4-difluoroanthraquinone,
(19') 2,3-Bis(o-methoxyanilino)-1,4-difluoroanthraquinone,
(20') 2,3-Bis(2-methoxy-6-methylanilino)-1,4-difluoroanthraquinone,
(21') 2,3-Bis(2-chloro-6-methylanilino)-1,4-difluoroanthraquinone,
(22') 2,3-Bis(3-chloro-4-cyanoanilino)-1,4-difluoroanthraquinone,
(23') 2,3-Bis(2,6-diethylanilino)-1,4-difluoroanthraquinone,
(24') 2,3-Bis(2,6-diisopropylanilino)1,4-difluoroanthraquinone,
(25') 2,3-Bis(2,6-dichloroanilino)-1,4-difluoroanthraquinone,
(26') 2,3-Bis(3,4-dicyanoanilino)-1,4-difluoroanthraquinone,
(27') 2,3Bis(2,3,5,6-tetrachloroanilino)-1,4-difluoroanthraquinone,
(28') 2,3-Bis(2,3,5,6-tetrafluoroanilino)-1,4-difluoroanthraquinone,
(29') 3-(2,3,5,6-tetrafluoroanilino)-2-methoxy-1,4-difluoroanthraquinone,
(30') 3-(2,6-Dichloroanilino)-2-ethoxy-1,4-difluoroanthraquinone,
(31') 2,3Bis(p-cyanoanilino)-1-methoxyethoxy-4-fluoroanthraquinone,
(32') 2-(p-Cyanoanilino)-3-ethylamino-1,4-difluoroanthraquinone,
(33') 3-(2,6-Dichloroanilino)-2-(n-butylthio)-1,4-difluoroanthraquinone.

V. Method for the production of anthraquinone compound

As the method for the production of an anthraquinone compound which is another means for attaining a third object of this invention, a following method can be cited, for example.

To be specific, it can be accomplished by using as a starting material a tetrafluoroanthraquinone compound (hereinafter sometimes referred to as "1,2,3,4-tetrafluoroanthraquinone") represented by a following formula (5):

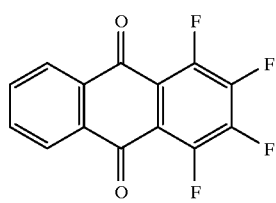

(5)

and reacting the tetrafluoroanthraquinone compound sequentially or simultaneously with nucleophilically reactive substances comprising an aromatic amino compound solely, or an aromatic amino compound in combination with an aliphatic amino compound, an aromatic hydroxy compound, an aliphatic hydroxy compound, an aromatic mercapto compound, or an aliphatic mercapto compound, thereby subjecting the tetrafluoroanthraquinone compound to the nucleophilic substitution for the fluorine atoms.

In the method as described above, the reaction is generally carried out in an organic solvent. As typical examples of the organic solvent which is usable herein, inert solvents such as nitrobenzene, acetonitrile, and benzonitrile, nonprotonic polar solvents such as pyridine, N,N-dimethyl acetamide, N-methyl-2-pyrrolidone, triethyl amine, tri-n-butyl amine, dimethyl sulfone, and sulfolane, halogen type solvents such as α-chloronaphthalene, trichlorobenzene, dichlorobenzene, chloroform, and dichloroethane, and benzene, toluene, and xylene may be cited. Alternatively, such nucleophilically reactive substances as amino compounds and hydroxy compounds mentioned above themselves may be used as solvents in place of the organic solvents mentioned above.

Such organic bases as triethyl amine and tri-n-butyl amine and such inorganic bases as potassium fluoride, potassium hydroxide, potassium carbonate, sodium hydroxide, and sodium carbonate may be preferably used as a condensing agent. Such a condensing agent does not always need to be used when the nucleophilically reactive substances themselves manifest an effect as a condensing agent in such amino compounds as aniline, toluidine, or anisidine. Further, the use of the condensing agent can be omitted when the nucleophilically reactive substances themselves have strong reactivity.

The reaction temperature is generally in the range of 20°–200° C., though variable with such factors as the reaction solvent. Preferably, for the substitution reaction of an aromatic amino compound, it is in the range of 50°–180° C., for the substitution reaction of an aromatic hydroxy compound, in the range of 20°–120° C., for the substitution reaction of an aliphatic hydroxy compound, in the range of 50°–180° C., for the substitution reaction of an aromatic mercapto compound, in the range of 20°–100° C., and for the substitution reaction of an aliphatic mercapto compound, in the range of 50°–180° C.

The 1,2,3,4-tetrafluoroanthraquinone as a starting material can be synthesized by acylating 3,4,5,6-tetrafluorophthalic anhydride with benzene by the Friedel-Crafts reaction, and thereafter heating and ring-closing the acylated reaction product with sulfonic acid, as described in "Bulletin of the Chemical Society of Japan", 1976, (5), pp. 797–801, for example.

As another synthesizing method, the 1,2,3,4-tetrafluoroanthraquinone may be synthesized by using 3,4,5,6-tetrafluorophthalonitrile as a starting material, reacting 3,4,5,6-tetrafluorophthalonitrile sequentially or simultaneously with nucleophilically reactive substances comprising an aromatic amino compound solely, or an aromatic amino compound in combination with an aliphatic amino compound, an aromatic hydroxy compound, an aliphatic hydroxy compound, an aromatic mercapto compound, or an aliphatic mercapto compound, thereby subjecting the 3,4,5,6-tetrafluorophthalonitrile to the nucleophilic substitution for the fluorine atoms, hydrolyzing the reaction product to form substituted phthalic acid, acylating the substituted phthalic acid by the Friedel-Crafts reaction, and thereafter heating and ring-closing the acylated reaction product with sulfonic acid.

EXAMPLES

The present invention will be described more specifically below with reference to working examples, which are cited for the sake of illustrating and not limiting the invention.

Production Example of acryl type resin

TABLE 10

| Kind of acryl type resin | Composition of monomer | Composition ratio of monomer (mol %) |
|---|---|---|
| Acryl type resins (1) and (4) | Styrene | 5 |
| | 2-Hydroxyethyl methacrylate | 22 |
| | Ethyl methacrylate | 54 |
| | Methacrylic acid | 19 |
| Acryl type resin (2) | Styrene | 62 |
| | Diethylene glycol monoethylether acrylate | 32 |
| | Acrylic acid | 6 |
| Acryl type resin (3) | Benzyl methacrylate | 70 |
| | Methacrylic acid | 30 |

Among other acryl type resins mentioned above, one typical example for producing an acryl type resin (1) solution (a solution having an acryl type resin shown in Table 10 dissolved in a solvent so as to have a suitable viscosity) is described below. In the below method, unless otherwise specified, the term "parts" shall be construed as indicating "parts by weight".

Production Example of acryl type resin (1) solution

In four-necked flask having an inner volume of 1 liter, 450.0 parts of diethylene glycol dimethyl ether having a solubility parameter of 9.4 $(cal/cm^3)^{1/2}$ was placed with 8.8 parts of styrene, 43.8 parts of 2-hydroxyethyl methacrylate, 26.3 parts of methacrylic acid, and 96.3 parts of ethyl methacrylate and heated at 70° C. to prepare an used solvent. A solution which had been prepared in advance by mixing 373.0 parts of diethylene glycol dimethyl ether, 8.8 parts of styrene, 43.8 parts of 2-hydroxyethyl methacrylate, 26.3 parts of methacrylic acid, 96.3 parts of ethyl methacrylate, and 0.41 part of AIBN was added dropwise in the resultant used solvent over a period of three hours and left reacting at 70° C. for additional three hours. A solution of 0.23 part of AIBN in 10 parts of diethylene glycol dimethyl ether was further added thereto and the reaction was continued for two hours to obtain a solution of acryl type resin (1) in diethylene glycol dimethyl ether.

The molecular weight of this acryl type resin (1) was measured by a standard curve with polystyrene with known molecular weight as standards determined by a gel permeation chromatography (produced by Toso Co., Ltd.) (hereinafter referred to as "GPC") using a column TSKgel (produced by Toso Co., Ltd. and marketed under the product name of "GMH$_{HR}$-M") linked to a guard column TSK (produced by Toso Co., Ltd. and marketed under the product name of "guardcolumn H$_{HR}$-H") and a solution of lithium bromide in dimethyl formamide at a concentration of 10 mg/l, under such conditions as of a column temperature of 40° C. and a flow rate of 0.8 ml/min. As a result, the number average molecular weight of the acryl type resin (1) was 78,000 and the weight average molecular weight was 175,000.

Figure 5:
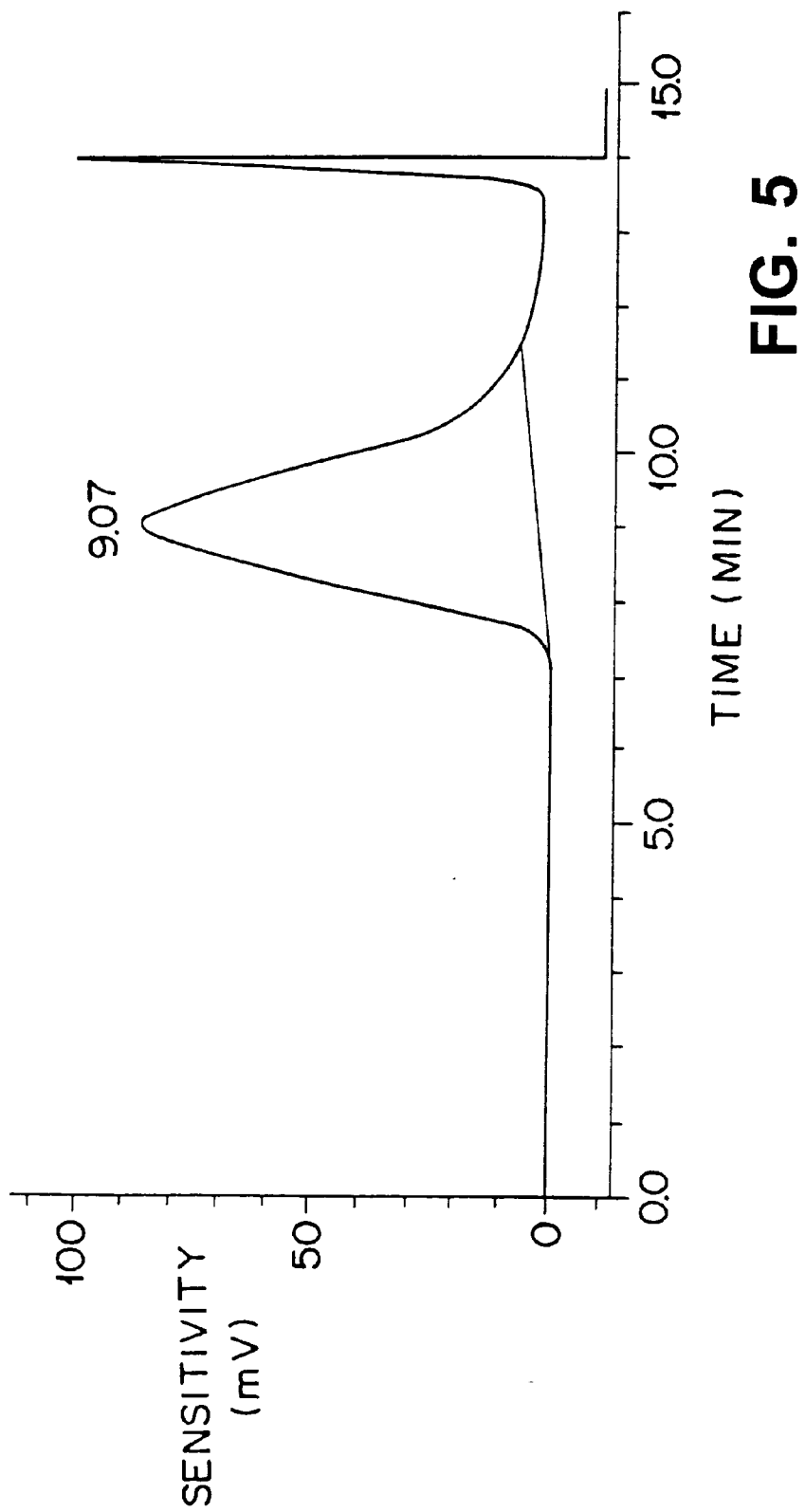
FIG. 5 is a diagram showing a measuring chart of a gel permeation chromatography (GPC) aimed at computing the molecular weight of an acrylic resin (1) which can be used for the method of this invention for producing a color filter.

The chart measured with the acryl type resin (1) is shown in FIG. 5. As shown from this figure, the number average molecular weight according to this invention was calculated without including parts with molecular weights of not more than about 6,000.

Acryl type resins (2) and (3) were polymerized by the same manner as in the acryl type resin (1), except for changing the kind of the monomer and the composition ratio of monomer to those shown in Table 10. Similarly, the molecular weights thereof were determined. As a result, the acryl type resin (2) was found to have a number average molecular weight of 68,000 and a weight average molecular weight of 157,000. The acryl type resin (3) was found to have a number average molecular weight of 83,000 and a weight average molecular weight of 196,000.

Acryl type resin (4) was polymerized by the same manner as in the acryl type resin (1), except for changing the initial amount of AIBN to 2.05 parts and the subsequent amount of AIBN to 1.18 parts, and the molecular weight thereof was similarly determined. As a result, the acryl type resin (4) was found to have a number average molecular weight of 32,000 and a weight average molecular weight of 75,000.

Formulation Examples of photosensitive resins coloring composition (coating solution) for a green color filter as a first coloring material.

The resultant photosensitive resin coloring composition for a green color filter was spin-coated on a glass substrate by a spin-coater so as to have a membrane thickness following the drying of the solvent set to 2 μm. Then, the coating was pre-baked at 60° C. for 20 minutes to form a green-coloring layer for the formation of a color pattern [First step].

Subsequently, the layer was exposed to light through the medium of a photomask for the formation of a color pattern [Second step].

Then, the exposed colored layer was developed with an aqueous 1% sodium carbonate solution, washed with pure water, post-baked at 200° C. for 10 minutes to form a green pattern thereon [Third step].

For the obtained color filter, the depolarization property, transmittance, lightfastness, heat-resistance, and solvent-resistance were evaluated. The results are shown in Table 13.

EXAMPLES 2 TO 16

Color filters having a green pattern formed thereon were made by the same process as in Example 1 except that the green dyes and toning yellow dyes as shown in Table 12 were used in the formulated amounts shown in Table 12

TABLE 11

| Kind of photosensitive resin | Composition of formulation | Component of formulation | Component ratio (part by weight) |
|---|---|---|---|
| Photosensitive resin (1) | Acryl type resin | Acryl type resin (1) shown in Table 10 | 61 |
| | Photosensitive monomer | Trimethylolpropane trimethacrylate | 36 |
| | Photopolymerization initiator | | 4 |
| Photosensitive resin (2) | Acryl type resin | Acryl type resin (2) shown in Table 10 | 57 |
| | Photosensitive monomer | Pentaerythritol tetraacrylate | 41 |
| | Photopolymerization initiator | 4-(p-N,N-diethoxycarbonylethyl-2,6-di(trichloromethyl)-s-triazine | 2 |
| Photosensitive resin (3) | Acryl type resin | Acryl type resin (3) shown in Table 10 | 57 |
| | Photosensitive monomer | Pentaerythritol tetraacrylate | 41 |
| | Photopolymerization initiator | 4-(p-N,N-diethoxycarbonylethyl-2,6-di(trichloromethyl)-s-triazine | 2 |

The photosensitive resins (1) to (3) as shown in the above Table 11 were obtained by using as a polymerization solvent diethylene glycol dimethyl ether with a solubility parameter of 9.4 $(cal/cm^3)^{1/2}$. For the composition of components shown therein, the composition ratios of the polymerization solvents are omitted.

EXAMPLE 1

3.5 g of a green dye (quinizarine dye (35)) and 1.8 g of a toning yellow dye (anthraquinone dye (4)) were dissolved in 50 g of a solution (nonvolatile content of 15%) of the photosensitive resin (1) as shown in Table 11 in diethylene glycol dimethyl ether (used solvent with a solubility parameter of 9.4 $(cal/cm^3)^{1/2}$), to prepare a photosensitive resin instead of the green dye (quinizarine dye (35)) and toning yellow dye (anthraquinone dye (4)) in Example 1, respectively, any of the photosensitive resins (1) to (3) shown in Table 11 above was used as shown in Table 12 instead, and the used solvent were changed as shown in Table 12 instead.

For these color filters having a green pattern formed thereon, the depolarization property, transmittance, lightfastness, heat-resistance, and solvent-resistance were evaluated. The results are shown in Table 13.

TABLE 12

| | Green dye | | Toning yellow dye | | | |
|---|---|---|---|---|---|---|
| Example | Kind of dye | Formulated amount (g) | Kind of dye | Formulated amount (g) | Photosensitive resin | Used solvent |
| 1 | Quinizarine dye (35) | 3.5 | Anthraquinone dye (4) | 1.8 | (1) | A |
| 2 | Quinizarine dye (37) | 3.6 | Anthraquinone dye (8) | 2.1 | (2) | B |
| 3 | Quinizarine dye (38) | 3.5 | Anthraquinone dye (9) | 1.9 | (4) | B |
| 4 | Quinizarine dye (40) | 3.6 | Anthraquinone dye (14) | 2.0 | (1) | A |
| 5 | Quinizarine dye (44) | 3.7 | Anthraquinone dye (15) | 2.1 | (2) | C |
| 6 | Quinizarine dye (55) | 3.7 | Anthraquinone dye (16) | 2.1 | (3) | A |
| 7 | Quinizarine dye (58) | 3.6 | Anthraquinone dye (17) | 2.0 | (1) | B |
| 8 | Phthalocyanine dye (2) | 3.5 | Anthraquinone dye (4) | 2.3 | (4) | A |
| 9 | Phthalocyanine dye (3) | 3.6 | Anthraquinone dye (8) | 2.4 | (2) | C |
| 10 | Phthalocyanine dye (7) | 3.5 | Anthraquinone dye (9) | 2.7 | (3) | B |
| 11 | Phthalocyanine dye (10) | 3.6 | Anthraquinone dye (14) | 2.6 | (1) | A |
| 12 | Phthalocyanine dye (13) | 3.7 | Anthraquinone dye (13) | 2.8 | (1) | A |
| 13 | Phthalocyanine dye (15) | 3.7 | Anthraquinone dye (11) | 2.9 | (3) | A |
| 14 | Phthalocyanine dye (18) | 3.6 | Anthraquinone dye (17) | 2.4 | (1) | B |
| 15 | Phthalocyanine dye (19) | 3.6 | Anthraquinone dye (10) | 2.5 | (2) | C |
| 16 | Phthalocyanine dye (20) | 3.5 | Anthraquinone dye (17) | 2.6 | (3) | A |

Note)
All the photosensitive resins were used with the nonvolatile content thereof adjusted to 15% by weight with the used solvent.
A: Diethylene glycol dimethylether 100%
B: Diethylene glycol dimethylether/cyclohexane = 8/2 (weight ratio)
C: Diethylene glycol dimethylether/propylene glycol monomethylether acetate = 6/4 (weight ratio)

TABLE 13

| Example | Depolarization property | Transmittance | Lightfastness | Heat-resistance | Solvent-resistance |
|---|---|---|---|---|---|
| 1 | ◎ | ○ | ◎ | ◎ | ◎ |
| 2 | ◎ | ○ | ◎ | ◎ | ◎ |
| 3 | ◎ | ○ | ◎ | ◎ | ○ |
| 4 | ◎ | ○ | ◎ | ◎ | ◎ |
| 5 | ◎ | ○ | X | ◎ | ◎ |
| 6 | ○ | ○ | ○ | ◎ | ◎ |
| 7 | ○ | ○ | ○ | ◎ | ◎ |
| 8 | ◎ | ◎ | ◎ | ◎ | ○ |
| 9 | ○ | ○ | X | ◎ | ◎ |
| 10 | ◎ | ○ | ○ | ◎ | ◎ |
| 11 | ◎ | ◎ | ◎ | ◎ | ◎ |
| 12 | ◎ | ◎ | ◎ | ◎ | ◎ |
| 13 | ◎ | ◎ | ◎ | ◎ | ◎ |
| 14 | ◎ | ◎ | ○ | ◎ | ◎ |
| 15 | ○ | ○ | ○ | ◎ | ◎ |
| 16 | ◎ | ○ | ◎ | ◎ | ◎ |

EXAMPLES 17 TO 28

Photosensitive resin coloring compositions for a red color filter were prepared and further color filters having a red pattern formed thereon were made therefrom, by the same manner as that in Example 1, except for using the red dyes and toning yellow dyes shown in Table 14 in the formulated amounts shown in Table 14 in place of the green dye (quinizarine dye (35)) and toning yellow dye (anthraquinone dye (4)) in Example 1, respectively, changing the photosensitive resin to any of the photosensitive resins (1) to (3) shown in Table 11 above as shown in Table 14 instead, and further using the used solvent as shown in Table 14 instead.

For these color filters having a red pattern formed thereon, the depolarization property, transmittance, lightfastness, heat-resistance, and solvent-resistance were evaluated. The results are shown in Table 15.

TABLE 14

| | | Red dye | | Toning yellow dye | | | |
|---|---|---|---|---|---|---|---|
| | Example | Kind of dye | Formulated amount (g) | Kind of dye | Formulated amount (g) | Photosensitive resin | Used solvent |
| | 17 | Quinizarine dye (5) | 3.0 | Anthraquinone dye (8) | 2.5 | (1) | A |
| | 18 | Quinizarine dye (10) | 3.5 | Anthraquinone dye (4) | 1.5 | (2) | C |
| | 19 | Quinizarine dye (11) | 3.0 | Anthraquinone dye (9) | 2.5 | (4) | B |
| | 20 | Quinizarine dye (16) | 3.2 | Anthraquinone dye (13) | 1.8 | (1) | A |
| | 21 | Quinizarine dye (20) | 3.0 | Anthraquinone dye (15) | 2.0 | (2) | C |
| | 22 | Quinizarine dye (23) | 3.5 | Anthraquinone dye (16) | 1.5 | (3) | A |
| | 23 | Quinizarine dye (25) | 3.3 | Anthraquinone dye (13) | 1.9 | (1) | A |
| | 24 | Quinizarine dye (27) | 3.4 | Anthraquinone dye (11) | 1.7 | (2) | C |
| | 25 | Quinizarine dye (30) | 3.3 | Anthraquinone dye (17) | 1.8 | (3) | B |
| | 26 | Quinizarine dye (54) | 3.5 | Anthraquinone dye (16) | 1.5 | (1) | B |
| | 27 | Quinizarine dye (23) | 3.5 | Anthraquinone dye (22) | 1.5 | (4) | A |
| | 28 | Quinizarine dye (23) | 3.5 | Anthraquinone dye (24) | 1.5 | (3) | A |

Note)
All the photosensitive resins were used with the nonvolatile content thereof adjusted to 15% by weight with the used solvent.
A: Diethylene glycol dimethylether 100%
B: Diethylene glycol dimethylether/cyclohexane = 8/2 (weight ratio)
C: Diethylene glycol dimethylether/propylene glycol monomethylether acetate = 6/4 (weight ratio)

TABLE 15

| Example | Depolarization property | Trans- mittance | Light- fastness | Heat- resistance | Solvent- resistance |
|---------|------------------------|-----------------|-----------------|------------------|---------------------|
| 17 | ⊙ | ○ | ⊙ | ⊙ | ⊙ |
| 18 | ⊙ | ⊙ | ⊙ | ⊙ | ⊙ |
| 19 | ⊙ | ⊙ | ⊙ | ⊙ | ○ |
| 20 | ⊙ | ⊙ | ⊙ | ⊙ | ⊙ |
| 21 | ○ | ○ | ⊙ | ⊙ | ⊙ |
| 22 | ⊙ | ⊙ | ⊙ | ⊙ | ⊙ |
| 23 | ⊙ | ⊙ | ⊙ | ⊙ | ⊙ |
| 24 | ⊙ | ⊙ | ⊙ | ⊙ | ⊙ |
| 25 | ⊙ | ⊙ | ○ | ⊙ | ⊙ |
| 26 | ⊙ | ○ | ⊙ | ⊙ | ⊙ |
| 27 | ○ | ○ | ○ | ⊙ | ○ |
| 28 | ○ | ○ | X | ⊙ | ⊙ |

EXAMPLES 29 TO 35

Photosensitive resin coloring compositions for a blue color filter were prepared and further color filters having a blue pattern formed thereon were made therefrom, by the same manner as that in Example 1, except for using the phthalocyanine blue dyes and quinizarine or anthraquinone blue dyes shown in Table 16 in the formulated amounts shown in Table 16 in place of the green dye (quinizarine dye (35)) and toning yellow dye (anthraquinone dye (4)) in Example 1, respectively, changing the photosensitive resin to any of the photosensitive resins (1) to (3) shown in Table 11 above as shown in Table 16 instead, and further using the used solvent as shown in Table 16 instead.

For these color filters having a blue pattern formed thereon, the depolarization property, transmittance, lightfastness, heat-resistance, and solvent-resistance were evaluated. The results are shown in Table 17.

The depolarization property indicated in Tables 13, 15 and 17 was evaluated as following.

A sample color filter having the color patter made as the first coloring material formed thereon was nipped between a pair of polarizing boards. Then, a ratio of an amount of transmitted light when the polarizing axes of the two polarizing boards crossed at right angles to that when the polarizing axes of the two polarizing boards were parallel each other (hereinafter referred to as "contrast") was measured. The measured results were evaluated as divided into three classes as below:

⊙: the contrast exceeds 3,000

○: the contrast is in the range of 1,500 to 3,000

X: the contrast is less than 1,500

For the transmittance indicated in Tables 13, 15 and 17, a transmittance of a sample was determined in a wavelength in the range of 400 to 700 nm, and the results were evaluated as divided into three classes as below: For color filters having a green pattern formed thereon:

⊙: the transmittance at 545 nm is 85% and the transmittance at 460 nm and 610 nm is less than 10%

○: the transmittance at 545 nm is 85% and the transmittance at 460 nm and 610 nm is in the range of 10% to 20%

X: the transmittance at 545 nm is 85% and the transmittance at 460 nm and 610 nm exceeds 20%

For color filters having a red pattern formed thereon:

⊙: the transmittance at 610 nm is 80% and the transmittance at 460 nm and 545 nm is less than 10%

○: the transmittance at 610 nm is 80% and the transmittance at 460 nm and 545 nm is in the range of 10% to 20%

X; the transmittance at 610 nm is 80% and the transmittance at 460 nm and 545 nm exceeds 20%

TABLE 16

| | Blue dye | | Blue dye | | | |
|---|---|---|---|---|---|---|
| Example | Kind of dye | Formulated amount (g) | Kind of dye | Formulated amount (g) | Photosensitive resin | Used solvent |
| 29 | Phthalocyanine dye (26) | 3.5 | Quinizarine dye (42) | 2.5 | (4) | A |
| 30 | Phthalocyanine dye (26) | 3.5 | Anthraquinone dye (20) | 2.0 | (1) | A |
| 31 | Phthalocyanine dye (29) | 3.8 | Quinizarine dye (43) | 2.5 | (3) | B |
| 32 | Phthalocyanine dye (29) | 3.6 | Anthraquinone dye (19) | 2.1 | (1) | A |
| 33 | Phthalocyanine dye (33) | 3.7 | Anthraquinone dye (20) | 2.2 | (2) | C |
| 34 | Phthalocyanine dye (33) | 3.6 | Anthraquinone dye (19) | 2.3 | (1) | A |
| 35 | Phthalocyanine dye (26) | 3.7 | Anthraquinone dye (28) | 2.3 | (2) | C |

Note)
All the photosensitive resins were used with the nonvolatile content thereof adjusted to 15% by weight with the used solvent.
A: Diethylene glycol dimethylether 100%
B: Diethylene glycol dimethylether/cyclohexane = 8/2 (weight ratio)
C: Diethylene glycol dimethylether/propylene glycol monomethylether acetate = 6/4 (weight ratio)

TABLE 17

| Example | Depolarization property | Trans- mittance | Light- fastness | Heat- resistance | Solvent- resistance |
|---------|------------------------|-----------------|-----------------|------------------|---------------------|
| 29 | ⊙ | ⊙ | ⊙ | ⊙ | ○ |
| 30 | ⊙ | ⊙ | ⊙ | ⊙ | ⊙ |
| 31 | ⊙ | ○ | ⊙ | ⊙ | ⊙ |
| 32 | ⊙ | ⊙ | ⊙ | ⊙ | ⊙ |
| 33 | ⊙ | ⊙ | ⊙ | ⊙ | ⊙ |
| 34 | ⊙ | ⊙ | ⊙ | ⊙ | ⊙ |
| 35 | ⊙ | ⊙ | ○ | ⊙ | ⊙ |

For color filters having a blue pattern formed thereon:

⊙: the transmittance at 460 nm is 85% and the transmittance at 545 nm and 610 nm is less than 10%

○: the transmittance at 460 nm is 85% and the transmittance at 545 nm and 610 nm is in the range of 10% to 20%

X: the transmittance at 460 nm is 85% and the transmittance at 545 nm and 610 nm exceeds 20%

Further, the lightfastness as shown in Tables 13, 15 and 17 was determined by placing a sample in a xenone tester for lightfastness (irradiation dose of 100,000 luxes), measuring the absorbance before and after testing, and evaluating the residual ratio of absorbance with time as divided into three classes as below:

⊚: the residual ratio of absorbance after 100 hours exceeds 80%

○: the residual ratio of absorbance after 100 hours is in the range of 10% to 20%

X: the residual ratio of absorbance after 100 hours is less than 70%

Further, the heat-resistance as shown in Tables 13, 15 and 17 was determined by heating a sample in a heated air-drier at 230° C. for one hour, determining the absorbance before and after heating, and evaluating the heat-resistance from the residual ratio of absorbance as divided into two classes as below:

⊚: the residual ratio of absorbance exceeds 92%

X: the residual ratio of absorbance is less than 92%

Furthermore, the solvent-resistance as shown in Tables 13, 15 and 17 was determined by immersing a sample in diethylene glycol dimethyl ether at room temperature, and evaluating the time up to the commence of elution of dye as divided into three classes as below:

⊚: the time exceeds one minute

○: the time is in the range of 30 seconds to one minute

X: the time is less than 30 seconds

EXAMPLE 36

A photosensitive resin coloring composition (coating solution) for a green color filter as a first coloring material was prepared by dissolving 3.5 g of a green dye (quinizarine dye (35)) and 1.8 g of toning yellow dye (anthraquinone dye (4)) as a first coloring material in 50 g of the same solution (nonvolatile content of 15%) of the photosensitive resin (1) as in Example 1 shown in Table 11 in diethylene glycol dimethyl ether. The coating solution was spin-coated on a glass substrate by a spin-coater so as to have a membrane thickness following the drying of the solvent set to 2 μm. Then, the coating was pre-baked at 60° C. for 20 minutes to form a first color-coloring layer [First step].

Subsequently, the layer was exposed to light through the medium of a photomask for the formation of a pattern [Second step].

Then, the exposed colored layer was developed with an aqueous 1% sodium carbonate solution, washed with water, post-baked at 200° C. for 10 minutes to form a green pattern as a first coloring material thereon [Third step].

A photosensitive resin coloring composition (coating solution) for a red color filter as a second coloring material was prepared by dissolving 3.0 g of a red dye (quinizarine dye (5)) and 2.5 g of a toning yellow dye (anthraquinone dye (8)) as a second coloring material in 50 g of the same solution (nonvolatile content of 15%) of the photosensitive resin (1) as in Example 17 shown in Table 14 in diethylene glycol dimethyl ether. The resultant coating solution was further spin-coated on the substrate having a green pattern formed thereon by repeating the first to third steps above, without any formation of an intermediate productive film thereon.

A photosensitive resin coloring composition (coating solution) for a blue color filter as a third coloring material was prepared by dissolving 3.5 g of a blue dye (phthalocyanine dye (26)) and 2.5 g of a blue dye (quinizarine dye (42)) as a second coloring material in 50 g of the same solution (nonvolatile content of 15%) of the photosensitive resin (4) as in Example 29 shown in Table 16 in diethylene glycol dimethyl ether. The resultant coating solution was further spin-coated on the substrate having a green pattern and a red pattern formed thereon by repeating the first to third steps above, without any formation of an intermediate productive film thereon, to obtain a color filter having a green pattern, a red pattern and a blue pattern formed thereon.

The color smear (color migration) in the course of spin coating with the photosensitive resin coloring composition (coating solution) for the each of the color filters and of the color filter having the primary color patterns formed thereon was evaluated visually. As a result, there was no color smear and a good color filter was obtained.

EXAMPLES 37 TO 51

A photosensitive resin coloring composition (coating solution) for a red color filter as a second coloring material was prepared by dissolving 3.0 g of a red dye (quinizarine dye (5)) and 2.5 g of a toning yellow dye (anthraquinone dye (8)) as a second coloring material in 50 g of the same solution (nonvolatile content of 15%) of the photosensitive resin (1) as in Example 17 shown in Table 14 in diethylene glycol dimethyl ether. The resultant coating solution was spin-coated by a spin-coater so as to have a membrane thickness following the drying of the solvent set to 2 μm on the substrates obtained in Examples 2 to 16 and having a green pattern formed thereon, without any formation of an intermediate productive film thereon. Then, the coating was pre-baked at 60° C. for 20 minutes, and subjected to the second and third processes to obtain a color filter having a green pattern and a red pattern formed thereon.

The color smear (color migration) in the course of spin coating with the photosensitive resin coloring compositions (coating solution) for the red color filter and of the color filter having the primary color patterns formed thereon was evaluated visually. As a result, there was no color smear and a good color filter was obtained.

EXAMPLES 52 TO 63

A photosensitive resin coloring composition (coating solution) for a blue color filter as a second coloring material was prepared by dissolving 3.5 g of a blue dye (phthalocyanine dye (26)) and 2.5 g of a blue dye (quinizarine dye (42)) as a second coloring material in 50 g of the same solution (nonvolatile content of 15%) of the photosensitive resin (4) as in Example 29 shown in Table 16 in diethylene glycol dimethyl ether. The resultant coating solution was spin-coated by a spin-coater so as to have a membrane thickness following the drying of the solvent set to 2 μm on the substrates obtained in Examples 17 and to 28 and having a red pattern formed thereon, without any formation of an intermediate productive film thereon. Then, the coating was pre-baked at 60° C. for 20 minutes, and subjected to the second and third processes to obtain a color filter having a red pattern and a blue pattern formed thereon.

The color smear (color migration) in the course of spin coating with the photosensitive resin coloring compositions (coating solution) for the blue color filter and of the color filter having the primary color patterns formed thereon was evaluated visually. As a result, there was no color smear and a good color filter was obtained.

EXAMPLES 64 TO 70

A photosensitive resin coloring composition (coating solution) for a green color filter as a second coloring material was prepared by dissolving 3.5 g of a green dye (quinizarine dye (35)) and 1.8 g of a toning yellow dye (anthraquinone dye (4)) as a second coloring material in 50 g of the same solution (nonvolatile content of 15%) of the photosensitive resin (1) as in Example 1 shown in Table 12 in diethylene glycol dimethyl ether. The resultant coating solution was spin-coated by a spin-coater so as to have a membrane thickness following the drying of the solvent set to 2 μm on the substrates obtained in Examples 29 to 35 and having a blue pattern formed thereon, without any formation of an intermediate productive film thereon. Then, the coating was pre-baked at 60° C. for 20 minutes, and subjected to the second and third processes to obtain a color filter having a blue pattern and a green pattern formed thereon.

The color smear (color migration) in the course of spin coating with the photosensitive resin coloring compositions (coating solution) for the green color filter and of the color filter having the primary color patterns formed thereon was evaluated visually. As a result, there was no color smear and a good color filter was obtained.

EXAMPLE 71

The dyes obtained in Examples 1 to 35 and Examples 36 to 70 were respectively dissolved at room temperature (about 20° C.) in toluene, diethylene glycol dimethyl ether (used solvent A), a mixed solvent of diethylene glycol dimethyl ether/cyclohexane [=8/2 (weight ratio)] (used solvent B), and a mixed solvent of diethylene glycol dimethyl ether/propylene glycol monomethylether acetate [=6/4 (weight ratio)] (used solvent C), as an used solvent, to prepare saturated solutions thereof. The resultant saturated solutions were filtered with a filter with a pore diameter of 0.2 μm, and thereafter the was measured by the concentration thereof.

The results are shown in Tables 18 to 21.

TABLE 18

| | Solubility of green dye | | | |
|---|---|---|---|---|
| Kind of dye | In toluene | In used solvent A | In used solvent B | In used solvent C |
| Quinizarine dye (35) | ○ | ◎ | | |
| Quinizarine dye (37) | ◎ | | ◎ | |
| Quinizarine dye (38) | ○ | | ◎ | |
| Quinizarine dye (40) | ◎ | ◎ | | |
| Quinizarine dye (44) | ◎ | | | ◎ |
| Quinizarine dye (55) | ○ | ◎ | | |
| Quinizarine dye (58) | ○ | | ◎ | |
| Phthalocyanine dye (2) | ◎ | ◎ | | |
| Phthalocyanine dye (3) | ◎ | | | ◎ |
| Phthalocyanine dye (7) | ◎ | | ◎ | |
| Phthalocyanine dye (10) | ◎ | ◎ | | |
| Phthalocyanine dye (13) | ◎ | ◎ | | |
| Phthalocyanine dye (15) | ◎ | ◎ | | |
| Phthalocyanine dye (18) | ◎ | | ◎ | |
| Phthalocyanine dye (19) | ◎ | | | ◎ |
| Phthalocyanine dye (20) | ◎ | ◎ | | |

Note)
◎; refers to the solubility to a solvent of not less than 4% by weight.
○; refers to the solubility to a solvent in the range of 2 to 4% by weight.

TABLE 19

| | Solubility of red dye | | | |
|---|---|---|---|---|
| Kind of dye | In toluene | In used solvent A | In used solvent B | In used solvent C |
| Quinizarine dye (5) | ◎ | ◎ | | |
| Quinizarine dye (10) | ◎ | | | ◎ |

TABLE 19-continued

| | Solubility of red dye | | | |
|---|---|---|---|---|
| Kind of dye | In toluene | In used solvent A | In used solvent B | In used solvent C |
| Quinizarine dye (11) | ◎ | | ◎ | |
| Quinizarine dye (16) | ◎ | ◎ | | |
| Quinizarine dye (20) | ○ | | | ◎ |
| Quinizarine dye (23) | ◎ | ◎ | | |
| Quinizarine dye (25) | ◎ | ◎ | | |
| Quinizarine dye (27) | ◎ | | | ◎ |
| Quinizarine dye (30) | ○ | | ◎ | |
| Quinizarine dye (54) | ○ | | ◎ | |

Note)
◎; refers to the solubility to a solvent of not less than 4% by weight.
○; refers to the solubility to a solvent in the range of 2 to 4% by weight.

TABLE 20

| | Solubility of toning yellow dye | | | |
|---|---|---|---|---|
| Kind of dye | In toluene | In used solvent A | In used solvent B | In used solvent C |
| Anthraquinone dye (4) | ○ | ◎ | ◎ | ◎ |
| Anthraquinone dye (8) | ◎ | ◎ | ◎ | ◎ |
| Anthraquinone dye (9) | ◎ | | ◎ | |
| Anthraquinone dye (10) | ◎ | | | ◎ |
| Anthraquinone dye (11) | ◎ | ◎ | | ◎ |
| Anthraquinone dye (13) | ◎ | ◎ | | |
| Anthraquinone dye (14) | ◎ | ◎ | | |
| Anthraquinone dye (15) | ◎ | | | ◎ |
| Anthraquinone dye (16) | ◎ | ◎ | ◎ | |
| Anthraquinone dye (17) | ◎ | ◎ | ◎ | |
| Anthraquinone dye (22) | ◎ | ◎ | | |
| Anthraquinone dye (24) | ◎ | ◎ | | |

Note)
◎; refers to the solubility to a solvent of not less than 4% by weight.
○; refers to the solubility to a solvent in the range of 2 to 4% by weight.

TABLE 21

| | Solubility of blue dye | | | |
|---|---|---|---|---|
| Kind of dye | In toluene | In used solvent A | In used solvent B | In used solvent C |
| Phthalocyanine dye (26) | ◎ | ◎ | | ◎ |
| Phthalocyanine dye (29) | ◎ | ◎ | ◎ | |
| Phthalocyanine dye (33) | ◎ | ◎ | | ◎ |
| Quinizarine dye (42) | ◎ | ◎ | | |
| Quinizarine dye (43) | ◎ | | ◎ | |
| Anthraquinone dye (19) | ○ | ◎ | | |
| Anthraquinone dye (20) | ◎ | ◎ | | ◎ |
| Anthraquinone dye (28) | ◎ | | | ◎ |

Note)
◎; refers to the solubility to a solvent of not less than 4% by weight.
○; refers to the solubility to a solvent in the range of 2 to 4% by weight.

Then, the physical and chemical properties of the novel anthraquinone compounds produced in Examples 72 to 88 and the products using the same are shown in Tables 22 to 24. The solubility shown in the Tables 22 to 24 represents in three types as below: Δ represents as a solubility of less than 1% by weight, ○ represents as a solubility in the range of 1 to 3% by weight, ◎ represents as a solubility of not less than 3% by weight. The numbers put in parentheses as "dye ( )" following the descriptions of novel anthraquinones produced in Examples 72 to 95 are the same as those described before the parts for the anthraquinone compounds represented by the formula (4) which is specifically described above.

EXAMPLES 72 AND 73

2 g of 1,2,3,4-Tetrafluoroanthraquinone and 20 g of 2,6-dichloroaniline were charged in a 50 cc, four necked flask and then the reaction was carried out at 230° Cl for about 8 hours. After completion of reaction, 2,6-dichloroaniline was distilled out from the reaction solution, and a column purification thereof using a column with a silica gel was effected to give rise to 1.39 g of 2-(2,6-dichloroanilino)-1,3,4-trifluoroanthraquinone (Dye 10') (yield 46.1 mol %) and 0.78 g of 2,3-bis(2,6-dichloroanilino)-1,4-difluoroanthraquinone (Dye 25') (yield 19.4 mol %). The physical properties of Dye 10' and analytical values defining the compound are tabulated in Table 22 and the physical properties of Dye 25' and analytical values defining the compound are tabulated in Table 23.

EXAMPLES 74 AND 75

2 g of 1,2,3,4-Tetrafluoroanthraquinone, 24 g of 2,3,5,6-tetrafluoroaniline and 35 ml of α-chloronaphthalene were charged in a 50 cc, four necked flask, and then the reaction was carried out at 220° C. for about 40 hours. After completion of reaction, α-chloronapthalene and 2,3,5,6-tetrafluoroaniline were distilled out from the reaction solution, and a column purification using a column with a silica gel was effected to give rise to 1.59 g of 2-(2,3,5,6-tetrafluoroanilino)-1,3,4-trifluoroanthraquinone (Dye 12') (yield52.4 mol %) and 0.47 g of 2,3-bis(2,3,5,6-tetrafluoroanilino)-1,4-difluoroanthraquinone (Dye 28') (yield 11.5 mol %). The physical properties of Dye 12' and analytical values defining the compound are tabulated in Table 22 and the physical properties of Dye 28' and analytical values defining the compound are tabulated in Table 23.

EXAMPLES 76 AND 77

2 g of 1,2,3,4-Tetrafluoroanthraquinone and 30 g of 2,3,5,6-tetrachloroaniline were charged in a 50 cc, four necked flask and then the reaction was carried out at 210° C. for about 10 hours. After completion of reaction, 2,3,5,6-tetrachloroaniline was distilled out from the reaction solution and a column purification thereof using a column with a silica gel was effected to give rise to 0.62 g of 2-(2,3,5, 6-tetrachloroanilino)-1,3,4-trifluoroanthraquinone (Dye 11') (yield 17.8 mol %) and 0.53 g of 2,3-bis(2,3,5,6-tetrachloroanilino)-1,4-difluoroanthraquinone (Dye 27') (yield 10.6 mol %). The physical properties of Dye 11' and analytical values defining the compound are tabulated in Table 22 and the physical properties of Dye 27' and analytical values defining the compound are tabulated in Table 23.

EXAMPLES 78 AND 79

2 g of 1,2,3,4-Tetrafluoroanthraquinone and 25 g of o-anisidine were charged in a 50 cc, four necked flask and then the reaction was carried out at 50° C. for about 4 hours. After completion of reaction, o-anisidine was distilled out from the reaction solution and then a column purification using a column with a silica gel was effected to give rise to 1.91 g of 2-(o-methoxyanilino)-1,3,4-trifluoroanthraquinone (Dye 6') (yield 69.8 mol %) and 0.85 g of 2,3,-bis(o-methoxyanilino-1,4-difluoroanthraquinone (Dye 19') (yield 24.5 mol %). The physical properties of Dye 6' and analytical values defining the compound are tabulated in Table 23 and the physical properties of Dye 19' and analytical values defining the compound are tabulated in Table 24.

EXAMPLES 80 AND 81

2 g of 1,2,3,4-Tetrafluoroanthraquinone and 25 g of 2-methoxy-6-methylaniline were charged in a 5 cc, four necked flask and then the reaction was carried out at 80° C. for about 4 hours. After completion of reaction, 2-methoxy-6-methylaniline was distilled out from the reaction solution, and a column purification using a column with a silica gel was effected to give rise to 1.04 g of 2-(2-methoxy-6-methylanilino)-1,3,4-trifluoroanthraquinone (Dye 7') (yield 36.7 mol %) and 1.05 g of 2,3-bis(2-methoxy-6-methylanilino)-1,4-difluoroanthraquinone (Dye 20') (yield 28.6 mol %). The physical properties of Dye 7' and analytical values defining the compound are tabulated in Table 23 and the physical properties of Dye 20' and analytical values defining the compound are tabulated in Table 24.

EXAMPLES 82 AND 83

2 g of 1,2,3,4-Tetrafluoroanthraquinone and 25 g of 2-chloro-6-methylaniline were charged in a 50 cc, four necked flask and then the reaction was carried out at 140° C. for about 6 hours. After completion of reaction, 2-chloro-6-methylaniline was distilled out from the reaction solution and a column purification thereof was effected to give rise to 1.07 g of 2-(2-chloro-6-methylanilino)-1,3,4-trifluoroanthraquinone (Dye 8') yield 37.3 mol %) and 0.78 g of 2,3-bis(2-chloro-6-methylanilino)-1,4-difluoroanthraquinone (Dye 21') (yield 24.2 mol %). The physical properties of Dye 8' and analytical values defining the compound are tabulated in Table 22 and the physical properties of Dye 21' and analytical values defining the compound are tabulated in Table 24.

EXAMPLE 84

1,2,3,4-Tetrafluoroanthraquinone and 25 g of p-cyanoaniline were charged in a 50 cc, four necked flask and then the reaction was carried out at 150° C. for about 3 hours. After completion of reaction, p-cyanoaniline was distilled out from the reaction solution and then a column purification using a column with a silica gel was effected to give rise to 2.46 g of 2,3-bis(p-cyanoanilino)-1,4-difluoroanthraquinone (Dye 18') (yield 72,3 mol %). The physical properties of Dye 18' and analytical values defining the compound are tabulated in table 23.

EXAMPLE 85

Figure 6:
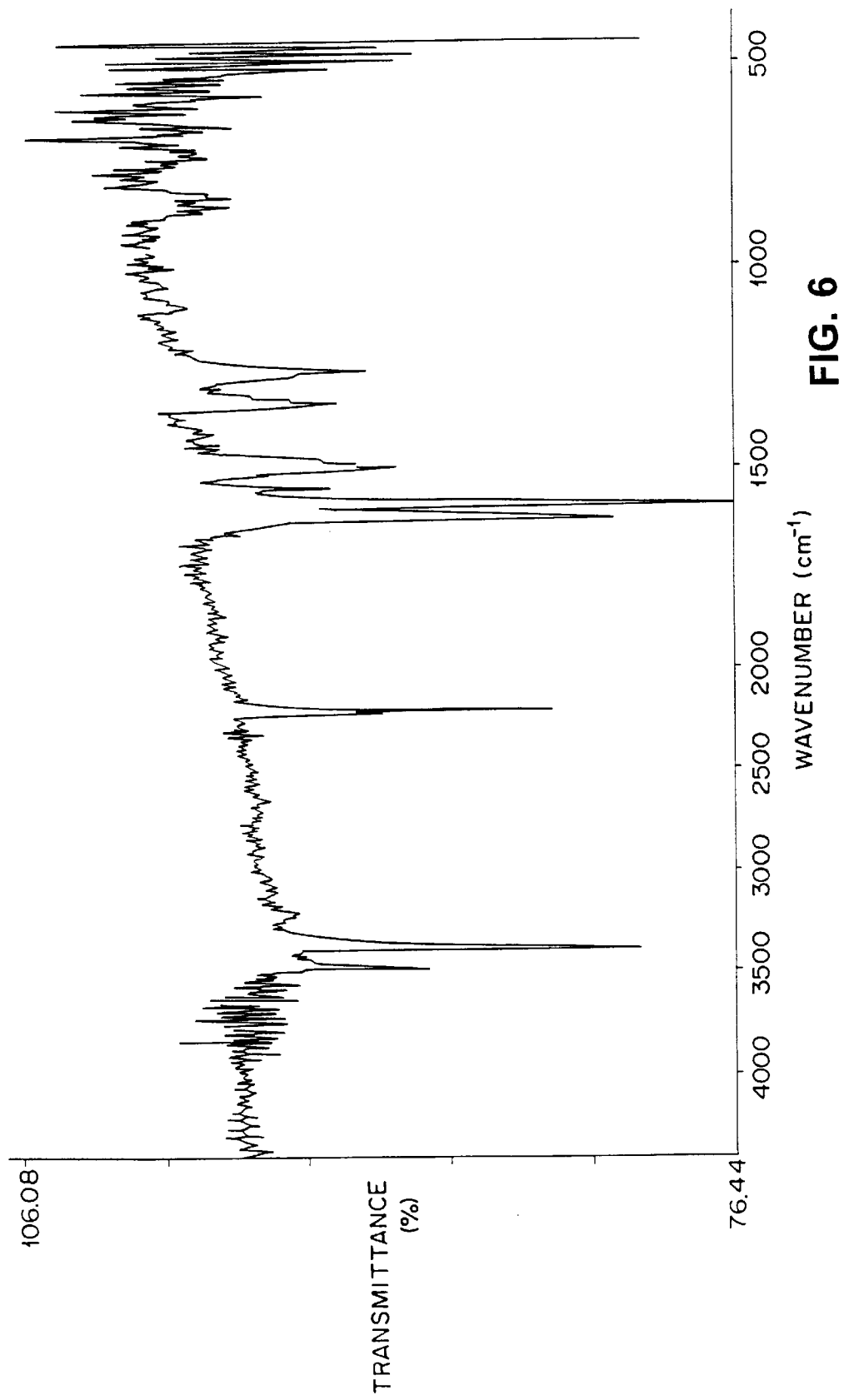
FIG. 6 is a chart showing an infrared spectrum of 2,3-bis (3,4-dicyanoanilino)-1,4-difluoroanthraquinone [dye (55')].

2 g of 1,2,3,4-Tetrafluoroanthraquinone, 35 g of 3,4-dicyanoaniline and 60 ml of α-chloronaphthalene were charged in a 200 cc, four necked flask and then the reaction was carried out at 180° C. for about 9 hours. After completion of reaction, 3,4-dicyanoaniline and α-chloronaphthalene were distilled out from the reaction solution and then a column purification using a column with a silica gel was effected to give rise to 2.95 g of 2,3-bis(3, 4-dicyanoanilino)-1,4-difluoroanthraquinone (Dye 26') (yield 78.5 mol %). The physical properties of Dye 26' and analytical values defining the compound are tabulated in Table 23. Its UV spectral is shown in FIG. 6.

EXAMPLE 86

1,2,3,4-Tetrafluoroanthraquinone and 25 g of 3-chloro-4-cyanoaniline were charged in a 50 cc, four necked flask and then the reaction was carried out at 150° C. for about 8 hours. After completion of reaction, 3-chloro-4-cyanoaniline was distilled out from the reaction solution and a column purification using a column with a silica gel was effected to give rise to 1.14 g of 2,3-bis(3-chloro-4-cyanoanilino)-1,4-difluoroanthraquinone (Dye 22') (yield 29.3 mol %). The physical properties of Dye 22' and analytical values defining the compound are tabulated in Table 23.

EXAMPLE 87

2 g of 1,2,3,4-Tetrafluoroanthraquinone and 25 g of 2,6-diisopropylaniline were charged in a 50 cc, four necked flask and the reaction was carried out at 180° C. for about 6 hours. After completion of reaction, 2,6-diisopropylaniline was distilled out from the reaction solution and a column purification using a column with a silica gel was effected to give rise to 2.96 g of 2,3-bis(2,6-diisopropylanilino)-1,4-difluoroanthraquinone (Dye 24') (yield 69.7 mol %). The physical properties of Dye 24' and analytical values defining the compound are tabulated in Table 24.

EXAMPLE 88

2 g of 1,2,3,4-Tetrafluoroanthraquinone and 25 g of 2,6-diethylaniline were charged in a 50 cc, four necked flask and the reaction was carried out at 160° C. for about 8 hours. After completion of reaction, 2,6-diethylaniline was distilled out from the reaction solution and then a column purification using a column with a silica gel was effected to give rise to 2.87 g of 2,3-bis(2,6-diethylanilino)-1,4-difluoroanthraquinone (Dye 23') (yield 74.6 mol %). The physical properties of Dye 23' and analytical values defining the compound are tabulated in table 24.

TABLE 22

| Pigment No. | $\lambda$ max (nm) $\epsilon$ (in toluene) | Solubility In toluene | In MEK | Mass spectrum | | Elemental analysis C (%) | H (%) | N (%) | F (%) | Cl (%) | Color tone |
|---|---|---|---|---|---|---|---|---|---|---|---|
| (10$^+$) | 462 | ⊚ | ○ | 422 (M$^+$, 40) | Theoretical value | 56.90 | 1.91 | 3.32 | 13.50 | 16.79 | Yellow |
|  | $\epsilon$: 6210 |  |  | 423 (M$^+$, 35) | Measured value | 56.92 | 1.89 | 3.35 | 13.47 | 16.83 |  |
|  |  |  |  | 387 (M$^+$ −25, 100) |  |  |  |  |  |  |  |
| (12$^+$) | 450 | ⊚ | ○ | 425 (M$^+$, 100) | Theoretical value | 56.49 | 1.42 | 3.29 | 31.27 |  | Yellow |
|  | $\epsilon$: 6520 |  |  | 405 (M$^+$ −20, 40) | Measured value | 56.47 | 1.43 | 3.26 | 31.29 |  |  |
| (11$^+$) | 458 | ⊚ | ○ | 490 (M$^+$, 40) | Theoretical value | 46.92 | 1.23 | 2.85 | 11.01 | 26.68 | Yellow |
|  | $\epsilon$: 9520 |  |  | 491 (M$^+$, 20) | Measured value | 48.95 | 1.21 | 2.87 | 11.56 | 28.89 |  |
|  |  |  |  | 453 (M$^+$ −96, 90) |  |  |  |  |  |  |  |
|  |  |  |  | 419 (M$^+$ −72, 100) |  |  |  |  |  |  |  |
| (8$^+$) | 471 | ⊚ | ○ | 401 (M$^+$, 60) | Theoretical value | 62.78 | 2.76 | 3.49 | 14.19 | 8.82 | Orange |
|  | $\epsilon$: 5570 |  |  | 365 (M$^+$, −36, 100) | Measured value | 62.75 | 2.77 | 3.52 | 14.14 | 8.81 |  |

TABLE 23

| Pigment No. | $\lambda$ max (nm) $\epsilon$ (in toluene) | Solubility In toluene | in MEK | Mass spectrum | | Elemental analysis C (%) | H (%) | N (%) | F (%) | Cl (%) | Color tone |
|---|---|---|---|---|---|---|---|---|---|---|---|
| (25$^+$) | 551 | ⊚ | ○ | 565 (M$^+$, 60) | Theoretical value | 55.35 | 2.14 | 4.97 | 6.73 | 25.13 | Purple |
|  | $\epsilon$: 5260 |  |  | 630 (M$^+$ −35, 100) | Measured value | 55.38 | 3.11 | 5.01 | 6.65 | 25.15 |  |
|  |  |  |  | 425 (M$^+$ −70, 80) |  |  |  |  |  |  |  |
| (28$^+$) | 538 | ⊚ | ○ | 570 (M$^+$, 100) | Theoretical value | 54.75 | 1.41 | 4.91 | 83.51 |  | Magenta |
|  | $\epsilon$: 6850 |  |  | 551 (M$^+$ −19, 20) | Measured value | 54.77 | 1.43 | 4.87 | 83.28 |  |  |
| (27$^+$) | 545 | ⊚ | Δ | 701 (M$^+$, 50) | Theoretical value | 44.49 | 1.15 | 3.99 | 5.41 | 40.40 | Purple |
|  | $\epsilon$: 3470 |  |  | 667 (M$^+$ −34, 70) | Measured value | 44.52 | 1.13 | 4.01 | 5.89 | 40.42 |  |
|  |  |  |  | 631 (M$^+$ −70, 100) |  |  |  |  |  |  |  |
| (6$^+$) | 503 | ○ | Δ | 883 (M$^+$, 100) | Theoretical value | 65.80 | 3.16 | 3.65 | 14.87 |  | Magenta |
|  | $\epsilon$: 6330 |  |  | 368 (M$^+$ −15, 30) | Measured value | 65.88 | 3.19 | 3.62 | 14.85 |  |  |
|  |  |  |  | 346 (M$^+$ −38, 70) |  |  |  |  |  |  |  |
| (7$^+$) | 489 | ○ | Δ | 397 (M$^+$, 100) | Theoretical value | 68.50 | 3.45 | 3.52 | 14.34 |  | Cyan |
|  | $\epsilon$: 4530 |  |  | 362 (M$^+$ −35, 60) | Measured value | 68.52 | 3.54 | 3.65 | 14.30 |  |  |
| (18$^+$) | 568 | Δ | Δ | 476 (M$^+$, 100) | Theoretical value | 70.59 | 2.96 | 11.76 | 7.93 |  | Purple |
|  | $\epsilon$: 8310 |  |  | 455 (M$^+$ −19, 10) | Measured value | 70.62 | 2.96 | 11.77 | 7.95 |  |  |
| (26$^+$) | 540 | ○ | Δ | — | Theoretical value | 68.44 | 2.30 | 15.96 | 7.28 |  | Magenta |
|  | $\epsilon$: 3860 |  |  |  | Measured value | 68.48 | 2.31 | 15.92 | 7.20 |  |  |
| (22$^+$) | 553 | Δ | Δ | 545 (M$^+$, 60) | Theoretical value | 61.67 | 2.22 | 10.27 | 6.97 | 18.00 | Magenta |
|  | $\epsilon$: 4120 |  |  | 225 (M$^+$ −323, 100) | Measured value | 61.69 | 2.19 | 10.28 | 6.94 | 13.01 |  |

TABLE 24

| Pigment No. | $\lambda$ max (nm) $\epsilon$ (in toluene) | Solubility In toluene | In MEK | Mass spectrum | | Elemental analysis C (%) | H (%) | N (%) | F (%) | Cl (%) | Color tone |
|---|---|---|---|---|---|---|---|---|---|---|---|
| (19$^+$) | 610 | ○ | Δ | 486 (M$^+$, 100) | Theoretical value | 69.13 | 4.14 | 5.76 | 7.81 |  | Blue |
|  | $\epsilon$: 9420 |  |  | 451 (M$^+$ −35, 30) | Measured value | 69.11 | 4.11 | 5.79 | 7.84 |  |  |
| (20$^+$) | 619 | ○ | Δ | 514 (M$^+$, 100) | Theoretical value | 70.09 | 4.70 | 5.44 | 7.38 |  | Blue |
|  | $\epsilon$: 6390 |  |  | 479 (M$^+$ −35, 20) | Measured value | 70.00 | 4.71 | 5.42 | 7.38 |  |  |
| (21$^+$) | 591 | ○ | Δ | 523 (M$^+$, 100) | Theoretical value | 64.26 | 3.47 | 5.35 | 7.26 | 13.55 | Blue |
|  | $\epsilon$: 6590 |  |  | 489 (M$^+$ −35, 80) | Measured value | 64.33 | 3.48 | 5.32 | 7.27 | 13.56 |  |

TABLE 24-continued

| Pigment No. | λ max (nm) ε (in toluene) | Solubility In toluene | In MEK | Mass spectrum | | Elemental analysis C (%) | H (%) | N (%) | F (%) | Cl (%) | Color tone |
|---|---|---|---|---|---|---|---|---|---|---|---|
| (24*) | 612 | ⊙ | ⊙ | 695 (M+, 100) | Theoretical value | 76.74 | 8.78 | 4.71 | 6.39 | | Blue |
| | | | | 669 (M+ −36, 20) | Measured value | 76.76 | 8.79 | 4.69 | 6.37 | | |
| (23*) | 614 | ⊙ | ⊙ | 538 (M+, 60) | Theoretical value | 75.82 | 5.99 | 5.20 | 7.05 | | Blue |
| | | | | 510 (M+ −28, 20) | Measured value | 76.85 | 5.98 | 5.29 | 7.01 | | |
| | | | | 148 (M+ −392, 100) | | | | | | | |

EXAMPLE 89

4 g of Dye 12' were dissolved in a 50 g of diethyleneglycol diethylether solution (nonvolatile rate: 15% by weight) of the above photosensitive resin (1) (a binder resin: 61 parts of resin (1) (a resin having an average weight molecular weight of 10,000 to 100,000, composed of 5 mol % of styrene, 22 mol % of 2-hydroxyethyl methacrylate, 54 mol % of ethyl methacrylate and 19 mol % of methacrylic acid); 36 parts of a monomer: trimethylolpropane trimethacrylate; and 4 parts of a photopolymerization initiator: Irgacure 907), and then using the resultant mixture a spin-coat with a thickness of 2 μm, after drying the solvent used, was formed on a glass substrate using a spinecoater. After pre-bake at 60° C. for 20 minutes, it was exposed using a photomask for forming a pattern. The exposure was developed with an 1% aqueous sodium carbonate solution, washed with water, and then post baked at 200° C. for 10 minutes to make a color filter./

The resultant filter has distinct yellow tone without turbidity and with transparency. A light-resisting test therefor was performed using a xenon lamp light-resisting tester (SUNTESST CPS HERAEUS Company) (black panel temperature: 63° C.), as a result, the change of the tone was not found at all thus the light-resisting property is very excellent.

In addition, a heat-resistant test was performed using a hot air dryer in conditions of 200° C. for 1 hour, as a result the change of the tone was not found at all thus the heat-resistant property is very excellent.

EXAMPLE 90

The procedure of Example 89 was repeated except that Dye 11' was adopted instead of Dye 12', to make a color filter.

The resultant filer has distinct yellow tone without turbidity and with transparency. Though the light-resisting and heat resistant tests were performed like Example 89, the changes of the tone therefor were not found and thus the light-resisting and heat resistant properties are very excellent.

EXAMPLE 91

The procedure of Example 89 was repeated except that Dye 28' was adopted instead of Dye 12', to make a color filter.

The resultant filer has distinct magenta tone without turbidity and with transparency. Though the light-resisting and heat resistant tests were performed like Example 89, the changes of the tone therefor were not found and thus the light-resisting and heat resistant properties are very excellent.

EXAMPLE 92

The procedure of Example 89 was repeated except that Dye 24' was adopted instead of Dye 12', to make a color filter.

The resultant filer has distinct blue tone without turbidity and with transparency. Though the light-resisting and heat resistant tests were performed like Example 89, the changes of the tone therefor were not found and thus the light-resisting and heat resistant properties are very excellent.

EXAMPLE 93

The procedure of Example 89 was repeated except that 1.5 g of Dye 12' and 3.5 g of Dye 28' were adopted instead of 4 g of Dye 12', to make a color filter.

The resultant filer has distinct red tone without turbidity and with transparency. Though the light-resisting and heat resistant tests were performed like Example 89, the changes of the tone therefor were not found and thus the light-resisting and heat resistant properties are very excellent.

EXAMPLE 94

The procedure of Example 89 was repeated except that 2.5 g of Dye 12' and 3 g of Dye 24' were adopted instead of 4 g of Dye 12', to make a color filter.

The resultant filer has distinct green tone without turbidity and with transparency. Though the light-resisting and heat resistant tests were performed like Example 89, the changes of the tone therefor were not found and thus the light-resisting and heat resistant properties are very excellent.

EXAMPLE 95

0.5 g of 2(2,3,5,6-Tetrafluoroanilino)-1,3,4-trifluoroanthraquinone (Dye 12'), 2,2 g of phenol and 250 ml of isopropyl alcohol were charged in a 300 cc, four necked flask, after dissolving by heat 0.066 g of potassium hydroxide was added therein and the reaction was carried out for about 6 hours. After completion of reaction, the undissolved was filtrated out and then isopropyl alcohol and phenol were distilled out from the reaction solution, a column purification using a column with a silica gel to give rise to 0.43 g of 3-(2,3,5,6-tetrafluoroanilino)-(1 or 2)-phenoxy-(2 or 1), 4-difluoanthraquinone (yield 73.2 mol %). The physical properties and analytical values defining the compound are shown below:

(a) Visual light absorption spectral (in diethyleneglycol dimethylether)
  λ max 443 (ε: 5600)
(b) Mass spectral
  m/e=499 (M+, 100)
  m/e=482 (M+−17,20)
(c) Elemental analysis

| | C (%) | H (%) | N (%) | F (%) |
|---|---|---|---|---|
| Calculated | 62.54 | 2.22 | 2.80 | 22.83 |
| Found | 62.59 | 2.25 | 2.76 | 22.77 |

The photosensitive colored composition for color filters of the present invention has an absorption in the visual range of 400 to 700 nm, is excellent in solubility against the resin, further excellent in light-resisting and heat resistant properties, has no turbidity but has feeling of transparency, and has each dyes of RGB excellent in tones, and therefore can provide the solution for the conventional problems. As a result, in accordance with the color filter using the photosensitive resin colored composition for color filters, excellent properties can be provided such as depolarization, transmittance, lightfastness heat resistance and solvent resistance.

The present invention invents a photosensitive resin colored composition for color filters in which RGB each color occupy as large triangle as possible in the chromaticity diagram and color filter using the same, and provides one satisfying such a need under the conditions required for higher performance.

In accordance with the process for the production of color filters of the present invention, since the colored layer is formed using dyes and resins, in particular compatible with a high molecular weight photosensitive resin, the color filter is excellent in sensitivity in the case of photocure (patterning) without the fear of mixed color even if the mixed color preventing treatment such as the intermediate preventing film is carried out. In addition to the above, by adopting photosensitive resins including acrylic resin as the resin, there is no need to provide another resist layer in the case of using epoxy resins, and thus it is not necessary to effect the complicated procedures and can decrease the step numbers, namely it can simplify the steps and equipments of the procedure and also can provide effective production and thus it is very economical. Furthermore, because of excellent tone and color of the present color filter it can provide high transmittance and contrast, and also by adopting the soluble dye of the present invention, it can further provide properties such as heat resistant, light-resisting, durability and chemicals resistant properties.

In addition, in the novel anthraquinone compound of the present invention, by introducing an anilino group, which may be substituted, in the positions 1, 2, 3 and 4 of anthraquinone structure, the number of the substituents being one to three, and also in the position of either 2 or 3, it can control the absorption wave length correspondence to the purpose of the present invention in the absorption wave length of 400 to 650 nm, and also can provide the higher dissolving nature against the organic solvent and resins. In addition to the above, since the anthraquinone compound of the present invention has substituents in the prescribed positions compared to the conventional anthraquinone dye, the compound can maintain the light-resisting property which the anthraquinone structure itself holds, as a result, the compound can be applied in the fields in which visual light absorption dyes are not applied in accordance with the conventional art.

The color toner composition for electrophotograph, which is the use of the anthraquinone compound, is especially excellent in transparency, so that it can provide images having tones excellent in color re-production in colored images and also stable images having good light resisting property even under conditions of continuous copies.

The anthraquinone compound of the present invention used for sheets of heat sensitive, sublimation transcription record has excellently dissolving property against the solvents and binder resins used and also is excellent in hues as the yellow, magenta and/or blue. In addition to the above, in using for the heat sensitive sublimation transcription dyes, it is excellent in hues such as yellow, magenta and blue.

In addition, by using the anthraquinone compound of the present invention, it can provide a color filter excellent in light resisting property and without turbidity and with the feeling of transparency and also excellent in tones. Further, by using the anthraquinone compound, it can provide good prints with excellent in contrast and can provide an ink composition for inkjet by which record images excellent in light resisting property and tone can be obtained.

The entire disclosure of Japanese Patent Application Nos. 08-258,960 filed on Sep. 30, 1996, 08-271,006 filed on Oct. 14, 1996, 08-323,092 filed on Dec. 3, 1996, and 08-327,088 filed on Dec. 6, 2996 including specification, claims, drawings and summary are incorporated herein by reference in its entirety.

What is claimed is:

1. A photosensitive resin coloring composition for use in a color filter containing a resin and a dye which is a material for the formation of a colored layer of the color filter, characterized in that said dye is selected from a combination of (A)+(B) groups, a combination of (A)+(C) groups, a combination of (B)+(C) groups, and a combination of (A)+(B)+(C) groups, wherein (A) represents a group of quinizarine compounds having a quinizarine skeleton in which one to three of the 5, 6, 7, and 8 positions and at least either of the 6 and 7 positions are each occupied by a secondary amino group and the remainders of the 5, 6, 7, and 8 positions are occupied each by at least one group selected from the class consisting of hydrogen atom, halogen atom, an unsubstituted or substituted alkoxy group, an unsubstituted or substituted phenoxy group, or unsubstituted or substituted alkylthio group, and an unsubstituted or substituted phenylthio group, (B) represents a group of anthraquinone compounds having an anthraquinone skeleton in which one to three of the 1, 2, 3, and 4 positions are occupied each by at least one group selected from the class consisting of secondary amino group, an unsubstituted or substituted alkoxy group, an unsubstituted or substituted phenoxy group, an unsubstituted or substituted alkylthio group, and an unsubstituted or substituted phenylthio group and the remainders of the 1, 2, 3, and 4 positions are occupied each by hydrogen atom or a halogen atom, and (C) represents a group of phthalocyanine compounds having a phthalocyanine skeleton represented by the following general formula (1)

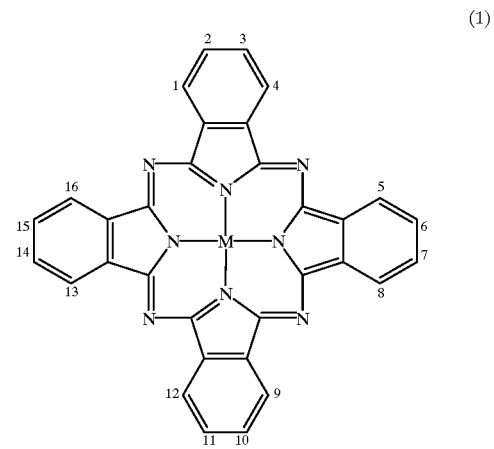

(1)

wherein M represents a divalent metal or a ligand-containing tetravalent metal in which one to eight of the 16 positions of benzene rings permitting substitution are occupied each by an unsubstituted or substituted alkoxy group and/or an unsubstituted or substituted phenoxy group and the remainders of the positions are occupied each by a halogen atom.

2. A photosensitive resin coloring composition according to claim 1, wherein the quinizarine compound (A) mentioned above is a quinizarine compound represented by the following general formula (2)

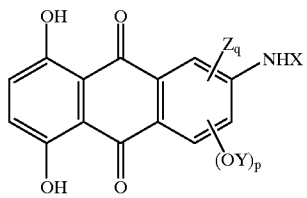

(2)

wherein Z represents a halogen atom or $NHX^2$, X, $X^2$, and Y independently represent an unsubstituted or substituted alkyl group or an unsubstituted or substituted aryl group, p and q each represent an integer of 0–3, providing P+q is not more than 3and, where p is 2 or over, the plurality of OY's are identical or different and each is a substituent and, where q is 2 or over, the plurality of Z's are identical or different and each is a substituent.

3. A photosensitive resin coloring composition according to claim 1, wherein the anthraquinone compound (B) is an anthraquinone compound represented by the following general formula (3)

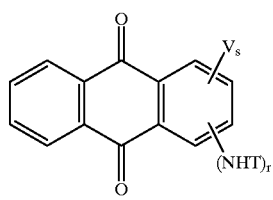

(3)

wherein V represents a halogen atom or OU, T and U independently represent an unsubstituted or substituted alkyl group, a cycloalkyl group, or an unsubstituted or substituted aryl group, r and s each represent an integer of 1–3, providing r+s is not more than 4 and, where s is 2 or over, the plurality of V's are identical or different and each is a substituent.

4. A photosensitive resin coloring composition according to claim 1, wherein the phthalocyanine compound (C) is such that in the general formula (1) mentioned above, the unsubstituted or substituted alkoxy group and/or the unsubstituted or substituted phenoxy group has at least three of the 2, 3, 6, 7, 10, 11, 14, and 15 positions occupied each by a substituent.

5. A photosensitive resin coloring composition according to claim 1, wherein the phthalocyanine compound (C) mentioned above is such that in the general formula (1) mentioned above, M represents a tetravalent metal containing a ligand, the number of phenoxy groups substituting in the benzene ring in the phthalocyanine skeleton is 3–5, and the total of atomic radii of the atoms minus hydrogen atoms contained in the substituent at the ortho position of that of the phenoxy groups which possesses a substituent at the ortho position is not less than 3.0 A and the remainders of the positions are occupied each by a fluorine atom.

6. A method for the production of a color filter by sequentially forming a plurality of color patterns on one surface of a substrate in accordance with a procedure comprising the steps of forming a colored layer for the formation of a color pattern with a photosensitive resin coloring composition and patterning the colored layer by a photolithographic technique, characterized by using a photosensitive resin coloring composition for use in a color filter according to any one of claims 1 through 5, forming a color pattern of a preceding stage and, without forming an intermediate protective film on the color pattern of the preceding state, forming a colored layer for the formation of a color pattern of the subsequent stage.

7. A photosensitive resin coloring composition according to claim 2, wherein the anthraquinone compound (B) is an anthraquinone compound represented by the following general formula (3)

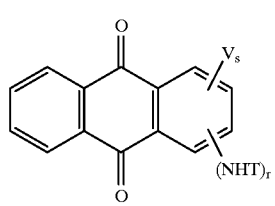

(3)

wherein V represents a halogen atom or OU, T and U independently represent an unsubstituted or substituted alkyl group, a cycloalkyl group, or an unsubstituted or substituted aryl group, r and s each represent an integer of 1–3, providing r+s is not more than 4 and, where s is 2 or over, the plurality of V's are identical or different and each is a substituent.

8. A photosensitive resin coloring composition according to claim 2 wherein the phthalocyanine compound (C) is such that in the general formula (1) mentioned above, the unsubstituted or substituted alkoxy group and/or the unsubstituted or substituted phenoxy group has at least three of the 2, 3, 6, 7, 10, 11, 14, and 15 positions occupied each by a substituent.

9. A photosensitive resin coloring composition according to claim 3 wherein the phthalocyanine compound (C) is such that in the general formula (1) mentioned above, the unsubstituted or substituted alkoxy group and/or the unsubstituted or substituted phenoxy group has at least three of the 2, 3, 6, 7, 10, 11, 14, and 15 positions occupied each by a substituent.

10. A photosensitive resin coloring composition according to claim 7 wherein the phthalocyanine compound (C) is such that in the general formula (1) mentioned above, the unsubstituted or substituted alkoxy group and/or the unsubstituted or substituted phenoxy group has at least three of the 2, 3, 6, 7, 10, 11, 14, and 15 positions occupied each by a substituent.

11. A photosensitive resin coloring composition according to claim 2 wherein the phthalocyanine compound (C) mentioned above is such that in the general formula (1) mentioned above, M represents a tetravalent metal containing a ligand, the number of phenoxy groups substituting in the benzene ring in the phthalocyanine skeleton is 3–5, and the total of atomic radii of the atoms minus hydrogen atoms contained in the substituent at the ortho position of that of the phenoxy groups which possesses a substituent at the ortho position is not less than 3.0 A and the remainders of the positions are occupied each by a fluorine atom.

12. A photosensitive resin coloring composition according to claim 3, wherein the phthalocyanine compound (C) mentioned above is such that in the general formula (1) mentioned above, M represents a tetravalent metal containing a ligand, the number of phenoxy groups substituting in the benzene ring in the phthalocyanine skeleton is 3–5, and the total of atomic radii of the atoms minus hydrogen atoms contained in the substituent at the ortho position of that of the phenoxy groups which possesses a substituent at the ortho position is not less than 3.0 A and the remainders of the positions are occupied each by a fluorine atom.

13. A photosensitive resin coloring composition according to claim 7, wherein the phthalocyanine compound (C) mentioned above is such that in the general formula (1) mentioned above, M represents a tetravalent metal containing a ligand, the number of phenoxy groups substituting in the benzene ring in the phthalocyanine skeleton is 3–5, and the total of atomic radii of the atoms minus hydrogen atoms contained in the substituent at the ortho position of that of the phenoxy groups which possesses a substituent at the ortho position is not less than 3.0 A and the remainders of the positions are occupied each by a fluorine atom.

14. A photosensitive resin coloring composition according to any of claims 1 through 5 and 7 through 13, wherein the resin mentioned above is an acrylic resin having a number average molecular weight of 30,000–200,000.

15. A color filter, characterized in that a photosensitive resin coloring composition for use in a color filter set forth in claim 14 is used as the material for the formation of the colored layer.

16. A color filter according to claim 15, characterized in that a photosensitive resin coloring composition for use in a color filter containing a dye composed of a quinizarine compound (A) such that in the general formula (2) described in Item (2) above, p represents a number of 1–2, X and Y each represent an aryl group having a substituent at the ortho position, and the remainder position is occupied by a fluorine atom and an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted and the remainders of the V's each represent a fluorine atom is used as the material for the formation of a red colored layer.

17. A color filter according to claim 15, characterized in that a photosensitive resin coloring composition for use in a color filter containing a dye composed of an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted and the remainders of the V's each represent a fluorine atom and a phthalocyanine compound (C) described in Item (5) above is used as the material for the formation of a red colored layer.

18. A color filter according to claim 15, characterized in that a photosensitive resin coloring composition for use in a color filter containing a dye composed of a quinizarine compound (A) such that in the general formula (2) described in Item (2) above, at least one of the Z's is $NHX^2$ and X and $X^2$ each represent an aryl group having a substituent at the ortho position and an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted and the remainders of the V's each represent a fluorine atom is used as the material for the formation of a green colored layer.

19. A color filter according to claim 15, characterized in that a photosensitive resin coloring composition for use in a color filter containing a dye composed of an anthraquinone compound (B) such that in the general formula (3) described in Item (3) above, at least one of the NHT's occupies the 2 or 3 position of the anthraquinone skeleton, T represents an aryl group having a substituent at the ortho position, and V's at the remainders of positions each represent a fluorine atom and a phthalocyanine compound (C) such that in the general formula (1) described in Item (4) above, M represents a divalent metal, the number of phenoxy groups substituting in the benzene ring of the phthalocyanine skeleton is 3–5, and the remainders of the positions are occupied each by a fluorine atom is used as the material for the formation of a blue colored layer.

20. A color filter according to claim 15, characterized in that a photosensitive resin coloring composition for use in a color filter containing a dye composed of an anthraquinone compound (B) such that in the general formula (3) described in Item (3) above, two of the NHT's are substituents at the 1 and 4 positions of the anthraquinone skeleton, T represents an unsubstituted or substituted aryl group or cycloalkyl group, the remaining 2 and 3 positions are occupied each by V which is a fluorine atom and/or OU and a phthalocyanine compound (C) such that in the general formula (1) described in Item (4) above, M represents a divalent metal and the remainders of the positions are occupied each by a fluorine atom is used as the material for the formation of a blue colored layer.

21. A color filter according to claim 15, characterized in that a photosensitive resin coloring composition for use in a color filter containing a dye composed of a quinizarine compound (A) such that in the general formula (2) described in Item (2) above, at least one of the Z's is $NHX^2$ occupying the 6 or 7 position of the quinizarine skeleton and a phthalocyanine compound (C) such that in the general formula (1) described in Item (4) above, M is a divalent metal is used as the material for the formation of a blue colored layer.

22. A color filter, characterized in that a photosensitive resin coloring composition for use in a color filter set forth in any of claims 1 through 5 and 7 through 13 is used as the material for the formation of the colored layer.

23. A color filter according to claim 22, characterized in that a photosensitive resin coloring composition for use in a color filter containing a dye composed of a quinizarine compound (A) such that in the general formula (2) described in Item (2) above, p represents a numeral of 1–2, X and Y each represent an aryl group having a substituent at the ortho position, and the remainder position is occupied by a fluorine atom and an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted phenoxy group and the remainders of the V's each represent a fluorine atom is used as the material for the formation of a red colored layer.

24. A color filter according to claim 22, characterized in that a photosensitive resin coloring composition for use in a color filter containing a dye composed of an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted alkoxy group or an unsubstituted or substituted phenoxy group and the remainders of the V's each represent a fluorine atom and a phthalocyanine compound (C) described in Item (5) above is used as the material for the formation of a red colored layer.

25. A color filter according to claim 22, characterized in that a photosensitive resin coloring composition for use in a color filter containing a dye composed of a quinizarine compound (A) such that in the general formula (2) described in Item (2) above, at least one of the Z's is $NHX^2$ and X and $X^2$ each represent an aryl group having a substituent at the ortho position and an anthraquinone compound (B) such that in the general formula (3) described in Item (3) above, r is 1, NHT occupies the 2 or 3 position of the anthraquinone skeleton, T represents an aryl group having a substituent at the ortho position, and at least one of the V's represents an unsubstituted or substituted phenoxy group alkoxy group or an unsubstituted or substituted and the remainders of the V's each represent a fluorine atom is used as the material for the formation of a green colored layer.

26. A color filter according to claim 22, characterized in that a photosensitive resin coloring composition for use in a color filter containing a dye composed of an anthraquinone compound (B) such that in the general formula (3) described in Item (3) above, at least one of the NHT's occupies the 2 or 3 position of the anthraquinone skeleton, T represents an aryl group having a substituent at the ortho position, and V's at the remainders of positions each represent a fluorine atom and a phthalocyanine compound (C) such that in the general formula (1) described in Item (4) above, M represents a divalent metal, the number of phenoxy groups substituting in the benzene ring of the phthalocyanine skeleton is 3–5, and the remainders of the positions are occupied each by a fluorine atom is used as the material for the formation of a blue colored layer.

27. A color filter according to claim 22, characterized in that a photosensitive resin coloring composition for use in a color filter containing a dye composed of an anthraquinone compound (B) such that in the general formula (3) described in Item (3) above, two of the NHT's are substituents at the 1 and 4 positions of the anthraquinone skeleton, T represents an unsubstituted or substituted aryl group or cycloalkyl group, the remaining 2 and 3 positions are occupied each by V which is a fluorine atoms and/or OU and phthalocyanine compound (C) such that in the general formula (1) described in Item (4) above, M represents a divalent metal and the remainders of the positions are occupied each by a fluorine atom is used as the material for the formation of a blue colored layer.

28. A color filter according to claim 22, characterized in that a photosensitive resin coloring composition for use in a color filter containing a dye composed of a quinizarine compound (A) such that in the general formula (2) described in Item (2) above, at least one of the Z's is $NHX^2$ occupying the 6 or 7 position of the quinizarine skeleton and a phthalocyanine compound (C) such that in the general formula (1) described in Item (4) above, M is a divalent metal is used as the material for the formation of a blue colored layer.

29. A photosensitive resin coloring composition according to claim 1, wherein the amount of dye is in the range of 10–80% by weight based on the amount of the resin.

* * * * *